United States Patent
Jung et al.

(10) Patent No.: US 11,482,523 B2
(45) Date of Patent: Oct. 25, 2022

(54) SEMICONDUCTOR DEVICES WITH FIN-SHAPED ACTIVE REGIONS AND METHODS OF FABRICATING SAME

(71) Applicant: Samsung Electronics Co., Ltd., Suwon-si (KR)

(72) Inventors: Jong Ki Jung, Hwaseong-si (KR); Jae Hun Jeong, Hwaseong-si (KR); Chan Geun Ahn, Suwon-si (KR); Yoon Seok Lee, Seoul (KR); Soo Hun Hong, Gunpo-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/661,576

(22) Filed: Oct. 23, 2019

(65) Prior Publication Data

US 2020/0212035 A1    Jul. 2, 2020

(30) Foreign Application Priority Data

Dec. 28, 2018  (KR) .......................... 10-2018-0171528

(51) Int. Cl.
*H01L 29/08* (2006.01)
*H01L 27/088* (2006.01)
(Continued)

(52) U.S. Cl.
CPC .. *H01L 27/0886* (2013.01); *H01L 21/823418* (2013.01); *H01L 21/823431* (2013.01);
(Continued)

(58) Field of Classification Search
CPC ............. H01L 27/0886; H01L 29/0847; H01L 29/41791; H01L 21/823481;
(Continued)

(56) References Cited

U.S. PATENT DOCUMENTS 9,159,630 B1   10/2015  Wei et al.
9,583,398 B2   2/2017   Liaw
(Continued)

OTHER PUBLICATIONS

Yeh et al. "The impact of fin number on device's performance and reliability in tri-gate FinFETs" 2017 IEEE Electron Devices Technology and Manufacturing Conference (EDTM) (pp. 17-19) (Feb. 28-Mar. 2, 2017).

*Primary Examiner* — Shahed Ahmed
(74) *Attorney, Agent, or Firm* — Myers Bigel, P.A.

(57) ABSTRACT

A semiconductor device includes a first fin type pattern in a first region of a substrate. The first fin type pattern includes a plurality of spaced-apart fins having respective sidewalls defined by a first trench. A first gate structure is provided, which intersects the first fin type pattern. A second fin type pattern is provided in a second region of a substrate. The second fin type pattern includes a fin having a sidewall defined by a second trench. A second gate structure is provided, which intersects the second fin type pattern. A field insulating film fills at least a part of the first trench and at least a part of the second trench. The field insulating film has a first upper surface, which is in contact with at least one sidewall of the first fin type pattern and is spaced from a bottom of the first trench by a first height, and a second upper surface, which in contact with the sidewall of the second fin type pattern and is spaced from a bottom of the second trench by a second height different from the first height.

13 Claims, 43 Drawing Sheets

(51) Int. Cl.
*H01L 29/417* (2006.01)
*H01L 21/8234* (2006.01)
*H01L 29/66* (2006.01)

(52) U.S. Cl.
CPC .. *H01L 21/823481* (2013.01); *H01L 29/0847* (2013.01); *H01L 29/41791* (2013.01); *H01L 29/66545* (2013.01)

(58) Field of Classification Search
CPC ..... H01L 21/823418; H01L 21/823431; H01L 29/66545; H01L 21/823412; H01L 29/7848; H01L 29/66818; H01L 29/7854; H01L 27/0924; H01L 21/823821; H01L 29/66795–66818; H01L 29/785–7856; H01L 2029/7857–7858; H01L 29/04–045; H01L 29/16–1608
See application file for complete search history.

(56) References Cited

U.S. PATENT DOCUMENTS

| | | |
|---|---|---|
| 9,793,404 B2 | 10/2017 | Sung et al. |
| 9,831,345 B2 | 11/2017 | Yu et al. |
| 9,875,938 B2 | 1/2018 | Jeong et al. |
| 9,887,094 B1 | 2/2018 | Qi et al. |
| 2017/0194149 A1* | 7/2017 | Chang ................. H01L 27/1211 |
| 2017/0200726 A1* | 7/2017 | Tsuda ................. H01L 29/7851 |
| 2017/0221907 A1* | 8/2017 | Hsieh ................. H01L 29/0649 |
| 2018/0158729 A1 | 6/2018 | Hsieh et al. |
| 2018/0182756 A1* | 6/2018 | Lee ..................... H01L 27/1104 |
| 2019/0157155 A1* | 5/2019 | Keng ............. H01L 21/823431 |
| 2019/0371674 A1* | 12/2019 | Wu ............... H01L 21/823468 |
| 2020/0105620 A1* | 4/2020 | Tan ................. H01L 21/02532 |
| 2020/0135579 A1* | 4/2020 | Wu ................ H01L 21/823437 |
| 2020/0168606 A1* | 5/2020 | Chan ................ H01L 29/66545 |

* cited by examiner

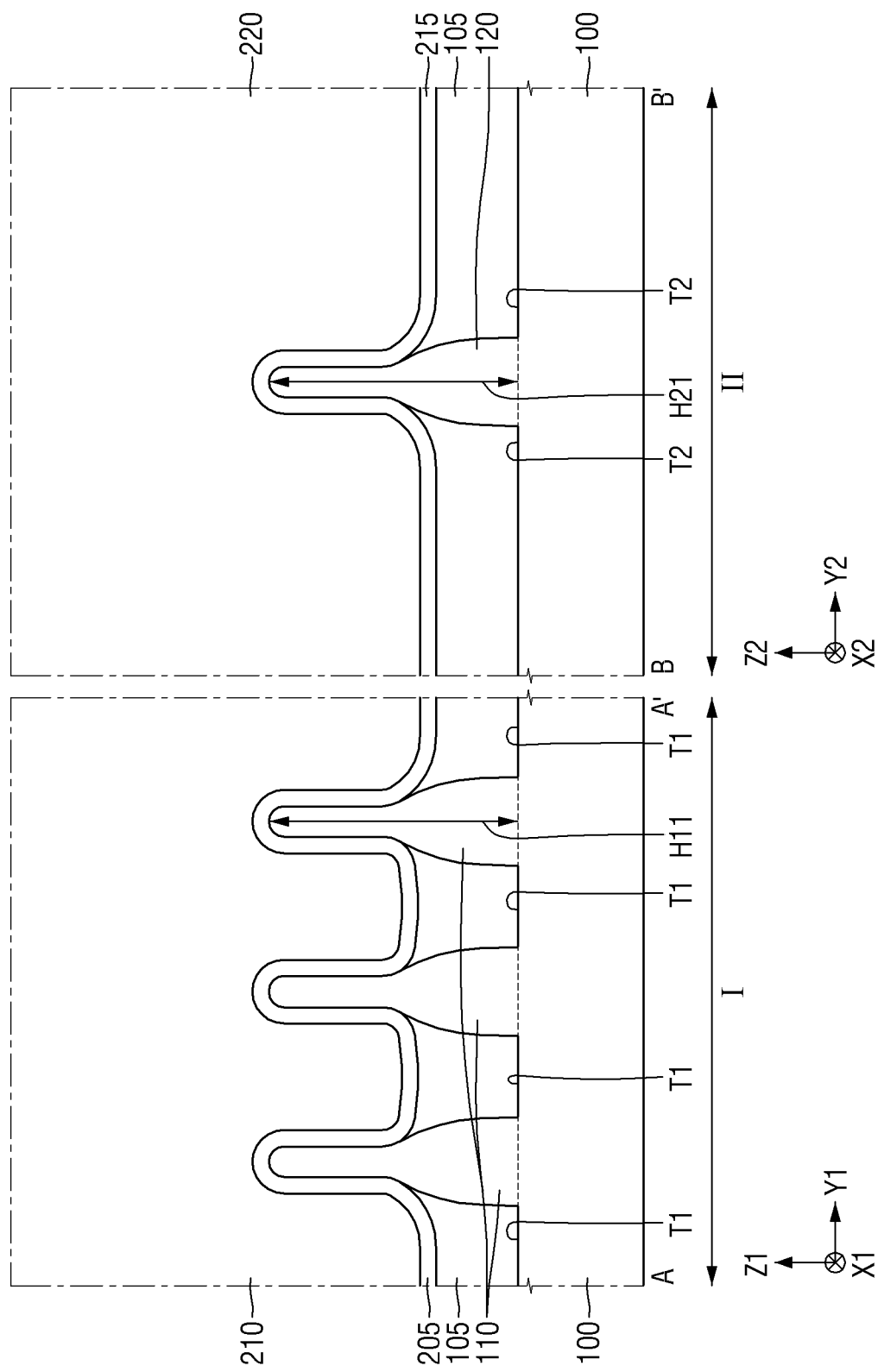

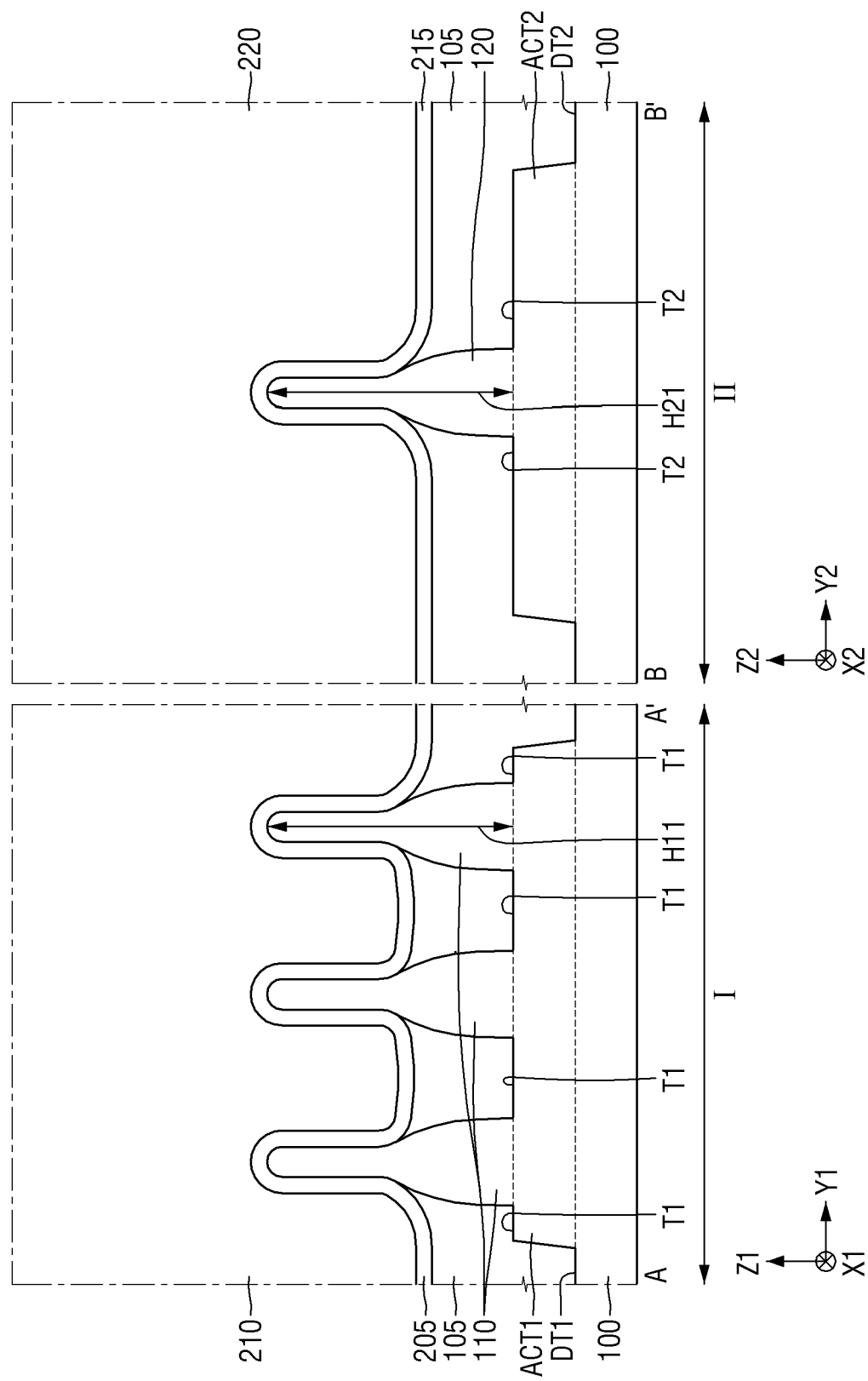

FIG. 41
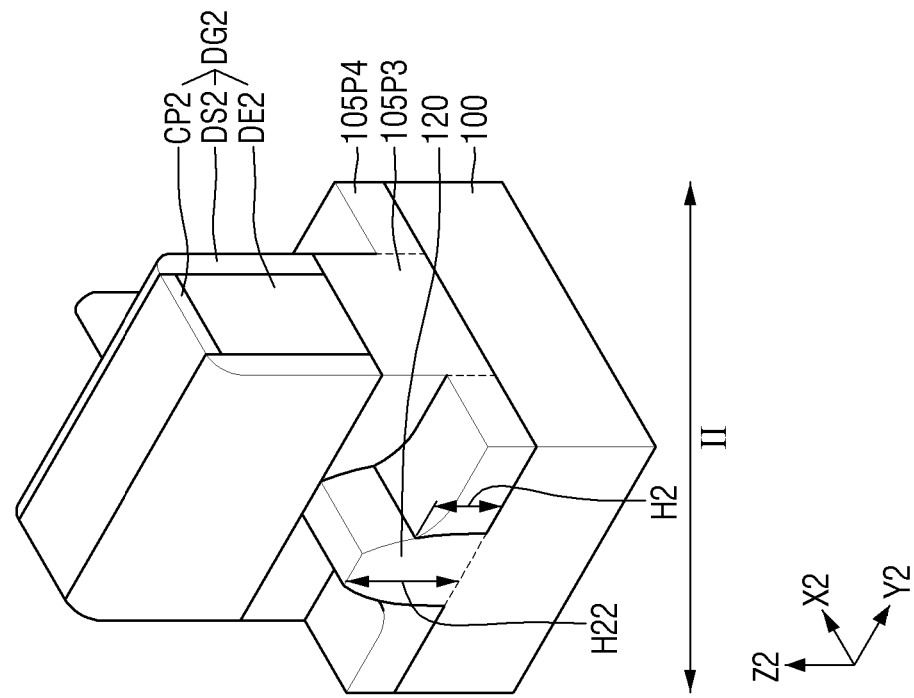
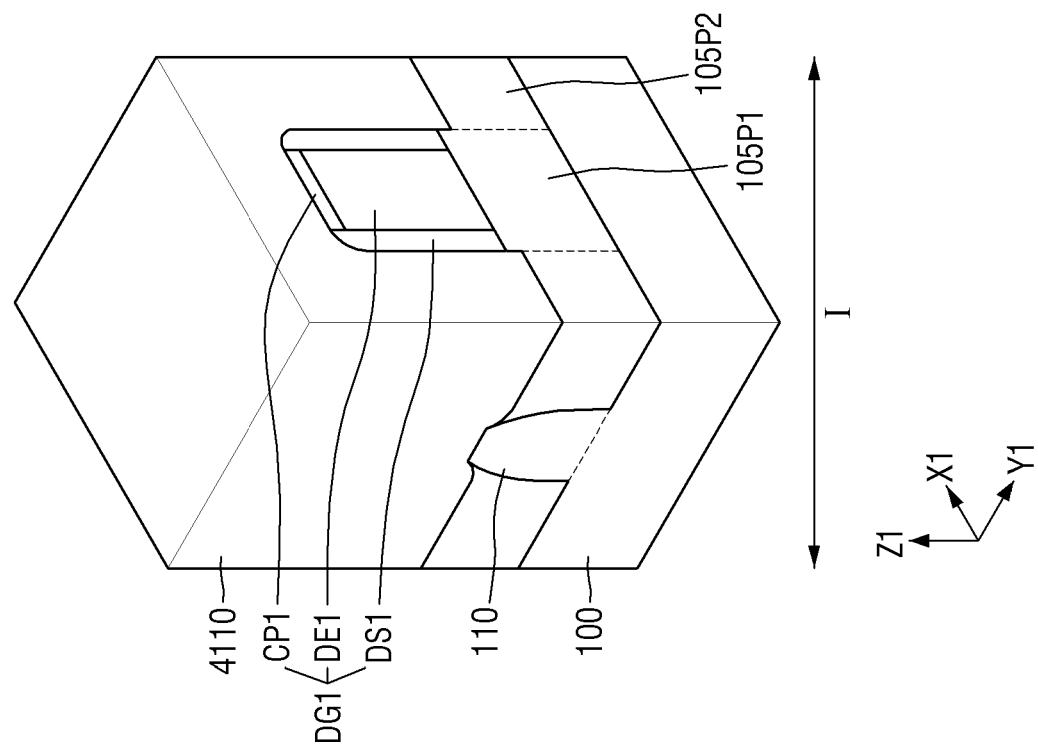

SEMICONDUCTOR DEVICES WITH FIN-SHAPED ACTIVE REGIONS AND METHODS OF FABRICATING SAME

REFERENCE TO PRIORITY APPLICATION

This application claims priority to Korean Patent Application No. 10-2018-0171528, filed Dec. 28, 2018, the disclosure of which is hereby incorporated herein by reference.

BACKGROUND

1. Field of the Invention

The present invention relates to semiconductor devices and methods of forming same.

2. Description of the Related Art

As one of a plurality of scaling techniques for increasing the density of semiconductor devices, a multi-gate transistor has been proposed, which may be implemented using a fin-shaped silicon body, and an insulated-gate, which is formed on a surface of the fin-shaped silicon body and may be controlled to thereby modulate a conductivity of a semiconductor active/channel region within the fin-shaped silicon body. Because a multi-gate transistor may utilize three-dimensional channels, scaling is relatively easily performed. In addition, even if a gate length of the multi-gate transistor is not increased, the current control capability may be improved. Finally, it may be possible to effectively suppress SCE (short channel effects) in which the potential of the channel region is negatively influenced by an applied drain voltage.

SUMMARY

Aspects of the present inventive concepts provide a semiconductor device in which a contact resistance of a contact is reduced, and a method for fabricating the same.

Aspects of the present inventive concepts also provide a semiconductor device with improved channel mobility and a method for fabricating the same.

According to some aspects of the present inventive concepts, a semiconductor device includes a first fin type pattern including a plurality of fins each extending in a first direction and having a sidewall defined by a first trench, in a first region of a substrate. A first gate structure is provided, which intersects the first fin type pattern and extends in a second direction. A second fin type pattern is provided, which includes a single fin extending in a third direction and having a sidewall defined by a second trench, in a second region of the substrate. A second gate structure is provided, which intersects the second fin type pattern and extends in a fourth direction. A field insulating film is provided, which fills at least a part of the first trench and at least a part of the second trench, on the substrate. The field insulating film includes a first upper surface being in contact with the sidewall of the first fin type pattern, and a second upper surface being in contact with the sidewall of the second fin type pattern. A first height from a bottom of the first trench to the first upper surface of the field insulating film may be different from a second height from a bottom of the second trench to the second upper surface of the field insulating film.

According to some aspects of the present inventive concepts, a semiconductor device includes: a first fin type pattern extending in a first direction in a first region of a substrate, a second fin type pattern extending in a third direction in a second region of the substrate, a field insulating film surrounding at least a part of the first and second fin type patterns, a first gate structure intersecting the first fin type pattern and extending in a second direction, on the field insulating film, and a second gate structure intersecting the second fin type pattern and extending in a fourth direction, on the field insulating film. First epitaxial patterns are also provided, which are spaced apart in the first direction on the first fin type pattern. Second epitaxial patterns are provided, which are spaced apart in the third direction on the second fin type pattern. The field insulating film includes a first portion below the first gate structure, a second portion disposed on at least one side of the first portion, a third portion below the second gate structure, and a fourth portion disposed on at least one side of the third portion. The first portion has a first thickness from an upper surface of the substrate to a bottom of the first gate structure. The second portion has a second thickness from the upper surface of the substrate to an upper surface of the field insulating film. The third portion has a third thickness from the upper surface of the substrate to a bottom of the second gate structure. The fourth portion has a fourth thickness from the upper surface of the substrate to the upper surface of the field insulating film. A difference between the first thickness and the second thickness may be smaller than a difference between the third thickness and the fourth thickness. A first volume of the first epitaxial patterns may be smaller than a second volume of the second epitaxial patterns.

According to some aspects of the present inventive concepts, a semiconductor device is provided, which includes a first fin type pattern extending in a first direction, a second fin type pattern extending in a third direction, a first gate structure intersecting the first fin type pattern and extending in a second direction, a second gate structure intersecting the second fin type pattern and extending in a fourth direction, a field insulating film surrounding at least a part of the first and second fin type patterns, a first epitaxial pattern on the first fin type pattern, and a second epitaxial pattern on the second fin type pattern. A first width of a lower surface of the first fin type pattern in the second direction may be smaller than a second width of a lower surface of the second fin type pattern in the fourth direction, and a first volume of the first epitaxial pattern may be smaller than a second volume of the second epitaxial pattern.

According to some additional aspects of the present inventive concepts, a method for fabricating a semiconductor device is provided, which includes: forming a first fin type pattern extending in a first direction, in a first region of a substrate, forming a second fin type pattern extending in a third direction, in a second region of the substrate, forming a field insulating film surrounding at least a part of the first and second fin type patterns, forming a first dummy gate intersecting the first fin type pattern and extending in a second direction, forming a second dummy gate intersecting the second fin type pattern and extending in a fourth direction, forming a first epitaxial region spaced apart in the first direction on the first fin type pattern, using the first dummy gate, forming a second epitaxial region spaced apart in the third direction on the second fin type pattern, using the second dummy gate, forming a hard mask which covers the field insulating film of the first region, the first fin type pattern, and the first epitaxial region, and etching the second region to recess the field insulating film of the second region.

According to some additional aspects of the present inventive concepts, a method for fabricating a semiconductor device includes: forming a plurality of first semiconductor patterns extending in a first direction, in a first region of a substrate, forming a plurality of second semiconductor patterns extending in a third direction, in a second region of the substrate, forming a plurality of first mask patterns spaced apart in a second direction on sidewalls of the plurality of first semiconductor patterns, in the first region, forming a plurality of second mask patterns spaced apart in a fourth direction on sidewalls of the plurality of second semiconductor patterns, in the second region, forming a first fin type pattern extending in the first direction in the first region, using the plurality of first mask patterns, forming a second fin type pattern extending in the third direction in the second region, using the plurality of second mask patterns, etching at least a part of the first fin type pattern to form a first epitaxial region on the first fin type pattern, etching at least a part of the second fin type pattern to form a second epitaxial region on the second fin type pattern, and filling the first and second epitaxial regions to form first and second epitaxial patterns. A first width of the plurality of first mask patterns in the second direction may be different from a second width of the plurality of second mask patterns in the fourth direction. The volumes of the first and second epitaxial patterns may also be different from each other.

However, aspects of the present inventive concepts are not restricted to the ones set forth herein. The above and other aspects of the present inventive concepts will become more apparent to one of ordinary skill in the art to which the present inventive concepts pertain by referencing the detailed description of the present inventive concepts given below.

BRIEF DESCRIPTION OF THE DRAWINGS

The above and other aspects and features of the inventive concept will become more apparent by describing in detail exemplary embodiments thereof with reference to the attached drawings.

FIGS. 2a and 2b are cross-sectional views taken along lines A-A' and B-B' of FIG. 1.

FIGS. 38 to 42 are exemplary diagrams for explaining a method for fabricating the semiconductor device according to some embodiments.

DETAILED DESCRIPTION OF THE EMBODIMENTS

Figure 1:
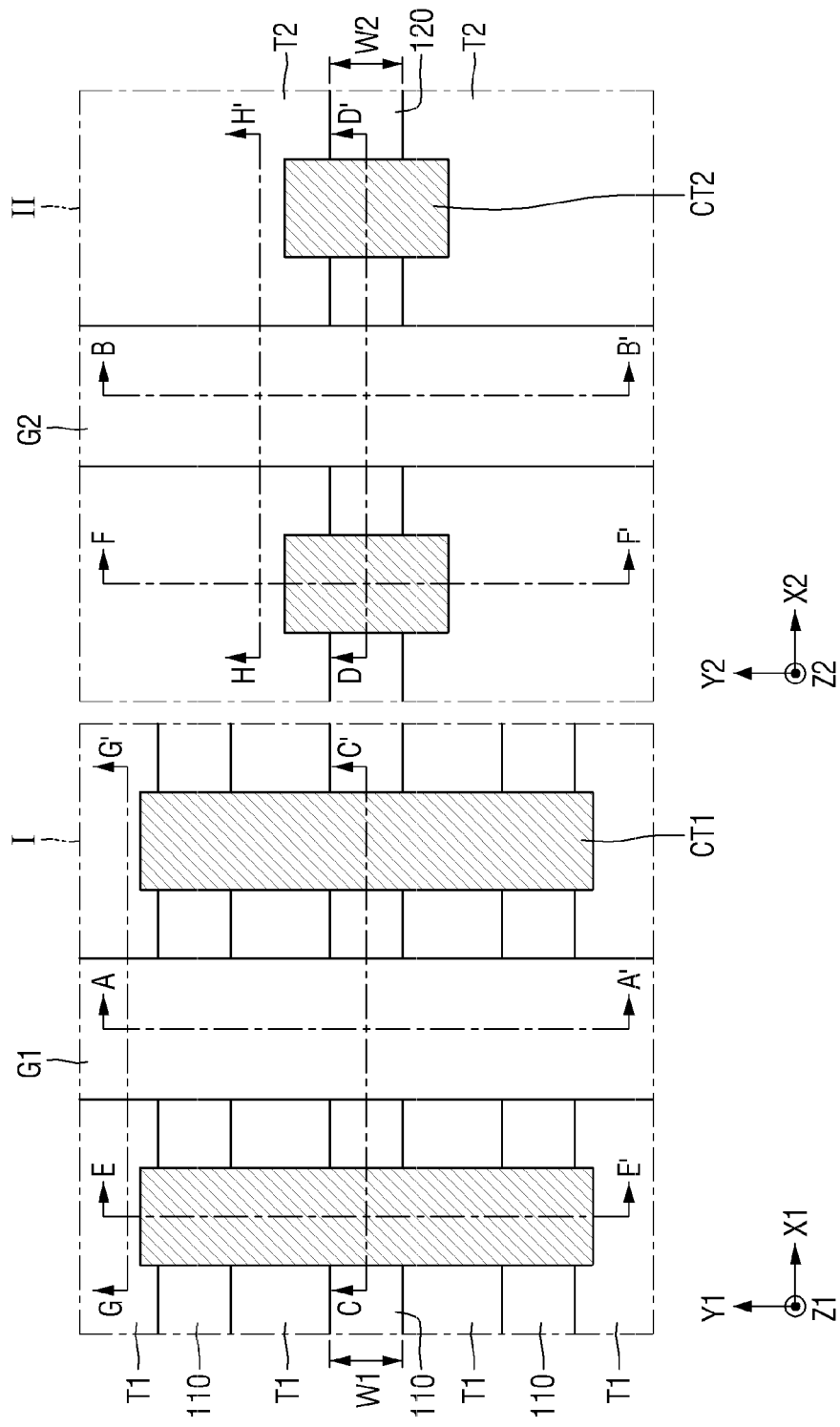
FIG. 1 is an exemplary layout for explaining a semiconductor device according to some embodiments.
Figure 3:
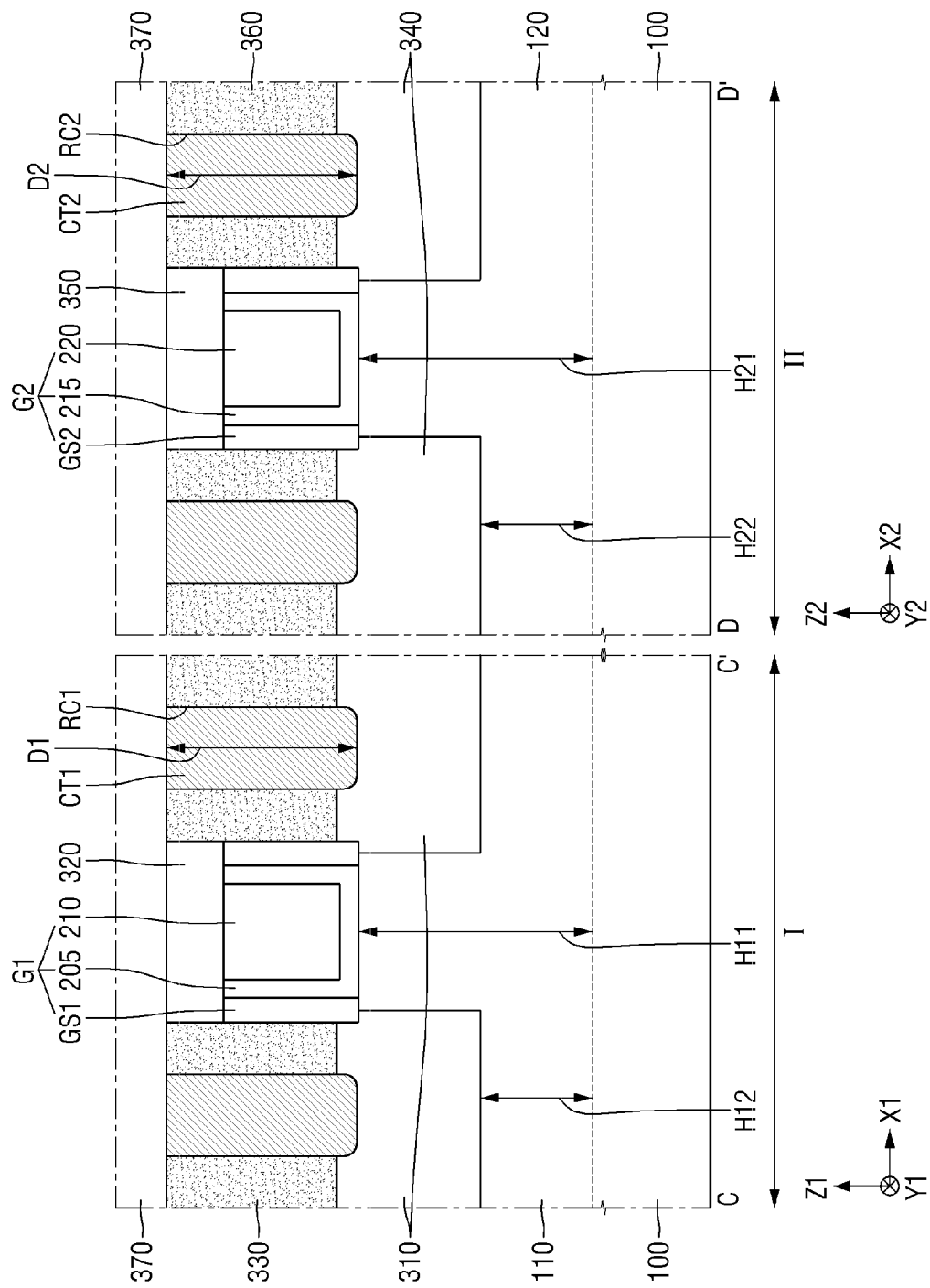
FIG. 3 is a cross-sectional view taken along lines C-C' and D-D' of FIG. 1.
Figure 4:
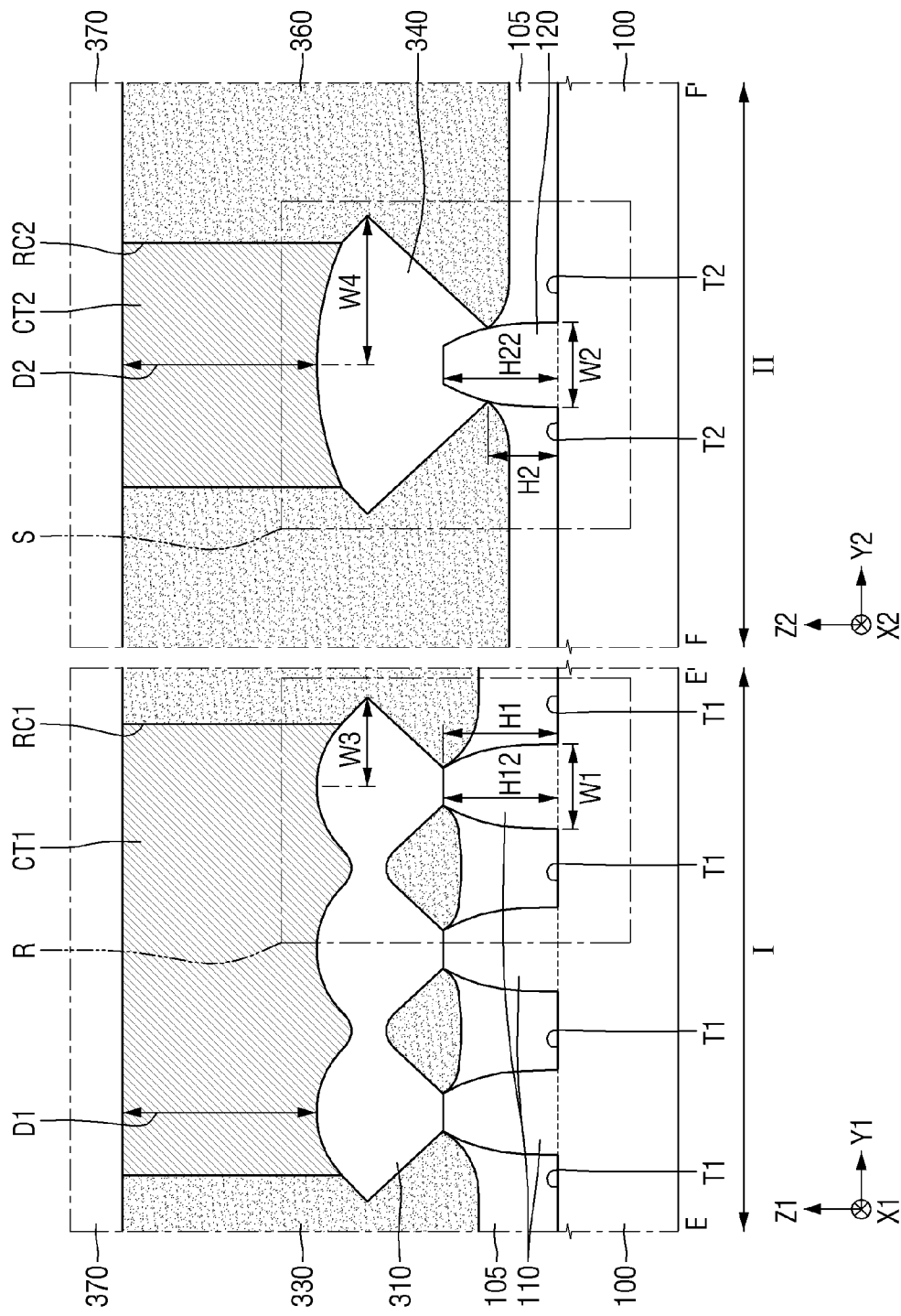
FIG. 4 is a cross-sectional view taken along lines E-E' and F-F' of FIG. 1.
Figure 5:
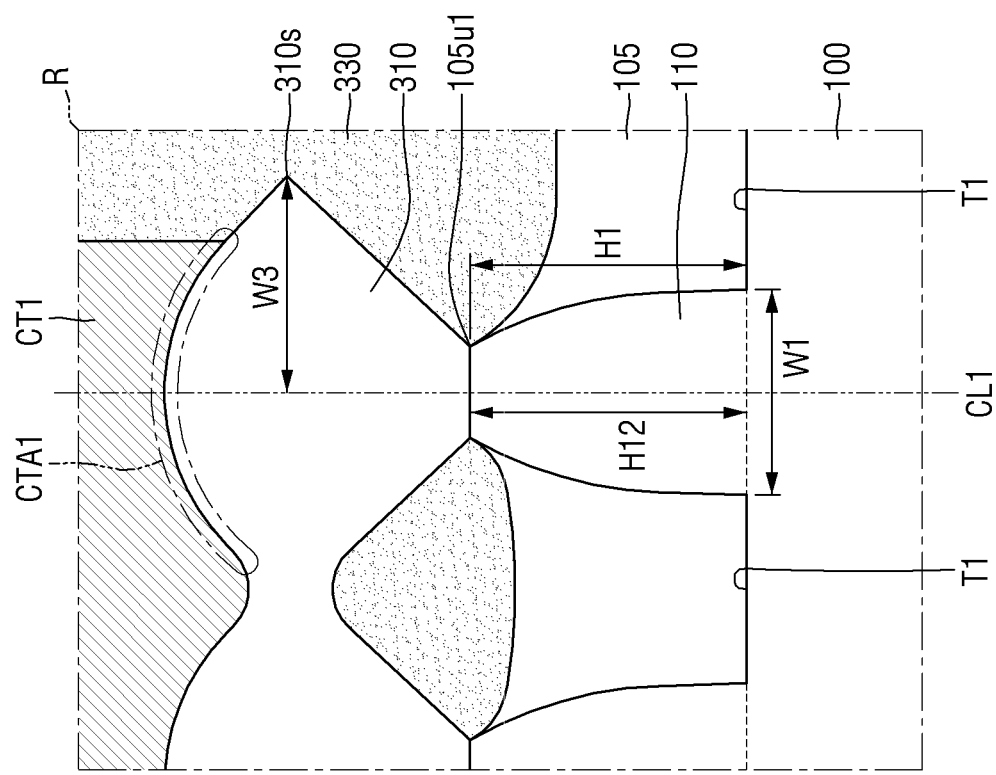
FIG. 5 is an enlarged view of a region R of FIG. 4.
Figure 6:
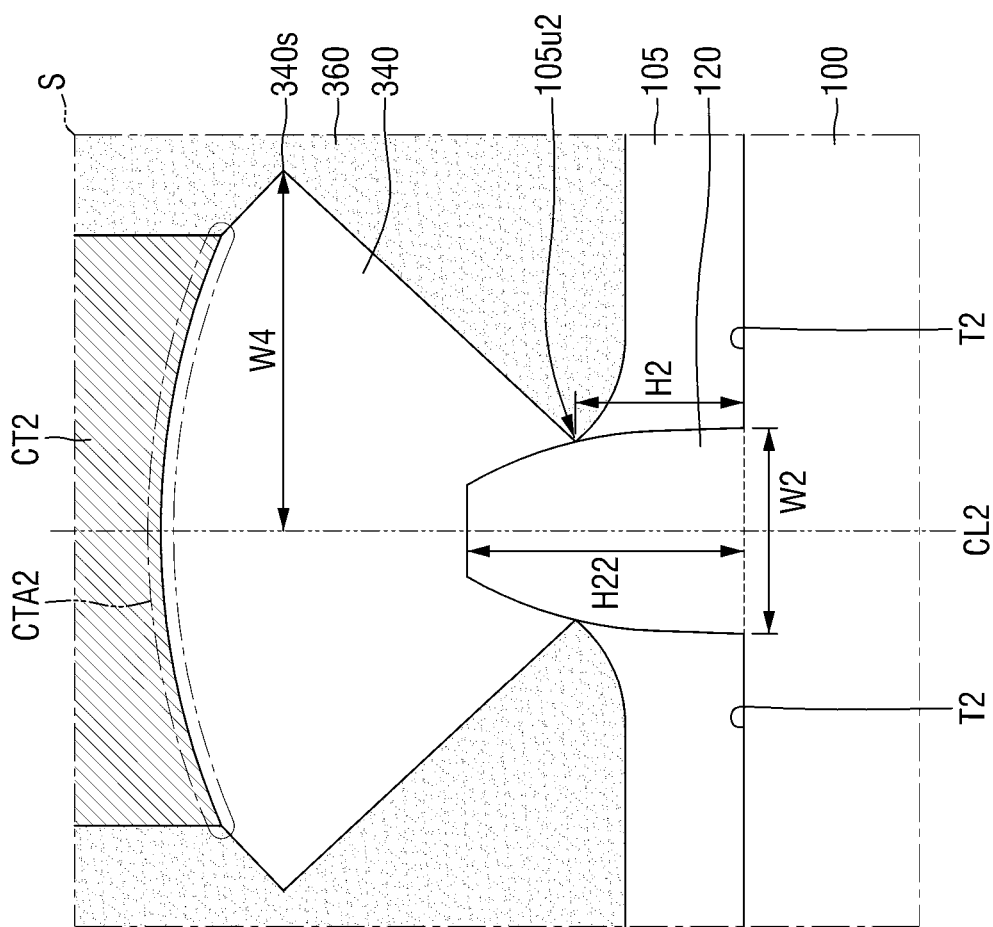
FIG. 6 is an enlarged view of a region S of FIG. 4.
Figure 7:
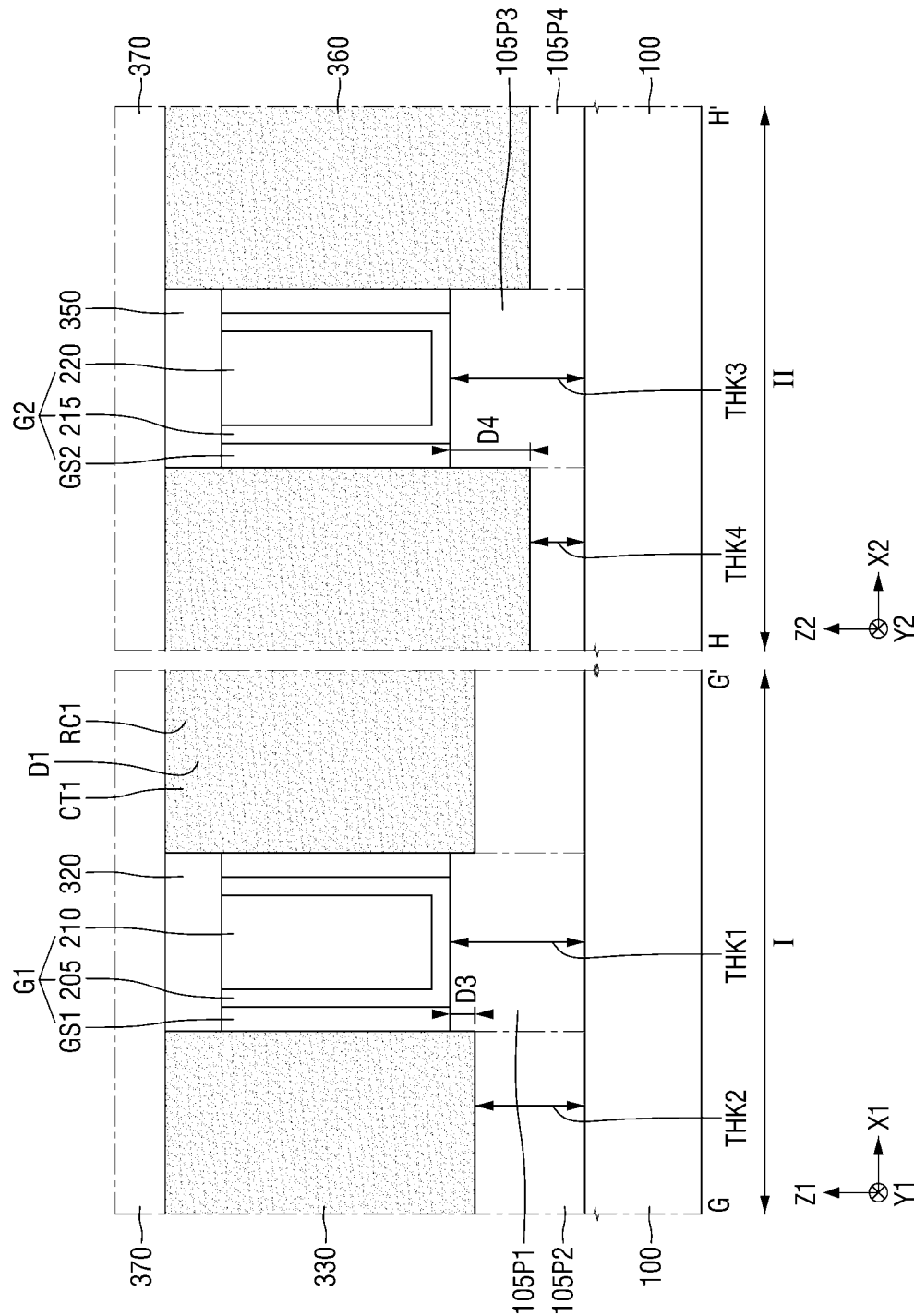
FIG. 7 is a cross-sectional view taken along lines G-G' and H-H' of FIG. 1.

FIG. 1 is an exemplary layout for explaining a semiconductor device according to some embodiments. FIGS. 2a and 2b are cross-sectional views taken along lines A-A' and B-B' of FIG. 1. FIG. 3 is a cross-sectional view taken along lines C-C' and D-D' of FIG. 1. FIG. 4 is a cross-sectional view taken along lines E-E' and F-F' of FIG. 1. FIG. 5 is an enlarged view of a region R of FIG. 4. FIG. 6 is an enlarged view of a region S of FIG. 4. FIG. 7 is a cross-sectional view taken along lines G-G' and H-H' of FIG. 1. For convenience of explanation, some constituent elements such as first to third interlayer insulating films are omitted in FIG. 1. The semiconductor device according to some embodiments will be described with reference to FIGS. 1 to 7.

The semiconductor device according to some embodiments may include a substrate 100, a field insulating film 105, a first fin type pattern 110, a second fin type pattern 120, a first gate structure G1, a second gate structure G2, a first epitaxial pattern 310, a second epitaxial pattern 340, a first contact CT1, a second contact CT2, a first gate protection layer 320 and a second gate protection layer 350, a first interlayer insulating film 330, a second interlayer insulating film 360, and a third interlayer insulating film 370.

The substrate 100 may be bulk silicon or silicon-on-insulator (SOI). Alternatively, the substrate 100 may be a silicon substrate or may include other materials such as silicon germanium, silicon germanium on insulator (SGOI), indium antimonide, lead tellurium compound, indium arsenide, indium phosphide, gallium arsenide or gallium antimonide. Or, the substrate 100 may have an epitaxial layer formed on a base substrate.

The field insulating film 105 may include, for example, at least one of an oxide film, a nitride film, an oxynitride film, and any combination thereof.

The first gate structure G1 may include a first gate insulating film 205, a first gate electrode 210, and a first gate spacer GS1. The second gate structure G2 may include a second gate insulating film 215, a second gate electrode 220, and a second gate spacer GS2.

Each of the first gate insulating film 205 and the second gate insulating film 215 may include at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate, but the embodiments are not limited thereto.

Each of the first gate electrode 210 and the second gate electrode 220 may include a conductive material. The first gate electrode 210 and the second gate electrode 220 may include the same material or may include different materials. In some of the drawings, although the first gate electrode 210 and the second gate electrode 220 are illustrated as being a single film, this is only for convenience of explanation, and the embodiments are not limited thereto. For example, the first gate electrode 210 and the second gate electrode 220 may be multi-component and/or multi-layer films. For example, the first gate electrode 210 and the second gate electrode 220 may include a work function conductive film for adjusting a work function, and a filling conductive film for filling a space formed by the work function conductive film. The first gate electrode 210 and the second gate electrode 220 may include, for example, at least one of TiN, WN, TaN, Ru, TiC, TaC, Ti, Ag, Al, TiAl, TiAlN, TiAlC, TaCN, TaSiN, Mn, Zr, W, Al, and combinations thereof. Alternatively, the first gate electrode 210 and the second gate electrode 220 may include silicon (Si), silicon germanium (SiGe), or the like other than metal. The first gate electrode 210 and the second gate electrode 220 may be formed, for example, through a replacement process (or a gate last process), but the embodiments are not limited thereto.

The first gate spacer GS1 and the second gate spacer GS2 may include, for example, at least one of silicon nitride (SiN), silicon oxynitride (SiON), silicon oxide ($SiO_2$), silicon oxycarbonitride (SiOCN), silicon carbonitride (SiCN) or a combination thereof, but the embodiments are not limited thereto. In some of the drawings, the first gate spacer GS1 and the second gate spacer GS2 are illustrated as being a single film structure, but the embodiments are not limited thereto, and the first gate spacer GS1 and the second gate spacer GS2 may have a multi-film structure.

For example, when the substrate 100 is a PMOS region, the first epitaxial pattern 310 and/or the second epitaxial pattern 340 may include p-type impurities or impurities for preventing diffusion of the p-type impurities. For example, the first epitaxial pattern 310 and/or the second epitaxial pattern 340 may include at least one of boron (B), carbon (C), indium (In), gallium (Ga), aluminum (Al), and a combination thereof. In addition, when the substrate 100 is a PMOS region, the first epitaxial pattern 310 and/or the second epitaxial pattern 340 may include a compressive stress material. For example, the first epitaxial pattern 310 and/or the second epitaxial pattern 340 may include silicon germanium (SiGe), which provides compressive stresses therein.

In contrast, when the substrate 100 is an NMOS region, the first source/drain region 130 may include n-type impurities or impurities for preventing diffusion of the n-type impurities. For example, the first epitaxial pattern 310 and/or the second epitaxial pattern 340 may include at least one of phosphorus (P), antimony (Sb), arsenic (As), and combinations thereof. In addition, when the substrate 100 is an NMOS region, the first epitaxial pattern 310 and/or the second epitaxial pattern 340 may include a tensile stress material. For example, the first epitaxial pattern 310 and/or the second epitaxial pattern 340 may include, for example, silicon carbide (SiC). The first epitaxial pattern 310 and the second epitaxial pattern 340 may be formed, using a SEG (Selective Epitaxial Growth) process, but the embodiments are not limited thereto.

The first contact CT1 and the second contact CT2 may be connected to the first epitaxial pattern 310 and the second epitaxial pattern 340, respectively. The first contact CT1 and the second contact CT2 may include a metal material. Although not illustrated, the first contact CT1 and the second contact CT2 may include a metal barrier and silicide. The silicide may be formed in a portion in which the first contact CT1 and the second contact CT2 are connected to the first epitaxial pattern 310 and the second epitaxial pattern 340, respectively.

The first gate protection layer 320 and the second gate protection layer 350 may prevent the first gate structure G1 and the second gate structure G2 from coming into contact with other structures, respectively. According to some embodiments, the first gate protection layer 320 and the second gate protection layer 350 may not include oxides, but the embodiments are not limited thereto.

The first interlayer insulating film 330 to the third interlayer insulating film 370 may include, for example, at least one of silicon oxide, silicon nitride, silicon oxynitride and a low dielectric constant material. The low dielectric constant material may include, but is not limited to, for example, FOX, TOSZ, USG, BSG, PSG, BPSG, PETEOS, FSG, CDO, Xerogel, Aerogel, Amorphous Fluorinated Carbon, OSG, Parylene, BCB, SiLK, polyimide, porous polymeric material, and combinations thereof.

Referring to FIG. 1, the substrate 100 may include a first region I and a second region II. According to some embodiments, semiconductor structures of the same conductivity type may be arranged or semiconductor structures of conductivity types different from each other may be arranged in the first region I and the second region II. For example, both the first region I and the second region II may be the PMOS region or the NMOS region. In another example, if the first region I is a PMOS region, the second region II may be an NMOS region. Alternatively, when the first region I is an NMOS region, the second region II may be a PMOS region.

According to some embodiments, the first region I and the second region II may be regions in which the semiconductor structures for performing different functions are arranged. For example, the first region I may be an SRAM region and the second region II may be a less dense logic region. However, the embodiments are not limited thereto, and those having ordinary knowledge in the technical field of the present inventive concepts may distinguish the first region I and the second region II in an appropriate manner as needed.

In the first region I, the first fin type pattern 110 may extend along the first direction X1. The first fin type pattern 110 may include a plurality of fins. For example, a plurality of fins included in the first fin type pattern 110 may be spaced apart from each other along a second direction Y1 and may extend along the first direction X1. A lower surface of the first fin type pattern 110 may have a first width W1 in the second direction Y1. In the first region I, first trenches T1 may be spaced apart from each other along the second direction Y1 and may extend along the first direction X1. The first trenches T1 may define the respective sidewalls of the first fin type pattern 110.

In the second region II, the second fin type pattern 120 may extend along a third direction X2. The second fin type pattern 120 may include one fin. The lower surface of the second fin type pattern 120 may have a second width W2 in a fourth direction Y2. For example, the first width W1 of the lower surface of the first fin type pattern 110, and the second width W2 of the lower surface of the second fin type pattern 120 may be the same. Hereinafter, the expression that the heights, widths, and/or depths are "the same" means including a minute difference due to a processing error and a measurement error. In the second region II, the second trench T2 may extend along the third direction X2. The second trench T2 may define the sidewalls of the second fin type pattern 120. The first direction X1 and the third direction X2 may be the same direction or different directions. In addition, the second direction Y1 and the fourth direction Y2 may be the same direction or different directions.

According to some embodiments, the first fin type pattern 110 and the second fin type pattern 120 may be formed by etching the substrate 100, but the embodiments are not limited thereto. For example, the first fin type pattern 110 and the second fin type pattern 120 may be formed by growing an epitaxial material on the substrate 100. Also, according to some embodiments, the plurality of fins included in the first fin type pattern 110 and the fins included in the second fin type pattern 120 may be formed through the same process. For example, a plurality of fins may be formed in the first region I and the second region II of the substrate 100, and some of the plurality of fins formed in the second region II may be removed to form the second fin type pattern 120.

The first gate structure G1 may intersect the first fin type pattern 110. For example, the first gate structure G1 extends in the second direction Y1 in the first region I and may intersect the first fin type pattern 110. The second gate structure G2 may intersect the second fin type pattern 120. For example, the second gate structure G2 may extend in the fourth direction Y2 in the second region II and may intersect the second fin type pattern 120.

A first contact CT1 may intersect the first fin type pattern 110. For example, the first contact CT1 may extend in the second direction Y1 in the first region I and may intersect the first fin type pattern 110. The second contact CT2 may intersect the second fin type pattern 120. For example, the second contact CT2 may extend in the fourth direction Y2 in the second region II and may intersect the second fin type pattern 120.

Referring to FIGS. 1 and 2a, in the first region I, the first fin type pattern 110 may protrude from the substrate 100 in a fifth direction Z1. The sidewall of the first fin type pattern 110 may be defined by the first trench T1. Under the first gate structure G1, a height of the first fin type pattern 110 is defined as a first height H11. In the second region II, the second fin type pattern 120 may protrude from the substrate 100 in a sixth direction Z2. The sidewalls of the second fin type pattern 120 may be defined by a second trench T2. Under the second gate structure G2, a height of the second fin type pattern 120 is defined as a second height H21. The fifth direction Z1 and the sixth direction Z2 may be the same direction. According to some embodiments, the first height H11 and the second height H21 may be identical to each other.

A field insulating film 105 may surround at least a part of the first fin type pattern 110 and the second fin type pattern 120. In other words, the field insulating film 105 may fill at least a part of the first trench T1 and at least a part of the second trench T2.

In the first region I, the first gate insulating film 205 may extend in the second direction Y1. The first gate insulating film 205 may be formed on the first fin type pattern 110 and the field insulating film 105. For example, the first gate insulating film 205 may be formed along the profiles of the field insulating film 105 and a part of the sidewalls of the first fin type pattern 110. In the second region II, the second gate insulating film 215 may extend in the fourth direction Y2. The second gate insulating film 215 may be formed on the second fin type pattern 120 and the field insulating film 105. For example, the second gate insulating film 215 may be formed along the profile of the field insulating film 105 and a part of the sidewalls of the second fin type pattern 120.

In the first region I, the first gate electrode 210 may extend in the second direction Y1. The first gate electrode 210 may be formed on the first gate insulating film 205. In the second region II, the second gate electrode 220 may extend in the fourth direction Y2. The second gate electrode 220 may be formed on the second gate insulating film 215.

Referring to FIG. 2b, a first active region ACT1 may be defined in the first region I. For example, the first active region ACT1 may be defined by a first deep trench DT1. A second active region ACT2 may be defined in the second region II. For example, the second active region ACT2 may be defined by a second deep trench DT2. Hereinafter, for convenience of explanation, the active region is not separately illustrated, but those having ordinary skill in the technical field of the present inventive concepts may appropriately form a deep trench to define the active region.

Referring to FIG. 3, in the first region I, the first gate spacer GS1 may be spaced apart in the first direction X1. For example, the first gate spacer GS1 may be formed on the first gate electrode 210 to be spaced apart in the first direction X1. The first gate insulating film 205 may extend along at least the one sidewall of the first gate spacer GS1. In the second region II, the second gate spacer GS2 may be spaced apart in the third direction X2. For example, the second gate spacer GS2 may be formed on the second gate electrode 220 to be spaced apart in the third direction X2. The second gate insulating film 215 may extend along at least one sidewall of the second gate spacer GS2.

In the first region I, the first epitaxial pattern 310 may be formed on the first fin type pattern 110. The first epitaxial pattern 310 may be spaced apart in the first direction X1. Under the first epitaxial pattern 310, the height of the first fin type pattern 110 is defined as a third height H12. In the second region II, the second epitaxial pattern 340 may be formed on the second fin type pattern 120. The second epitaxial pattern 340 may be spaced apart in the third direction X2. Under the second epitaxial pattern 340, the height of the second fin type pattern 120 is defined as a fourth height H22. According to some embodiments, the third height H12 and the fourth height H22 may be equivalent. The first epitaxial pattern 310 and the second epitaxial pattern 340 may be elevated source and drain regions protruding upward from the bottom surfaces of the first gate structure G1 and the second gate structure G2, but the embodiments are not limited thereto.

In the first region I, the first contact CT1 may be formed on the first epitaxial pattern 310. The first contact CT1 may be formed by filling a first recess RC1 formed in at least a part of the first epitaxial pattern 310. The depth of the first recess RC1 is defined as a first depth D1. The first depth D1 may be a depth from the bottom surface of the third interlayer insulating film 370 to the lower surface of the first recess RC1.

In the second region II, the second contact CT2 may be formed on the second epitaxial pattern 340. The second contact CT2 may be formed by filling a second recess RC2 formed in at least a part of the second epitaxial pattern 340. The depth of the second recess RC2 is defined as a second depth D2. The second depth D2 may be a depth from the bottom surface of the third interlayer insulating film 370 to the lower surface of the second recess RC2. According to some embodiments, the first depth D1 and the second depth D2 may be the same.

The first interlayer insulating film 330 may be formed on the first epitaxial pattern 310 and the first contact CT1. For example, the first interlayer insulating film 330 may be formed between the first contact CT1 and the first gate structure G1. However, the embodiments are not limited thereto, and unlike the illustrated example, the first interlayer insulating film 330 may not be formed between the first contact CT1 and the first gate structure G1. The second interlayer insulating film 360 may be formed on the second epitaxial pattern 340 and the second contact CT2. For example, the second interlayer insulating film 360 may be formed between the second contact CT2 and the second gate structure G2. Likewise, unlike the illustrated example, the second interlayer insulating film 360 may not be formed between the second contact CT2 and the second gate structure G2.

A first gate protection layer 320 may be formed on the first gate structure G1. A second gate protection layer 350 may be formed on the second gate structure G2. A third interlayer insulating film 370 may be formed on the first contact CT1, the first interlayer insulating film 330, the first gate protection layer 320, the second contact CT2, the second interlayer insulating film 360, and the second gate protection layer 350.

Description will be provided with reference to FIGS. 4 to 7. For convenience of explanation, some terms are defined. A portion in which the field insulating film 105 and the sidewalls of the first fin type pattern 110 are in contact with each other is defined as a first upper surface 105u1 of the field insulating film. A portion in which the field insulating film 105 and the sidewalls of the second fin type pattern 120 are in contact with each other is defined as a second upper surface 105u2 of the field insulating film. In a case where the first epitaxial pattern 310 has a shape in which a plurality of epitaxial patterns is merged, a first volume of the first epitaxial pattern 310 is defined by dividing the total volume of the first epitaxial pattern 310 by the number of merged epitaxial patterns. For example, in the case of FIG. 4, the first volume of the first epitaxial pattern 310 means a volume in which the total volume of the first epitaxial pattern 310 is divided by 3. On the other hand, when the first epitaxial pattern 310 includes only one epitaxial pattern, the first volume of the first epitaxial pattern 310 means the total volume of the first epitaxial pattern 310. Similarly, if the second epitaxial pattern 340 includes only one epitaxial pattern, the second volume of the second epitaxial pattern 340 means the total volume of the second epitaxial pattern 340. In the case where the first epitaxial pattern 310 has a shape in which a plurality of epitaxial patterns is merged, a third width W3 of the first epitaxial pattern 310 means a width to a side surface 310s adjacent to a first center line CL1, on the basis of the first center line CL1 of the epitaxial pattern arranged at the outermost side among the plurality of merged epitaxial patterns. When the first epitaxial pattern 310 includes only one epitaxial pattern, the third width W3 of the first epitaxial pattern 310 means a width to the side surface 310s adjacent to the first center line CL1, on the basis of the first centerline CL1 of the first epitaxial pattern 310. When the second epitaxial pattern 340 includes only one epitaxial pattern, the fourth width W4 of the second epitaxial pattern 340 means a width to a side surface 340s of the second epitaxial pattern adjacent to the second center line CL2, on the basis of the second centerline CL2 of the second epitaxial pattern 340. In the case where the first epitaxial pattern 310 has a shape in which a plurality of epitaxial patterns is merged, a first area CTA1 in which the first epitaxial pattern 310 and the first contact CT1 are in contact with each other is defined by a value obtained by dividing a whole area in which the first epitaxial pattern 310 is in contact with the first contact CT1 by the number of merged epitaxial patterns. For example, in the case of FIG. 4, the first area CTA1 in which the first epitaxial pattern 310 is in contact with the first contact CT1 means an area obtained by dividing the whole area in which the first epitaxial pattern 310 is in contact with the first contact CT1 by 3. When the first epitaxial pattern 310 includes only one epitaxial pattern, the whole area in which the first epitaxial pattern 310 is in contact with the first contact CT1 is defined as the first area CTA1. When the second epitaxial pattern 340 includes only one epitaxial pattern, the whole area in which the second epitaxial pattern 340 is in contact with the second contact CT2 is defined as a second area CTA2.

Referring to FIGS. 4 to 6, in the first region I, the first epitaxial pattern 310 may have a shape in which a plurality of epitaxial patterns are merged. The first epitaxial pattern 310 may be grown from the first upper surface 105u1 of the field insulating film. The height from the bottom surface of the first trench T1 to the first upper surface 105u1 of the field insulating film is defined as a fifth height H1. According to some embodiments, the third height H12 of the first fin type pattern 110 may be the same as the fifth height H1, but the embodiments are limited thereto.

In the second region II, the second epitaxial pattern 340 may be grown from the second upper surface 105u2 of the field insulating film. A height from the bottom surface of the second trench T2 to the second upper surface 105u2 of the field insulating film may be a sixth height H2. According to some embodiments, the sixth height H2 may be different from the fourth height H22 of the second fin type pattern 120. For example, the sixth height H2 may be smaller than the fourth height H22 of the second fin type pattern 120, as shown by FIG. 4.

Accordingly, as described hereinabove with respect to FIGS. 1-6, an integrated circuit device is provided, which includes a first fin type pattern in a first region (I) of a substrate. This first fin type pattern includes a plurality of spaced-apart fins 110 extending in a first direction and having respective sidewalls defined by a first trench in the substrate. A first gate structure G1 is provided, which intersects the first fin type pattern and extends in a second direction. A second fin type pattern is provided in a second region (II) of the substrate. The second fin type pattern includes a fin 120, which extends in a third direction and has a sidewall defined by a second trench in the substrate. A second gate structure G2 is provided, which intersects the second fin type pattern and extends in a fourth direction. A field insulating film 105 is provided, which fills at least a part of the first trench and at least a part of the second trench. The field insulating film 105 has a first upper surface, which is in contact with at least one sidewall of the first fin type pattern and is spaced from a bottom of the first trench by a first height H1, and a second upper surface, which in contact with the sidewall of the second fin type pattern and is spaced from a bottom of the second trench by a second height H2 different from the first height H1. Also provided are first epitaxial patterns, which extend on respective ones of the plurality of fins, and are at least partially merged together into a unitary epitaxial pattern 310, and a second epitaxial pattern 340, which extends on the second fin type pattern.

Alternatively, these figures illustrate an integrated circuit device with a first FINFET, which includes a plurality of spaced-apart fin-shaped channel regions 110 that extend parallel to each other, and an insulated gate electrode G1 that overlaps the plurality of spaced-apart fin-shaped channel regions 110. A plurality of source-side epitaxial semiconductor regions are provided, which are at least partially merged together into a unitary epitaxial pattern 310 that contacts source-side ends of the plurality of spaced-apart fin-shaped channel regions. A source contact CT1 is provided, which is electrically coupled by the plurality of source-side epitaxial semiconductor regions to the source-side ends of the plurality of spaced-apart fin-shaped channel regions 110.

Referring to FIG. 7, in the first region I, the field insulating film 105 may include a first portion 105P1 under the first gate structure G1, and a second portion 105P2 on at least one sidewall of the first portion 105P1. The first portion 105P1 of the field insulating film 105 may have a first thickness THK1 from the upper surface of the substrate 100 to the upper surface of the field insulating film 105 (or to the bottom of the first gate structure G1), and the second portion 105P2 of the field insulating film 105 may have a second thickness THK2 from the upper surface of the substrate 100 to the upper surface of the field insulating film 105. The first thickness THK1 and the second thickness THK2 may differ by a first step difference D3. In the second region II, the field insulating film 105 may include a third portion 105P3 under the second gate structure G2, and a fourth portion 105P4 on at least one sidewall of the third portion 105P3. The third portion 105P3 of the field insulating film 105 may have a third thickness THK3 from the upper surface of the substrate 100 to the upper surface of the field insulating film 105 (or to the bottom of the second gate structure G2), and the fourth portion 105P4 of the field insulating film 105 may have a fourth thickness from the upper surface of the substrate 100 to the upper surface of the field insulating film 105. The third thickness THK3 and the fourth thickness THK4 may differ by a second step difference D4.

According to some embodiments, the fifth height H1 may be greater than the sixth height H2. When the fifth height H1 is greater than the sixth height H2, the first step difference D3 may be smaller than the second step difference D4. Since the first epitaxial pattern 310 and the second epitaxial pattern 340 are grown from the first upper surface 105u1 and the second upper surface 105u2 of the field insulating films, respectively, the second epitaxial pattern 340 may be grown from a position lower than the first epitaxial pattern 310. Therefore, when the fifth height H1 is greater than the sixth height H2 or when the first step difference D3 is smaller than the second step difference D4, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340. In addition, the first area CTA1 in which the first epitaxial pattern 310 and the first contact CT1 are in contact with each other is smaller than the second area CTA2 in which the second epitaxial pattern 340 and the second contact CT2 are in contact with each other.

In order to improve the integration degree, it is necessary to utilize a semiconductor structure including only one fin. However, if only one fin is included, since the volume of the epitaxial pattern decreases, a sufficient drive current may not be guaranteed. However, according to some embodiments, in the semiconductor structure of the second region II, since the volume of the second epitaxial pattern 340 is relatively large, the stress applied to the channel region from the second epitaxial pattern 340 may increase. Therefore, the mobility of the channel region may be increased in the second region II. Since the mobility of the channel region is increased in the second region II, the drive current of the semiconductor structure included in the second region II may increase. Furthermore, the second area CTA2 in which the second epitaxial pattern 340 and the second contact CT2 are in contact with each other is greater than the first area CTA1 in which the first epitaxial pattern 310 and the first contact CT1 are in contact with each other, the contact resistance between the second epitaxial pattern 340 and the second contact CT2 may be reduced. Therefore, although the semiconductor structure formed in the second region II includes only one fin, since the second volume (or the fourth width W4 or the second area CTA2) of the second epitaxial pattern 340 is large, a necessary drive current may be guaranteed.

FIGS. 8 to 16 are illustrative diagrams for explaining the semiconductor device according to some embodiments. For the sake of convenience of explanation, repeated or similar contents to the above-described contents will be omitted or briefly explained.

Figure 8:
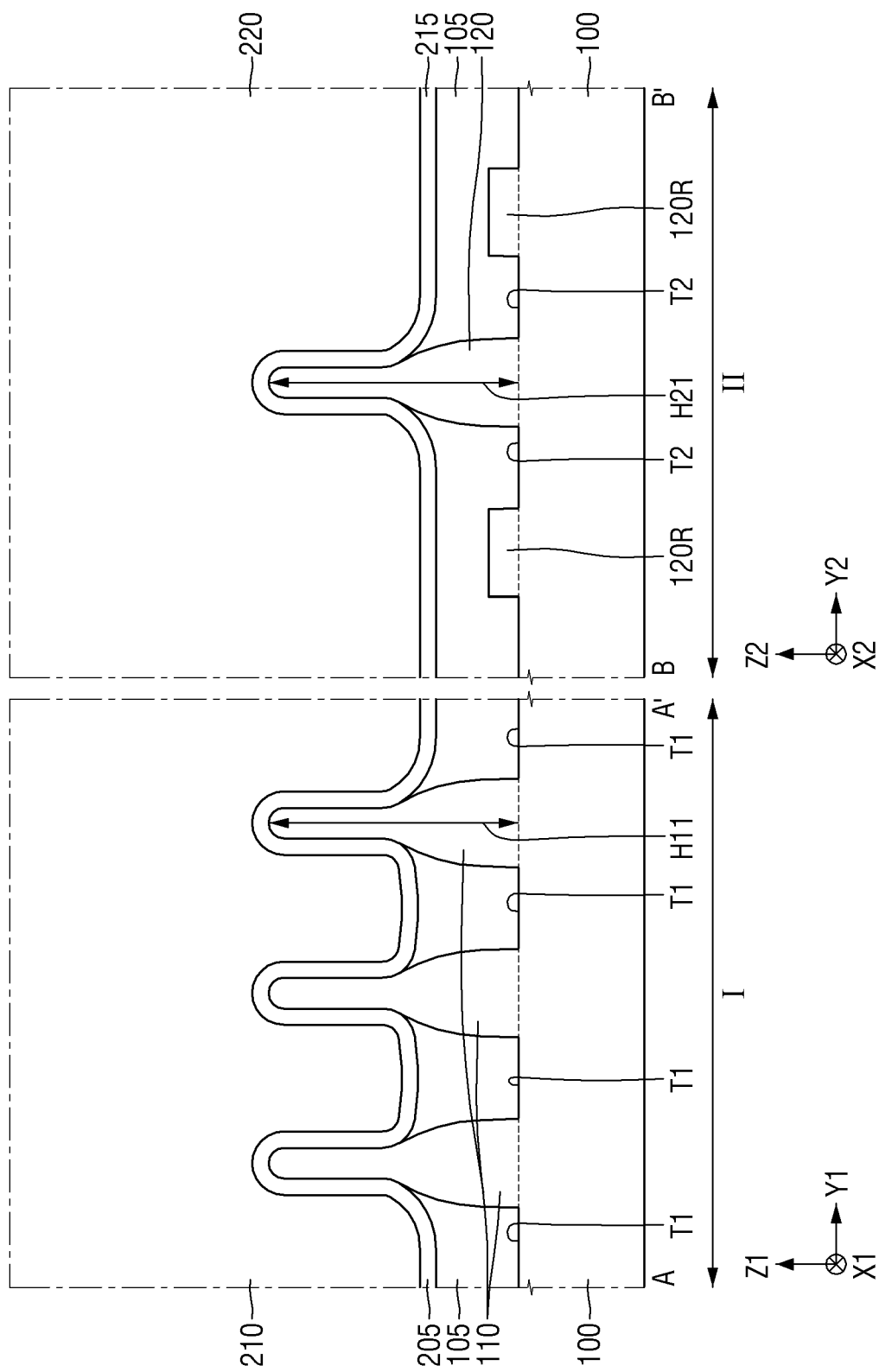
FIGS. 8 to 16 are illustrative diagrams for explaining the semiconductor device according to some embodiments.

The semiconductor device according to some embodiments will be described with reference to FIG. 8. Unlike the example illustrated in FIGS. 2a and 2b, a remaining fin 120R may be formed in the second region II of the substrate 100. The remaining fin 120R may be formed by remaining of a part of the fins removed when forming the second fin type pattern 120.

Figure 9:
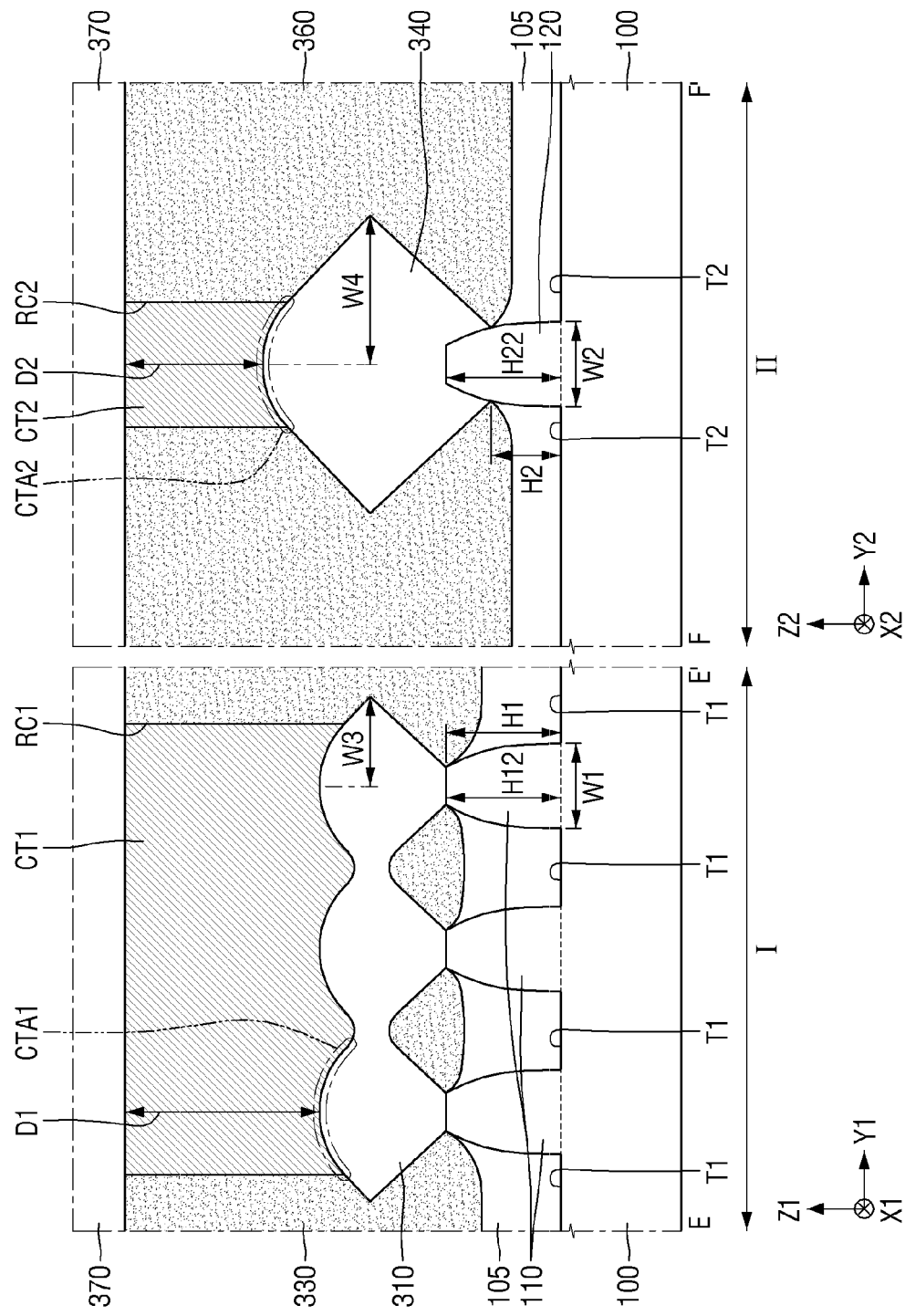

The semiconductor device according to some embodiments will be described with reference to FIGS. 1, 3, and 9. According to some embodiments, the first depth D1 of the first recess RC1 may be greater than the second depth D2 of the second recess RC2. In other words, the semiconductor device according to some embodiments may be a semiconductor device in which the second depth D2 of the second recess RC2 is reduced in the semiconductor device described using FIGS. 1 to 7. At this time, the first area CTA1 in which the first epitaxial pattern 310 is in contact with the first contact CT1 is the same as the second area CTA2 in which the second epitaxial pattern 340 is in contact with the second contact CT2.

According to some embodiments, since the second depth D2 of the second recess RC2 is smaller than the first depth D1 of the first recess RC1, burden on formation of the second recess RC2 the may be reduced. That is, while maintaining the contact resistance between the second epitaxial pattern 340 and the second contact CT2 at the level of the contact resistance between the first epitaxial pattern 310 and the first contact CT1, the burden on the formation of the second recess RC2 may be reduced. At this time, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340.

Figure 10:
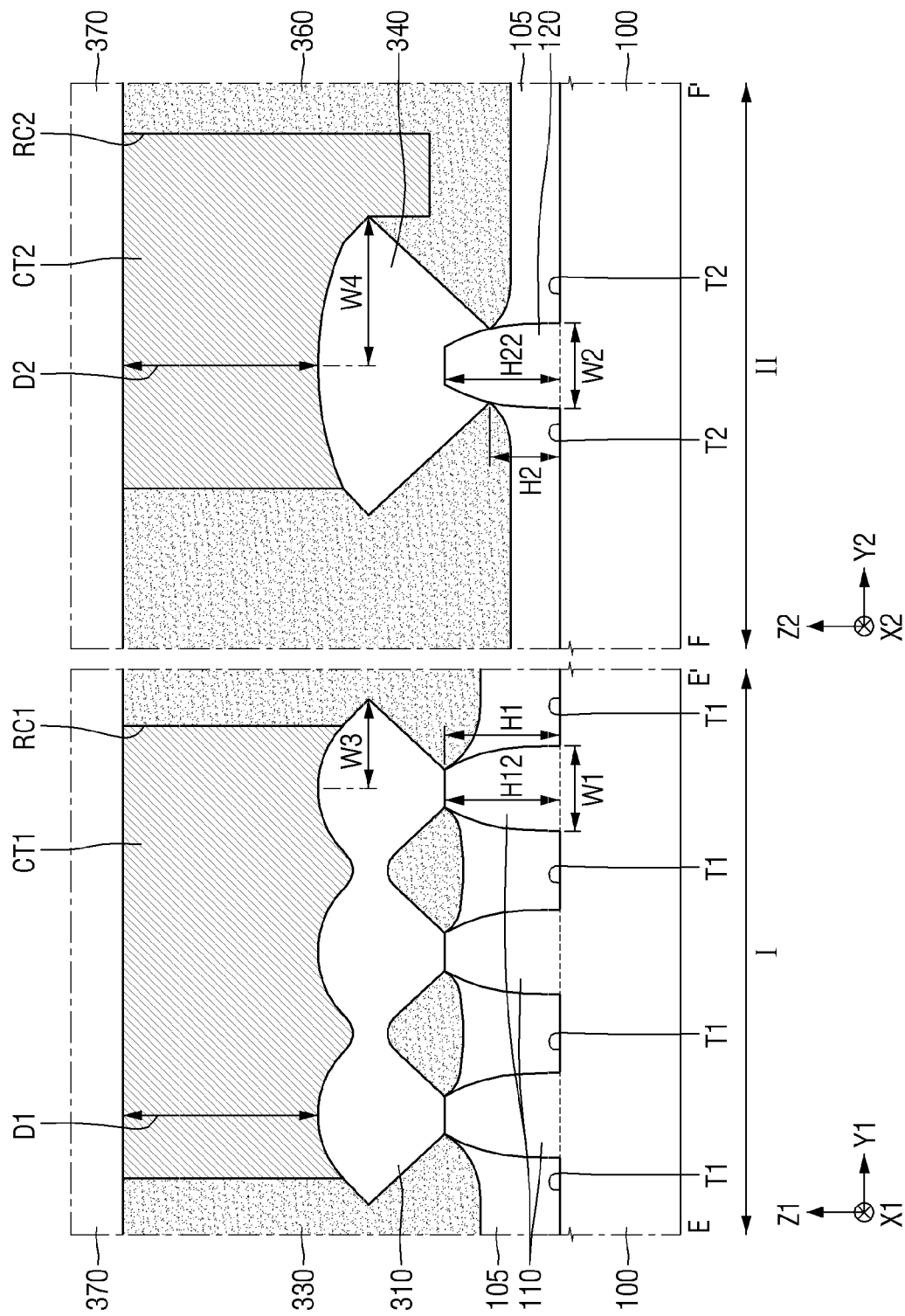

The semiconductor device according to some embodiments will be described with reference to FIGS. 1, 3, and 10. According to some embodiments, the second contact CT2 may be formed to cover the one sidewall of the second epitaxial pattern 340. In other words, the semiconductor device according to some embodiments may be a semiconductor device in which the shape of the second contact CT2 is changed in the semiconductor device described using FIGS. 1 to 7. At this time, the second area CTA2 in which the second epitaxial pattern 340 and the second contact CT2 are in contact with each other may increase.

According to some embodiments, the contact resistance between the second epitaxial pattern 340 and the second contact CT2 may be reduced. At this time, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340.

Figure 11:
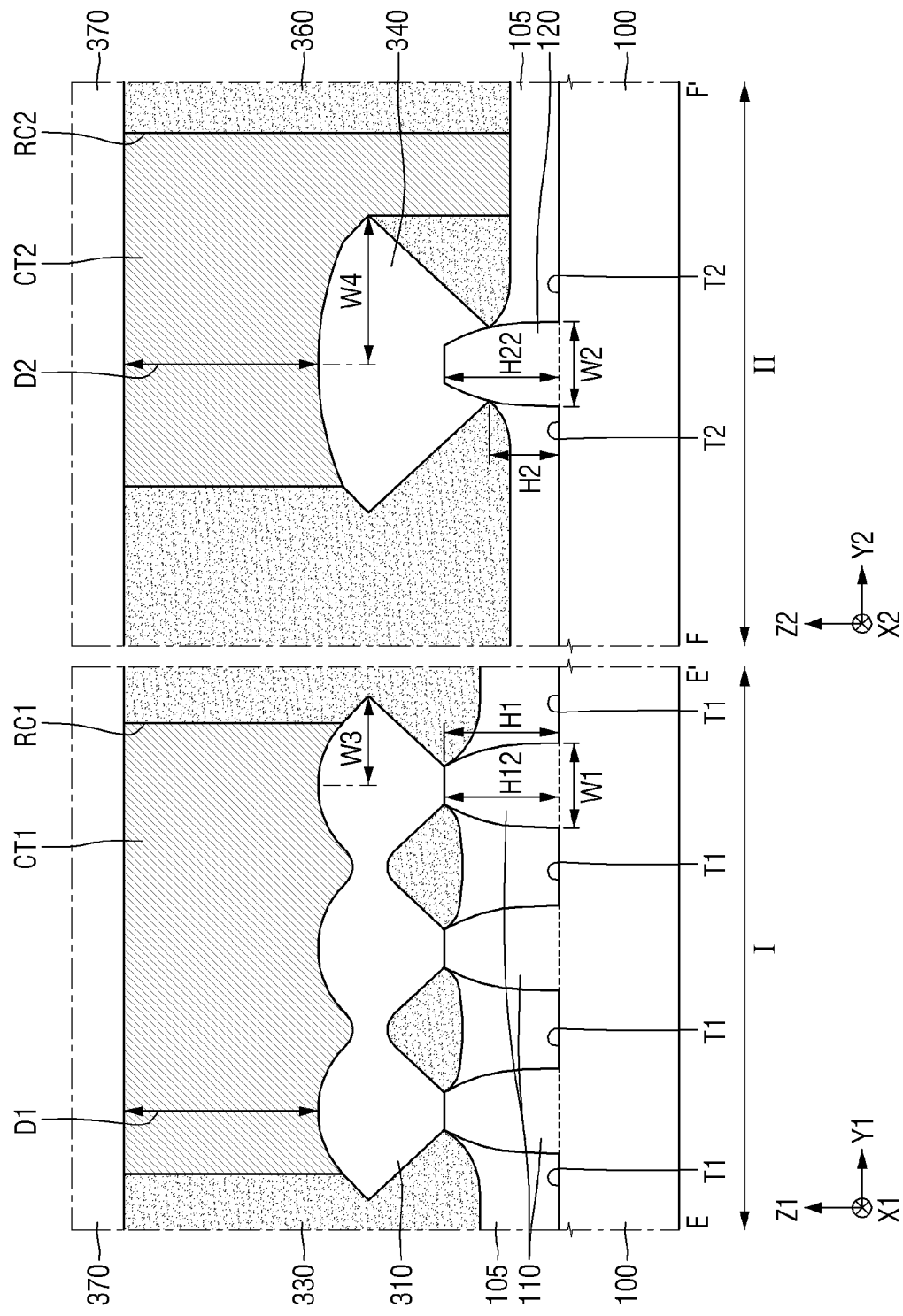

The semiconductor device according to some embodiments will be described with reference to FIGS. 1, 3, and 11. According to some embodiments, the second contact CT2 may extend to the upper surface of the field insulating film 105. In other words, the semiconductor device according to some embodiments may be a semiconductor device in which the shape of the second contact CT2 is changed in the semiconductor device described using FIGS. 1 to 7. At this time, the second area CTA2 in which the second epitaxial pattern 340 and the second contact CT2 are in contact with each other may increase.

Figure 12:
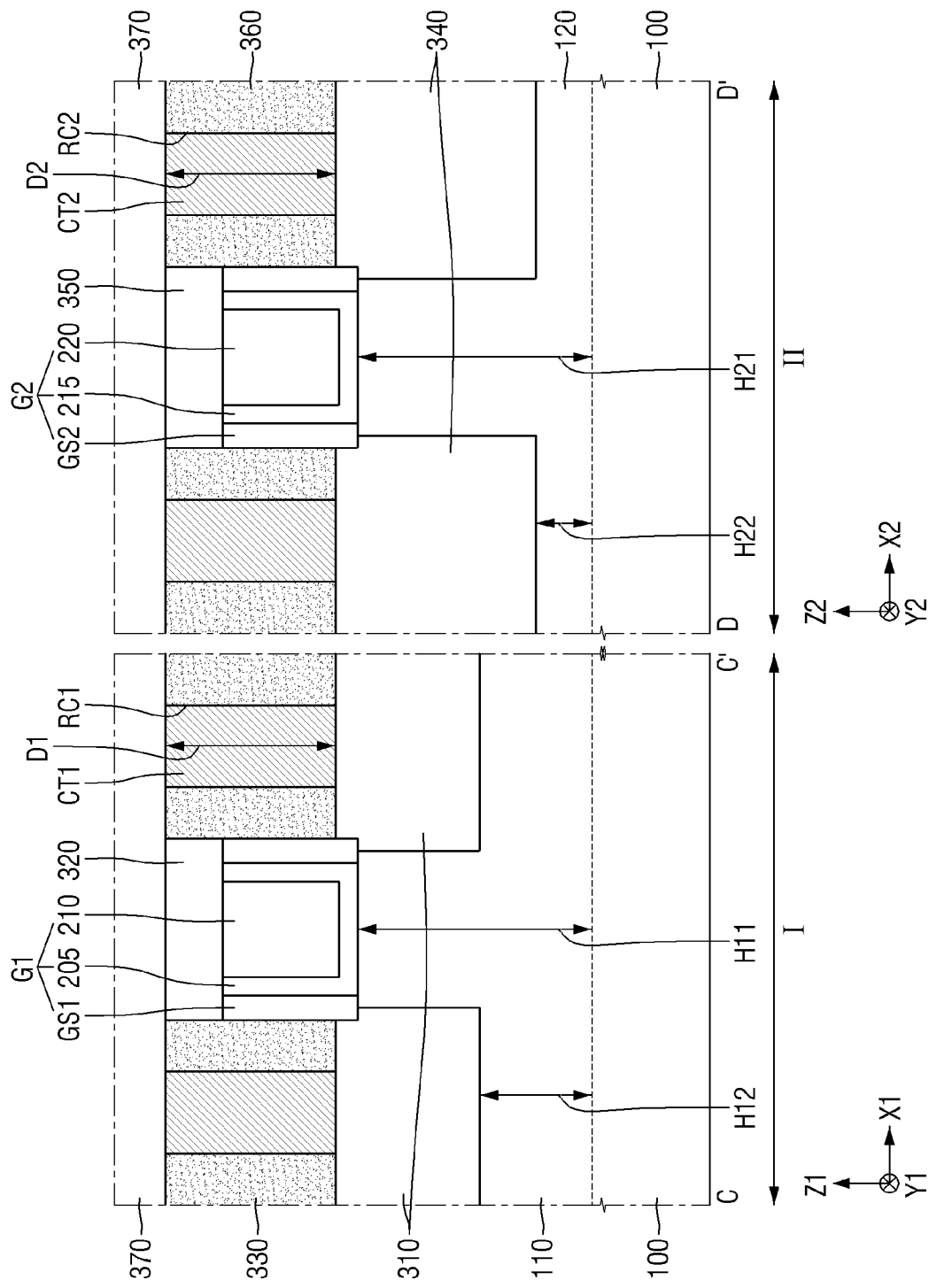
Figure 13:
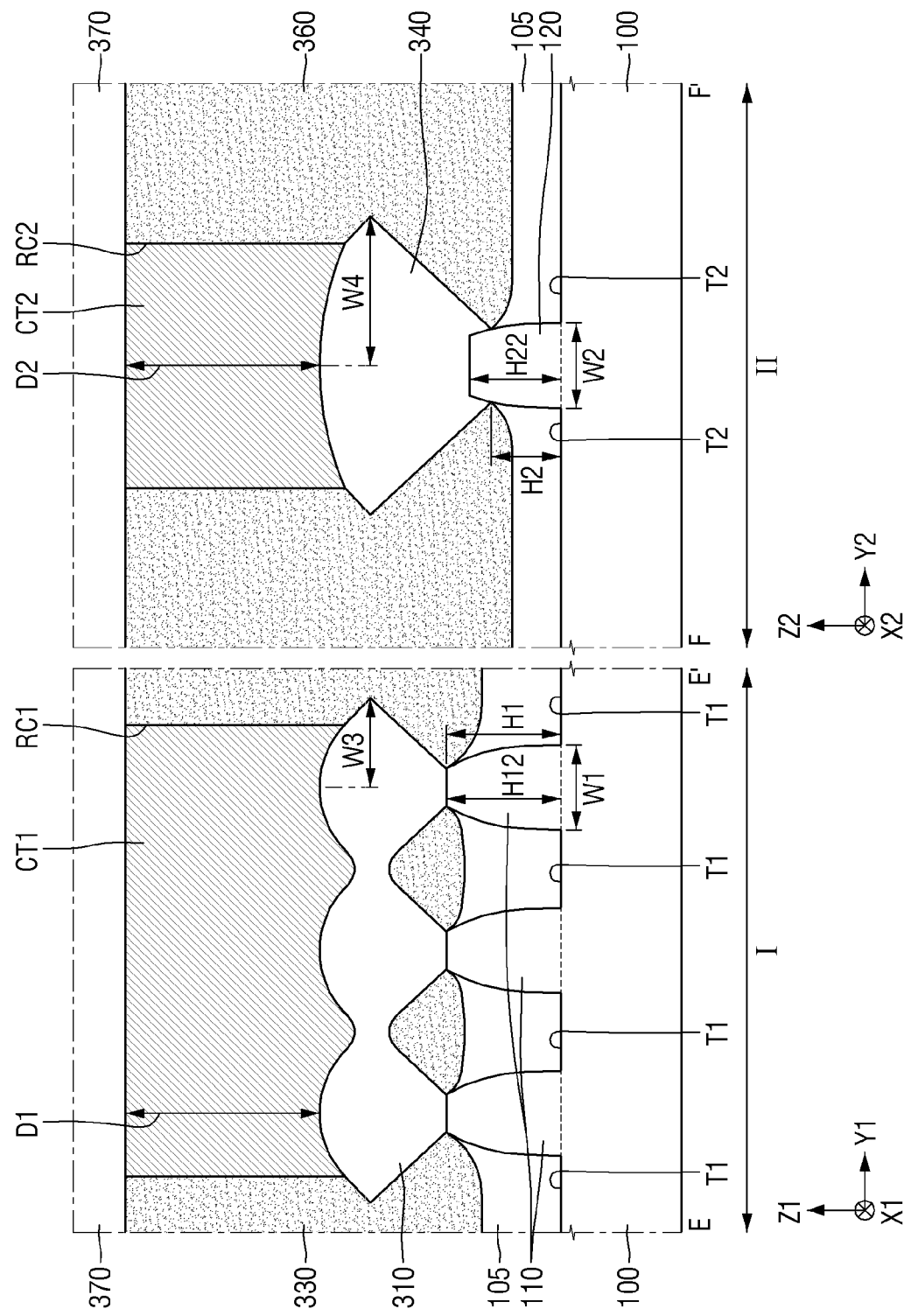

The semiconductor device according to some embodiments will be described with reference to FIGS. 1, 12, and 13. According to some embodiments, the third height H12 of the first fin type pattern 110 may be greater than the fourth height H22 of the second fin type pattern 120. According to some embodiments, when the sixth height H2 from the bottom surface of the second trench T2 to the second upper surface 105u2 of the field insulating film decreases, the fourth height H22 of the second fin type pattern 120 may also decrease. At this time, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340. In addition, the first area CTA1 in which the first epitaxial pattern 310 and the first contact CT1 are in contact with each other may be smaller than the second area CTA2 in which the second epitaxial pattern 340 and the second contact CT2 are in contact with each other.

Figure 14:
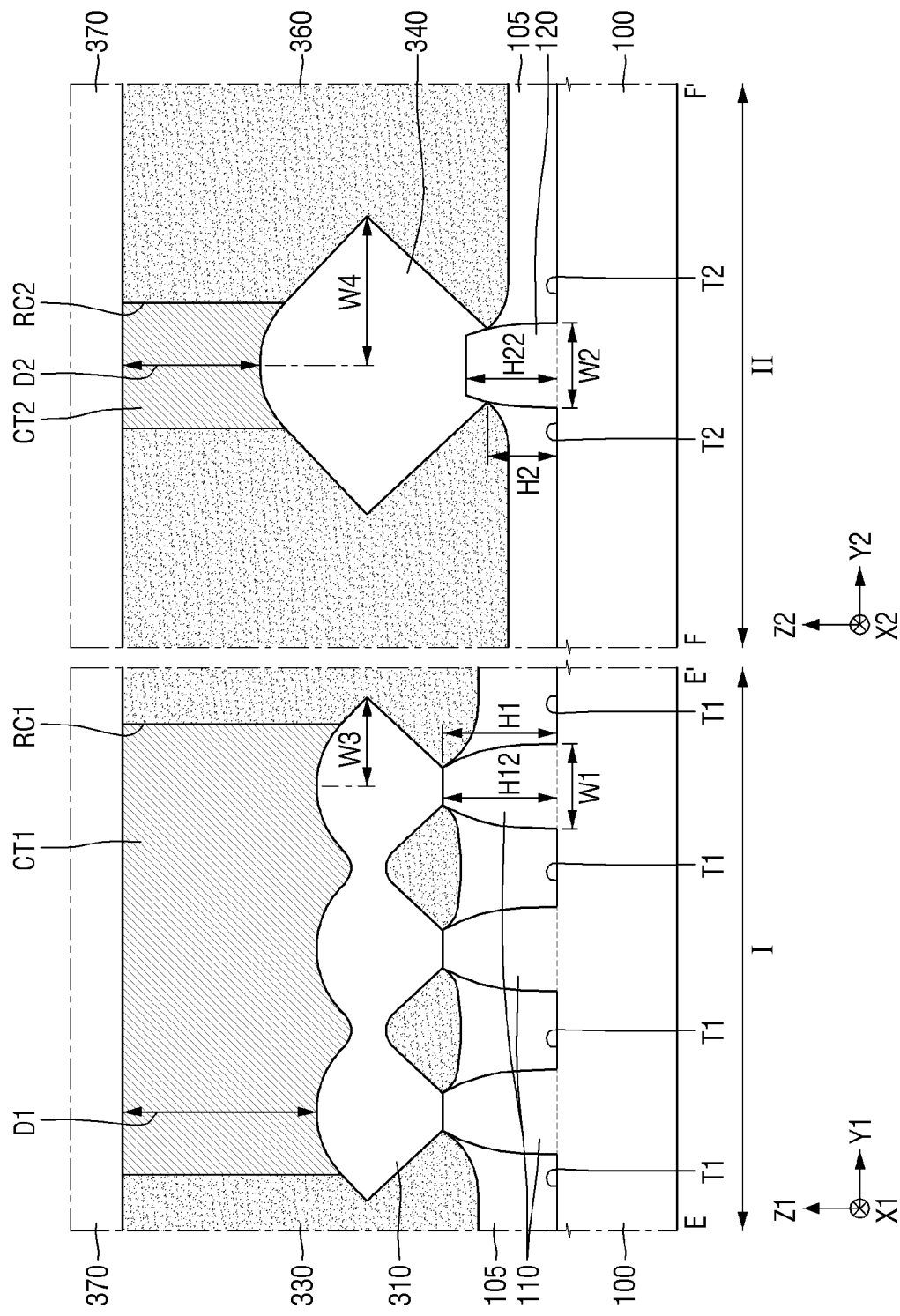

The semiconductor device according to some embodiments will be described with reference to FIGS. 1, 12, and 14. According to some embodiments, the first depth D1 of the first recess RC1 may be greater than the second depth D2 of the second recess RC2. In other words, the semiconductor device according to some embodiments may be a semiconductor device in which the second depth D2 of the second recess RC2 decreases in the semiconductor device using FIGS. 1, 12, and 13. The first area CTA1 in which the first epitaxial pattern 310 is in contact with the first contact CT1 may be the same as the second area CTA2 in which the second epitaxial pattern 340 is in contact with the second contact CT2. The first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340.

Figure 15:
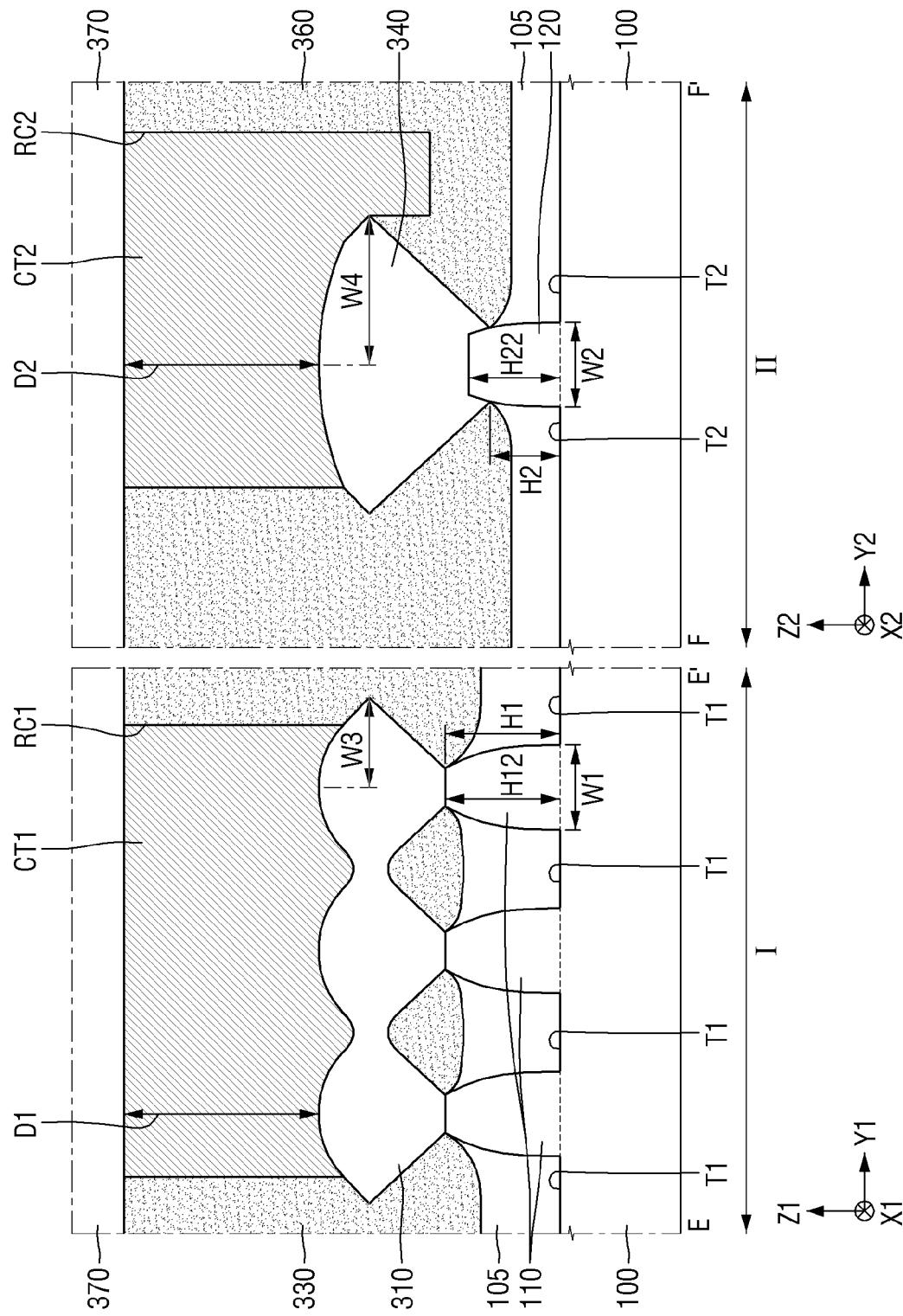

The semiconductor device according to some embodiments will be described with reference to FIGS. 1, 12, and 15. According to some embodiments, the second contact CT2 may be formed to cover the one sidewall of the second epitaxial pattern 340. In other words, the semiconductor device according to some embodiments may be a semiconductor device in which the shape of the second contact CT2 is changed in the semiconductor device using FIGS. 1, 12, and 13. Since the second contact CT2 surrounds the one sidewall of the second epitaxial pattern 340, the second area CTA2 in which the second epitaxial pattern 340 and the second contact CT2 are in contact with each other may increase. The first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340.

Figure 16:
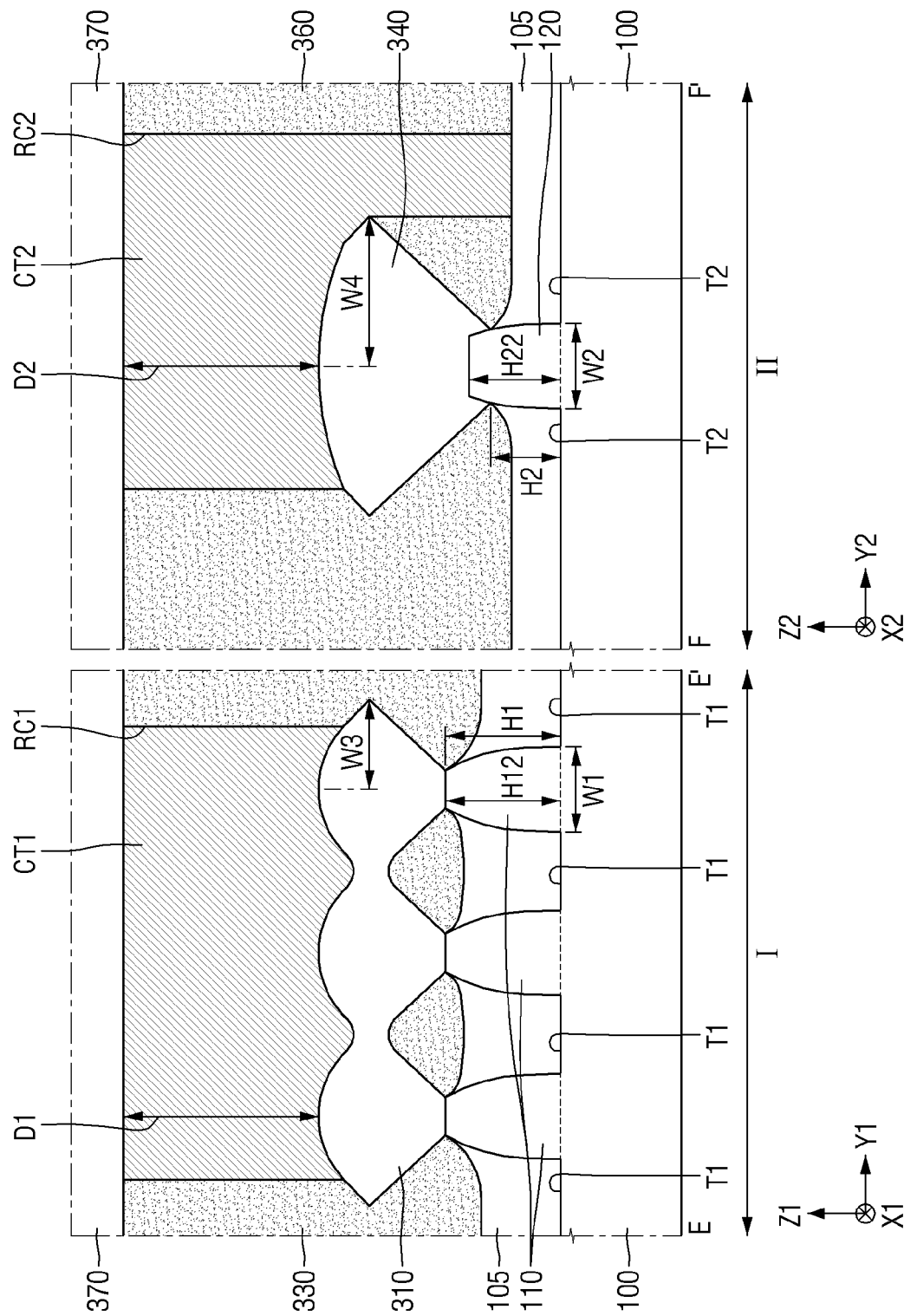

The semiconductor device according to some embodiments will be described with reference to FIGS. 1, 12, and 16. According to some embodiments, the second contact CT2 may extend to the upper surface of the field insulating film 105. In other words, the semiconductor device according to some embodiments may be a semiconductor device in which the shape of the second contact CT2 is changed in the semiconductor device described using FIGS. 1, 12, and 13. At this time, the second area CTA2 in which the second epitaxial pattern 340 and the second contact CT2 are in contact with each other may increase. At this time, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340.

Figure 17:
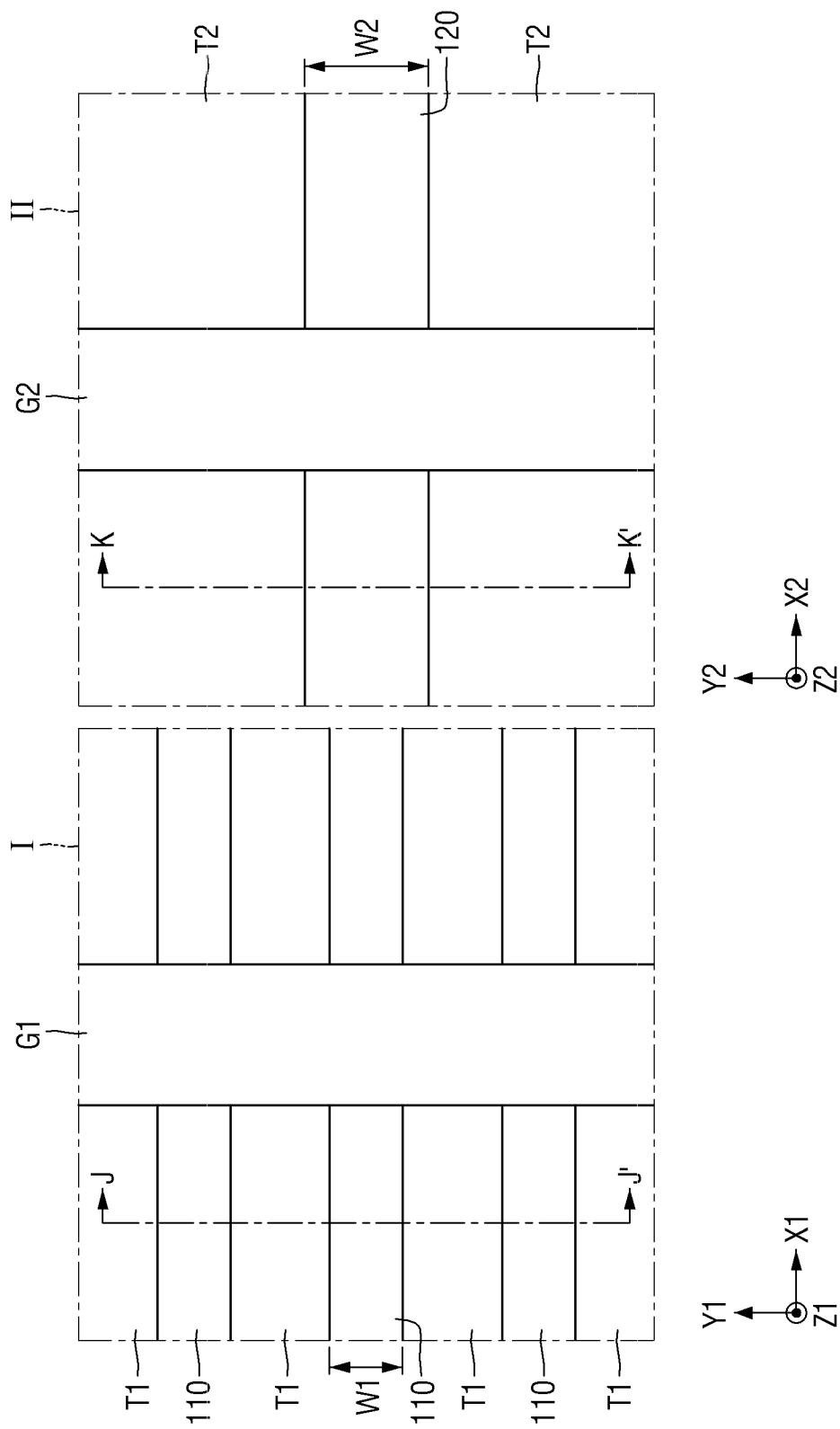
FIG. 17 is an exemplary layout diagram for describing the semiconductor device according to some embodiments.
Figure 18:
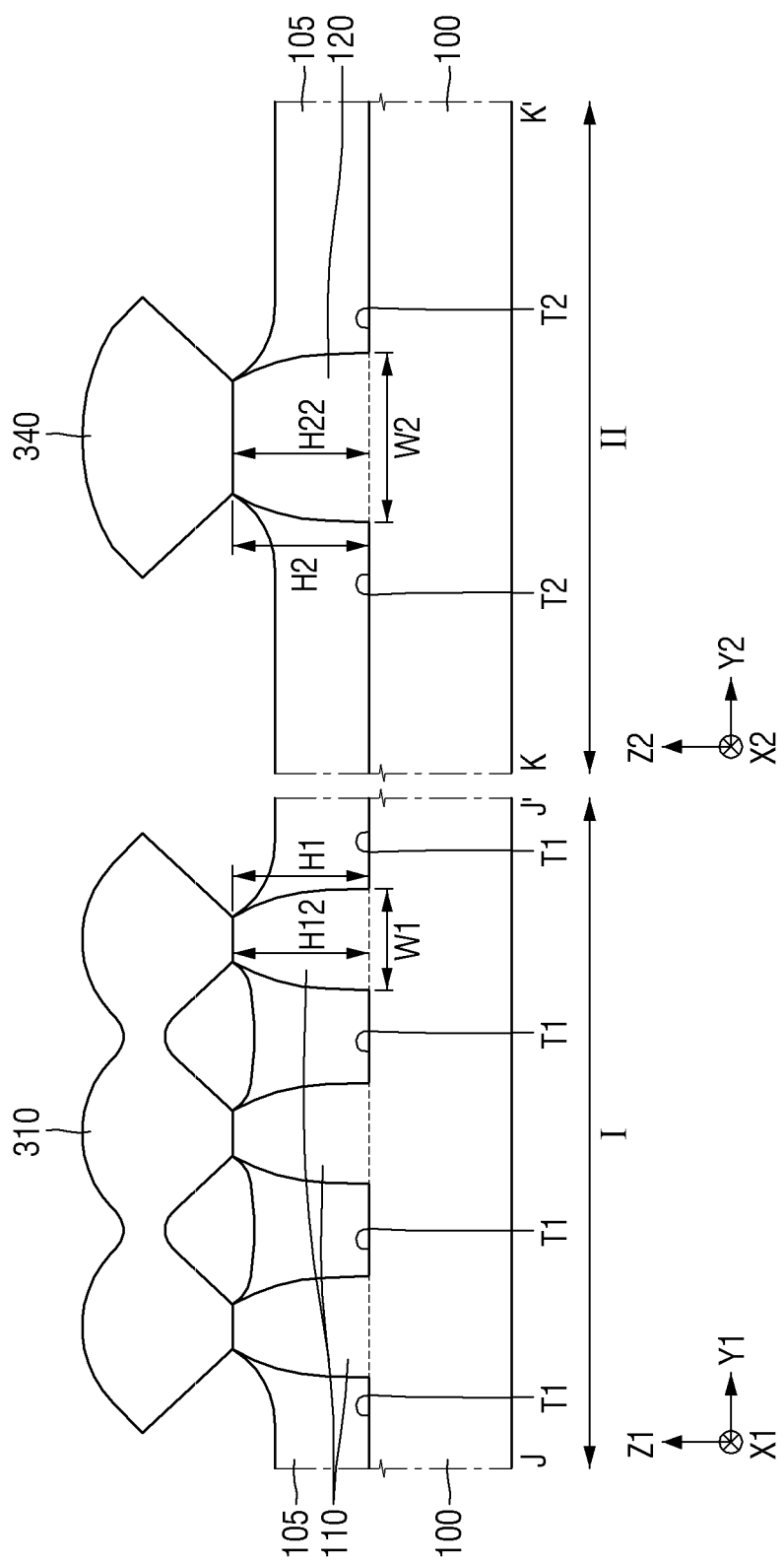
FIGS. 18 to 20 are cross-sectional views taken along lines J-J' and K-K' of FIG. 17.
Figure 19:
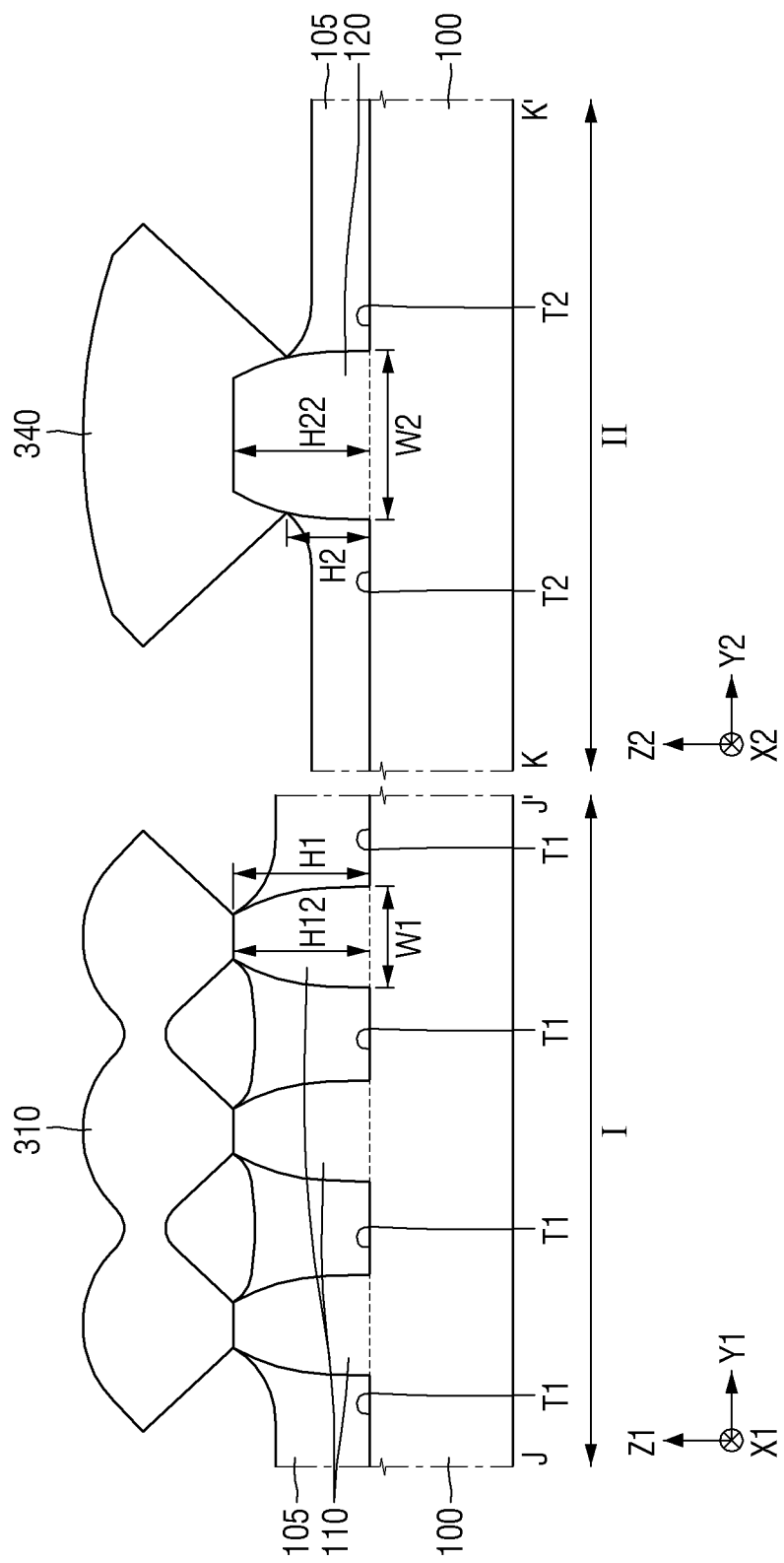
Figure 20:
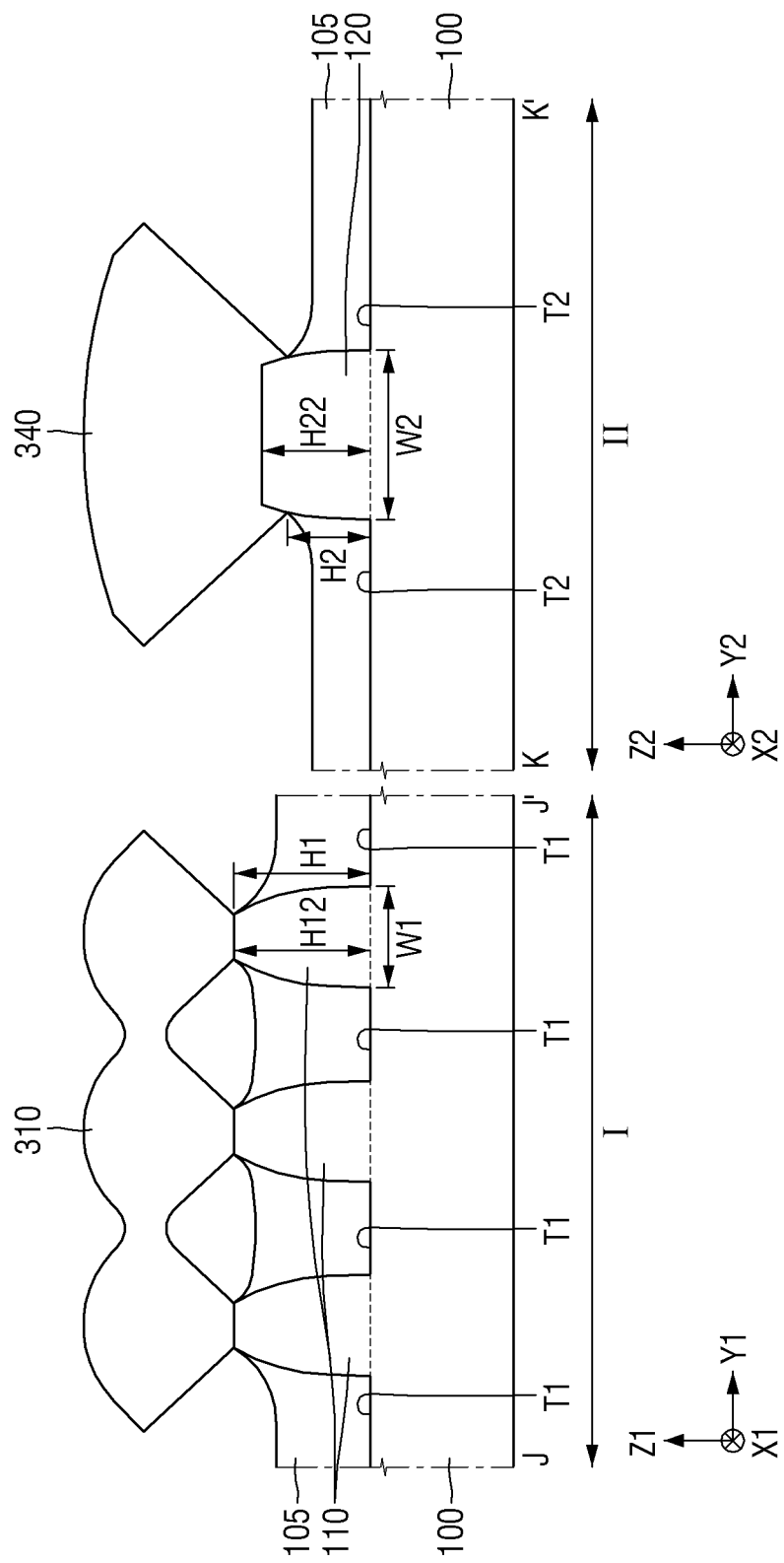

FIG. 17 is an exemplary layout diagram for describing the semiconductor device according to some embodiments. FIGS. 18 to 20 are cross-sectional views taken along lines J-J' and K-K' of FIG. 17. For convenience of explanation, the first contact CT1, the second contact CT2, and the first interlayer insulating film 330 to the third interlayer insulating film 370 are omitted. Also, for the sake of convenience of explanation, overlapping or similar contents will be omitted or briefly explained.

Referring to FIG. 17, a first fin type pattern 110 having a first width W1 on a lower surface may extend in the first direction X1, and a second fin type pattern 120 having a second width W2 on a lower surface may extend in the third direction X2. The first width W1 and the second width W2 may be different from each other. For example, the second width W2 may be larger than the first width W1, as shown. The first gate structure G1 may intersect the first fin type pattern 110 and extend in the second direction Y1. The second gate structure G2 may intersect the second fin type pattern 120 and extend in the fourth direction Y2.

The semiconductor device according to some embodiments will be described with reference to FIGS. 17 and 18. According to some embodiments, a third height H12 of the first fin type pattern 110 and a fourth height H22 of the second fin type pattern 120 may be the same. Further, a fifth height H1 from the bottom surface of the first trench T1 to the first upper surface 105u1 of the field insulating film may be the same as a sixth height H2 from the bottom surface of the second trench T2 to the second upper surface 105u2 of the field insulating film. However, the first width W1 of the lower surface of the first fin type pattern 110 may be smaller than the second width W2 of the lower surface of the second fin type pattern 120. Therefore, the area in which the first fin type pattern 110 is in contact with the first epitaxial pattern 310 may be smaller than the area in which the second fin type pattern 120 is in contact with the second epitaxial pattern 340. In other words, the width of the bottom surface of the first epitaxial pattern 310 in the second direction Y1 may be smaller than the width of the bottom surface of the second epitaxial pattern 340 in the fourth direction Y2. Since the first epitaxial pattern 310 and the second epitaxial pattern 340 are grown in the same direction (that is, at the same angle), the first volume of the first epitaxial pattern 310 having a smaller width of the bottom surface may be smaller than the second volume of the second epitaxial pattern 340. Similarly, the third width W3 of the first epitaxial pattern 310 may be smaller than the fourth width W4 of the second epitaxial pattern 340. In addition, the first area CTA1 in which the first epitaxial pattern 310 and the first contact CT1 are in contact with each other may be smaller than the second area CTA2 in which the second epitaxial pattern 340 and the second contact CT2 are in contact with each other.

The semiconductor device according to some embodiments will be described with reference to FIGS. 17 and 19. According to some embodiments, a fifth height H1 from the bottom surface of the first trench T1 to the first upper surface 105u1 of the field insulating film may be greater than the sixth height H2 from the bottom surface of the second trench T2 to the second upper surface 105u2 of the field insulating film. In other words, the semiconductor device according to some embodiments may be formed so that the sixth height H2 of the second upper surface 105u2 of the field insulating film is lower than the semiconductor device using FIGS. 17 and 18. According to some embodiments, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340. In addition, the first area CTA1 in which the first epitaxial pattern 310 and the first contact CT1 are in contact with each other may be smaller than the second area CTA2 in which the second epitaxial pattern 340 and the second contact CT2 are in contact with each other.

The semiconductor device according to some embodiments will be described with reference to FIGS. 17 and 20. According to some embodiments, the third height H12 of the first fin type pattern 110 may be greater than the fourth height H22 of the second fin type pattern 120. In other words, the semiconductor device according to some embodiments may be formed so that the fourth height H22 of the second fin type pattern 120 is lower than the semiconductor device described using FIGS. 17 and 19. According to some embodiments, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340. In addition, the first area CTA1 in which the first epitaxial pattern 310 and the first contact CT1 are in contact with each other may be smaller than the second area CTA2 in which the second epitaxial pattern 340 and the second contact CT2 are in contact with each other.

Figure 21:
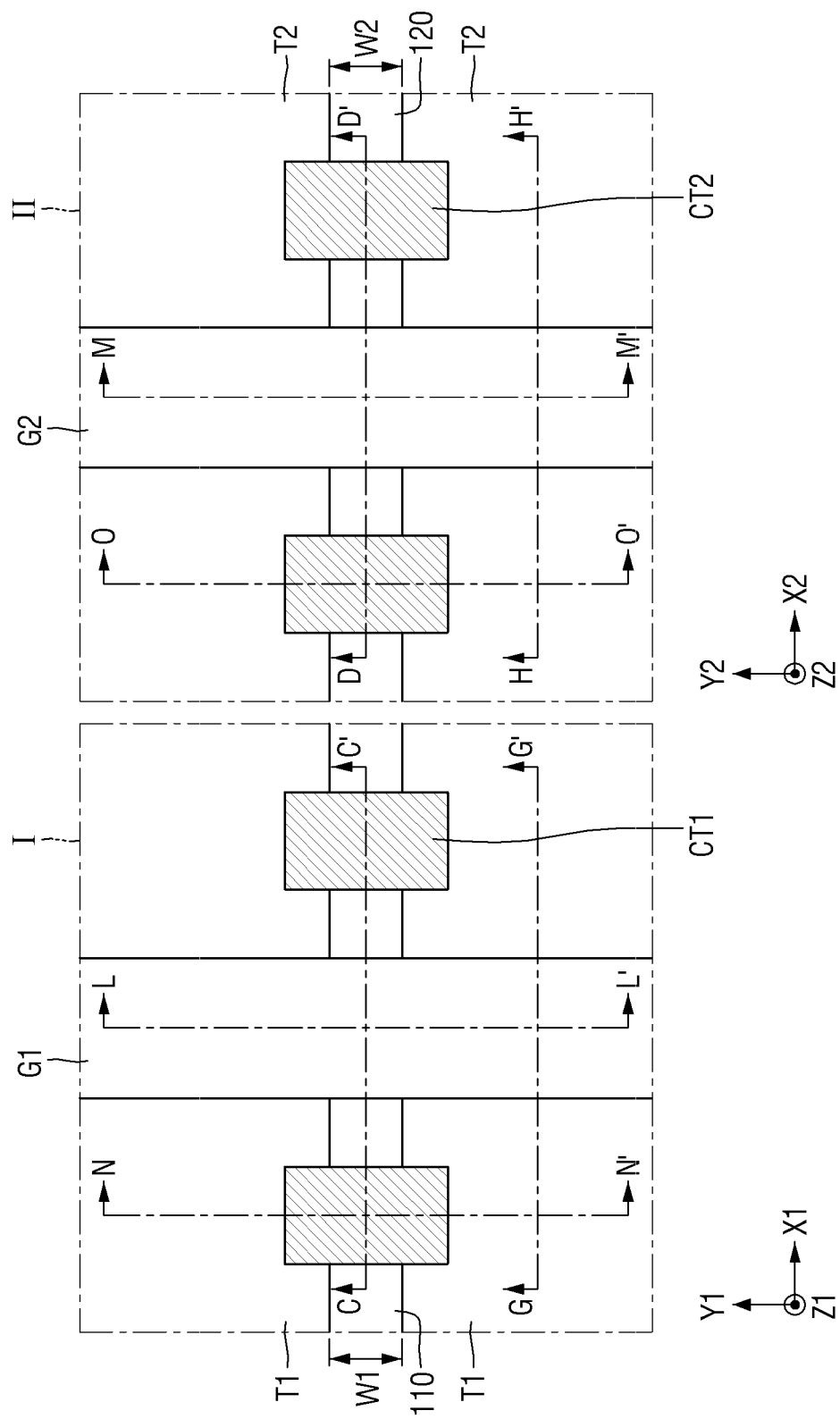
FIG. 21 is an exemplary layout diagram for illustrating the semiconductor device according to some embodiments.

FIG. 21 is an exemplary layout diagram for illustrating the semiconductor device according to some embodiments. FIGS. 22 to 30 are exemplary cross-sectional views for explaining the semiconductor device according to some embodiments. For the sake of convenience of explanation, overlapping or similar contents will be omitted or briefly explained.

Referring to FIG. 21, in the first region I of the substrate 100, the first fin type pattern 110 may be defined by the first trench T1. For example, the sidewalls of the first fin type pattern 110 may be defined by the first trench T1. The first fin type pattern 110 may extend in the first direction X1. In the second region II of the substrate 100, the second fin type pattern 120 may be defined by the second trench T2. For example, the sidewalls of the second fin type pattern 120 may be defined by the second trench T2. The second fin type pattern 120 may extend in the third direction X2. According to some embodiments, each of the first fin type pattern 110 and the second fin type pattern 120 may include one fin. The cross-sectional view taken along lines C-C' and D-D' of FIG. 21 may be the same as FIG. 3 or FIG. 12 described above.

Figure 22:
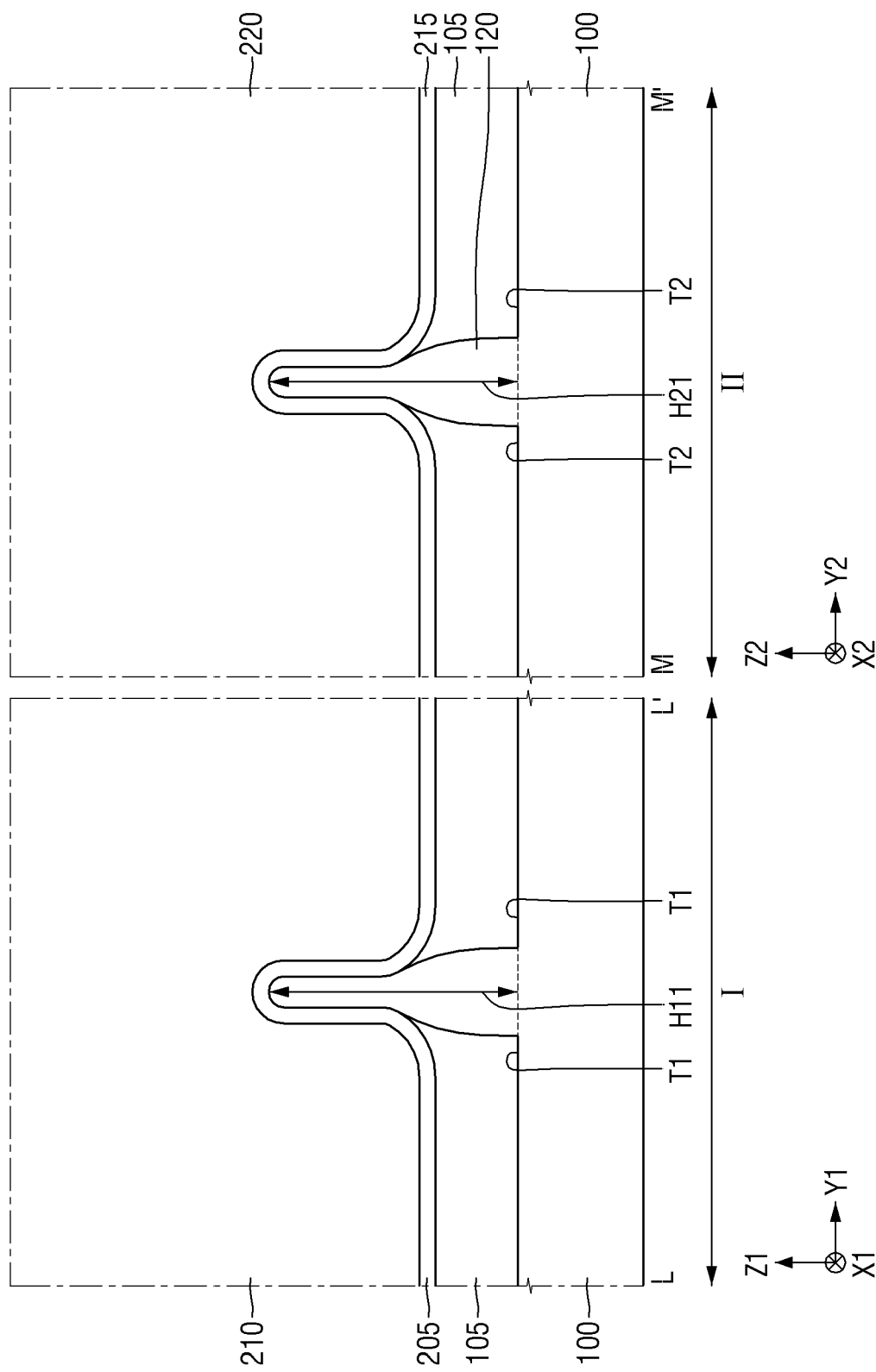
FIGS. 22 to 30 are exemplary cross-sectional views for explaining the semiconductor device according to some embodiments.
Figure 23:
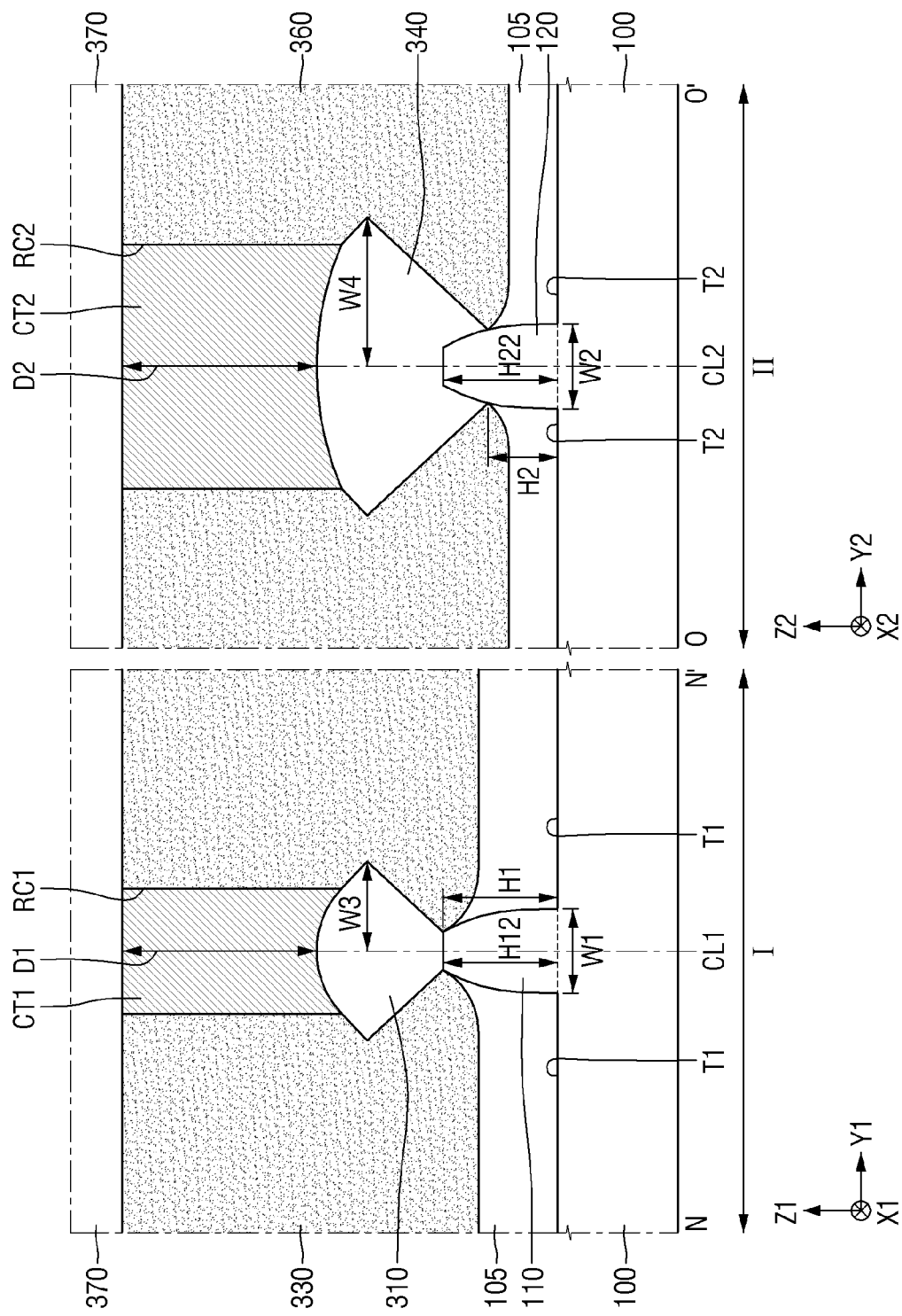

The semiconductor device according to some embodiments will be described with reference to FIGS. 21, 22 and 23. According to some embodiments, the first height H11 of the first fin type pattern 110 may be the same as the second height H21 of the second fin type pattern 120. Also, the third height H12 of the first fin type pattern 110 may be the same as the fourth height H22 of the second fin type pattern 120. Further, the first width W1 of the lower surface of the first fin type pattern 110 may be the same as the second width W2 of the lower surface of the second fin type pattern 120.

According to some embodiments, a fifth height H1 from the bottom surface of the first trench T1 to the first upper surface 105u1 of the field insulating film may be greater than a sixth height H2 from the bottom surface of the second trench T2 to the second upper surface 105u2 of the field insulating film. At this time, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340. Also, the first area CTA1 in which the first epitaxial pattern 310 and the first contact CT1 are in contact with each other may be smaller than the second area CTA2 in which the second epitaxial pattern 340 and the second contact CT2 are in contact with each other.

According to some embodiments, both the first fin type pattern 110 and the second fin type pattern 120 may include a single fin. However, the first volume of the first epitaxial pattern 310 may be smaller than the second volume of the second epitaxial pattern 340. In the case where the degree of integration is relatively high, there is a possibility that the second epitaxial pattern 340 having a volume larger than that of the first epitaxial pattern 310 may be short-circuited with the adjacent semiconductor structure. Therefore, a semiconductor structure included in the first region I may be disposed in a region with a relatively high degree of integration (for example, an SRAM region), and a semiconductor structure included in the second region II may be disposed in a region with a relatively low degree of integration (for example, a logic region).

Figure 24:
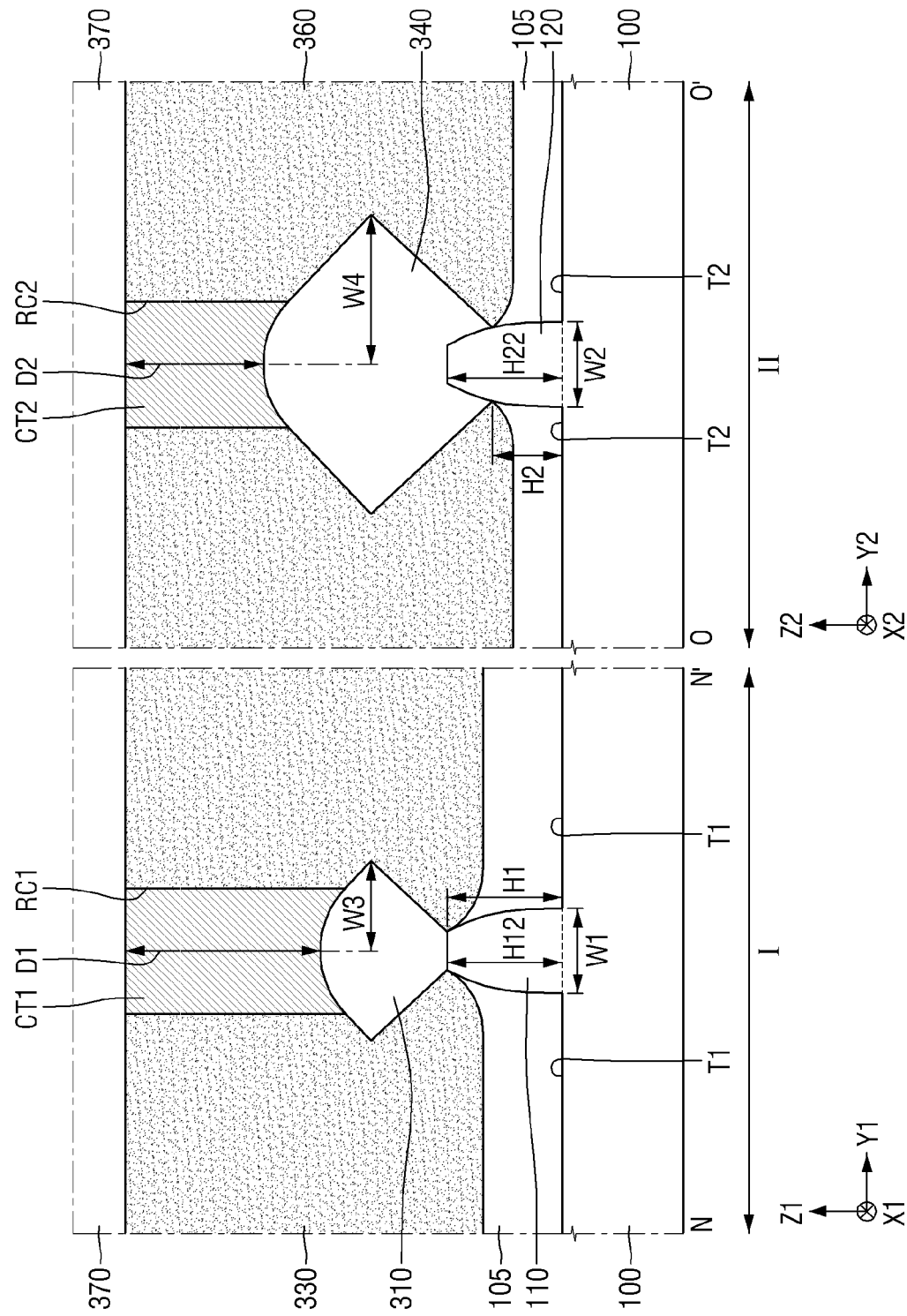

The semiconductor device according to some embodiments will be described using FIGS. 21, 22 and 24. According to some embodiments, the first depth D1 of the first recess RC1 may be greater than the second depth D2 of the second recess RC2. In other words, the semiconductor device according to some embodiments may be a semiconductor device in which the second depth D2 of the second recess RC2 decreases in the semiconductor device described with reference to FIGS. 21, 22, and 23. At this time, the first area CTA1 in which the first epitaxial pattern 310 is in contact with the first contact CT1 may be same as the second area CTA2 in which the second epitaxial pattern 340 is in contact with the second contact CT2. According to some embodiments, the first volume of the first epitaxial pattern 310 may be smaller than the second volume of the second epitaxial pattern 340. In addition, the third width W3 of the first epitaxial pattern 310 may be smaller than the fourth width W4 of the second epitaxial pattern 340.

Figure 25:
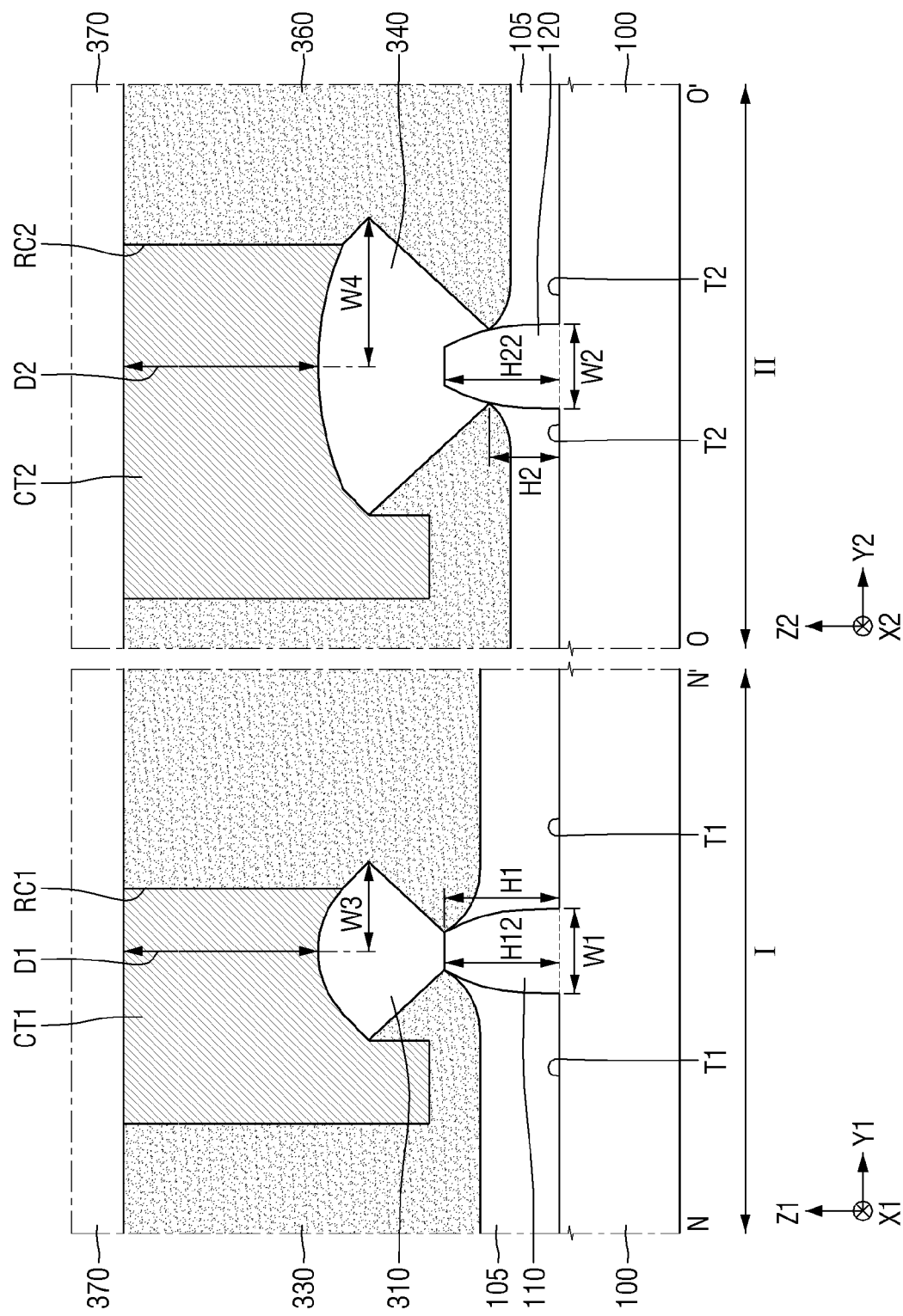

The semiconductor device according to some embodiments will be described with reference to FIGS. 21, 22 and 25. According to the some embodiments, each of the first contact CT1 and the second contact CT2 may be formed to cover a part of the sidewalls of the first epitaxial pattern 310 the second epitaxial pattern 340. In other words, the semiconductor device according to some embodiments may be a semiconductor device in which the shapes of the first contact CT1 and the second contact CT2 are changed in the semiconductor device described with reference to FIGS. 21, 22, and 23.

Figure 26:
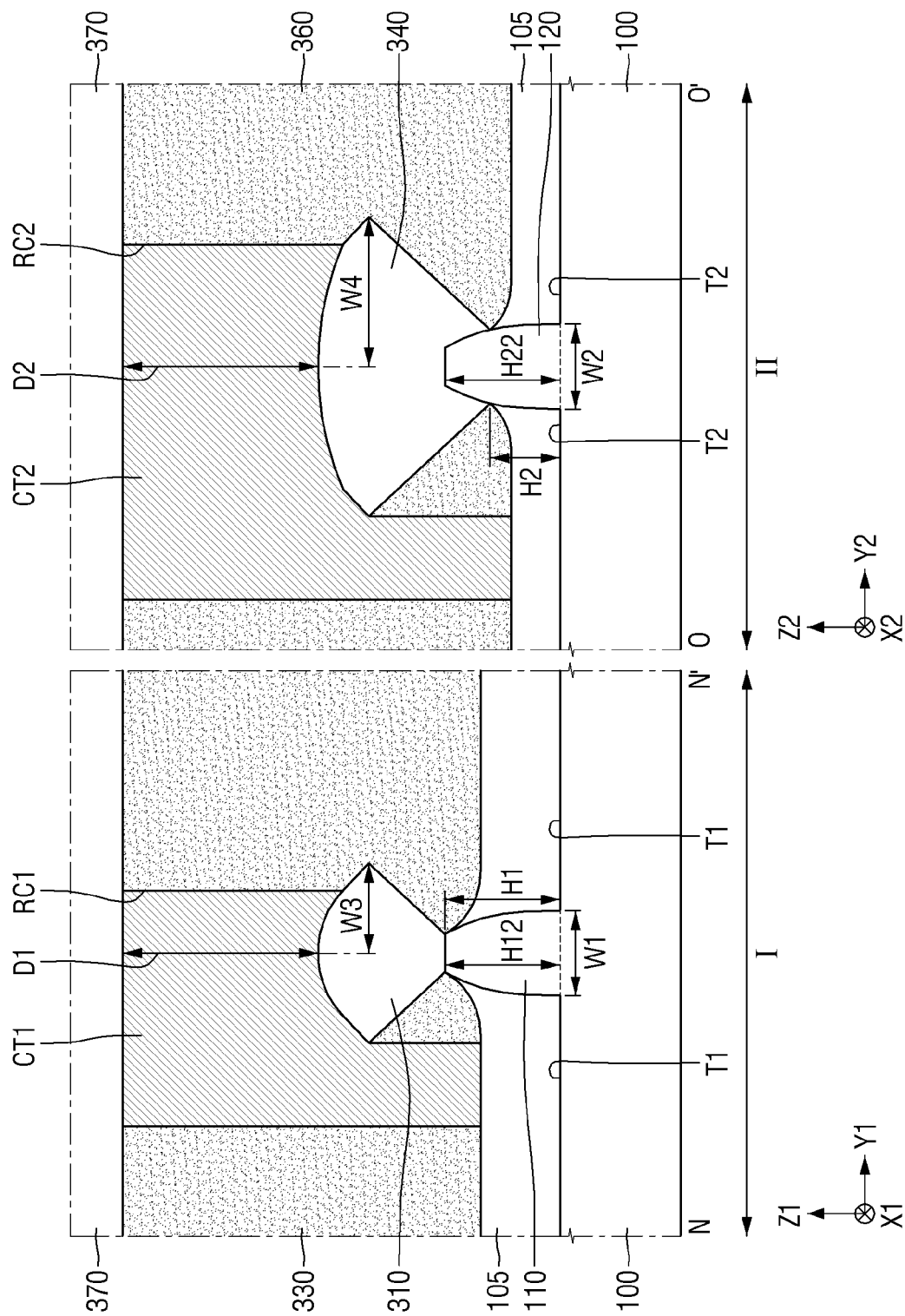

The device according to some embodiments will be described with reference to FIGS. 21, 22 and 26. According to some embodiments, each of the first contact CT1 and the second contact CT2 may extend to the field insulating film 105 and may be in contact with the field insulating film 105. In other words, the semiconductor device according to some embodiments may be a semiconductor device in which the shapes of the first contact CT1 and the second contact CT2 are changed in the semiconductor device described with reference to FIGS. 21, 22, and 25.

Figure 27:
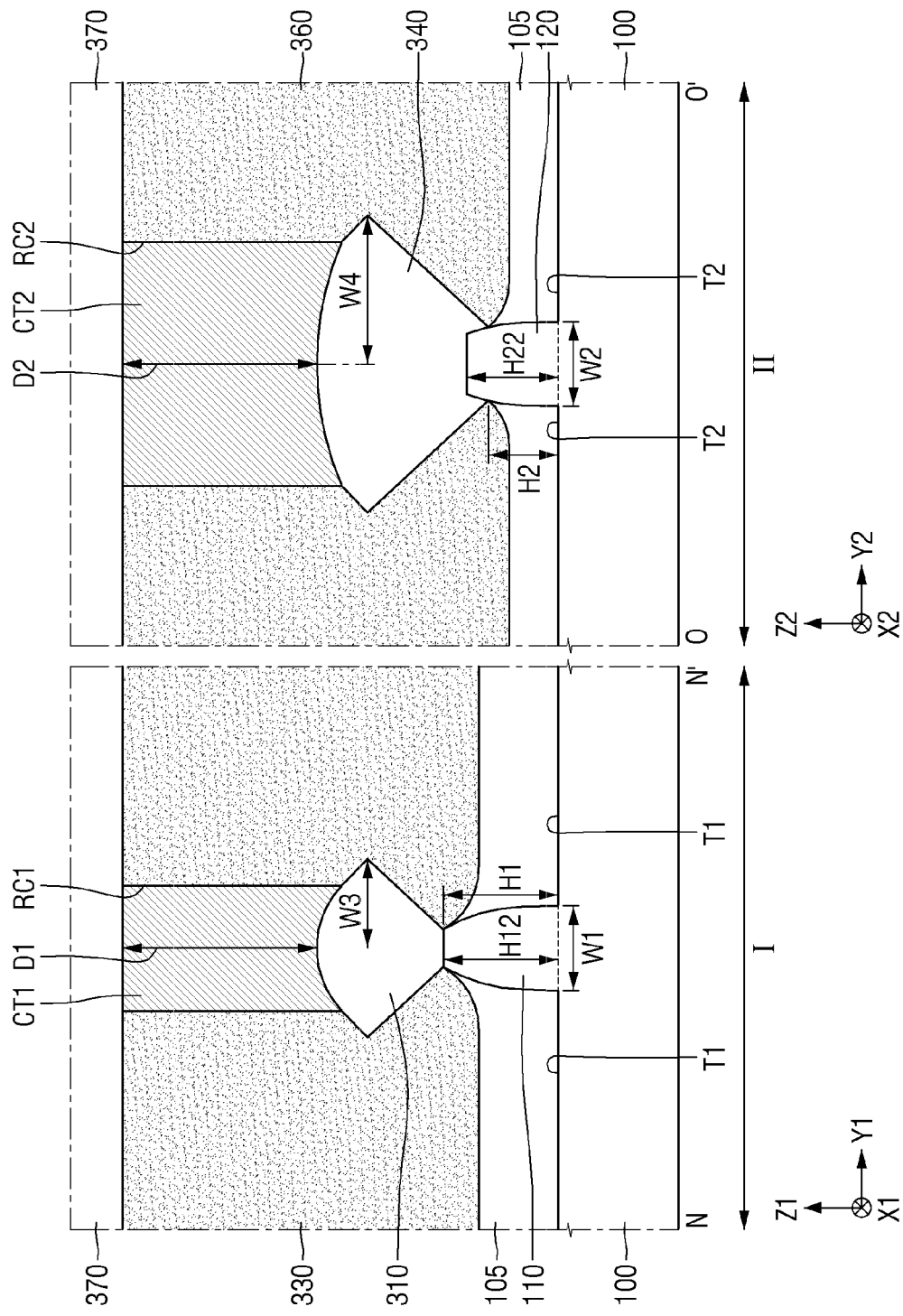

The semiconductor device according to some embodiments will be described with reference to FIGS. 21, 22 and 27. According to some embodiments, the third height H12 of the first fin type pattern 110 may be greater than the fourth height H22 of the second fin type pattern 120. The semiconductor device according to some embodiments may be a semiconductor device in which the fourth height H22 of the second fin type pattern 120 decreases in the semiconductor device described with reference to FIGS. 21, 22, and 23.

Figure 28:
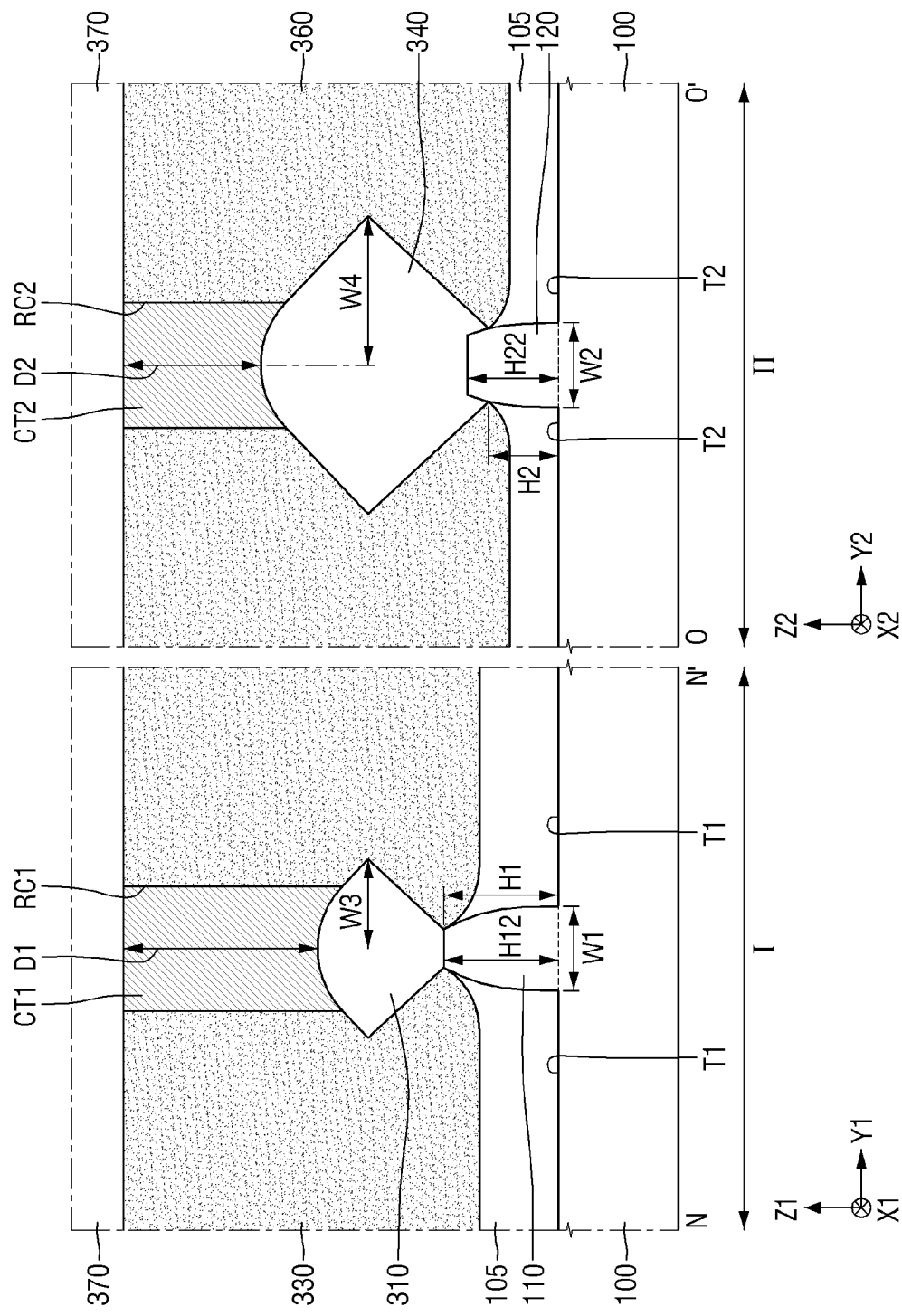

The semiconductor device according to some embodiments will be described with reference to FIGS. 21, 22 and 28. According to some embodiments, a first depth D1 of a first recess RC1 may be greater than a second depth D2 of a second recess RC2. The semiconductor device according to some embodiments may be a semiconductor device in which the fourth height H22 of the second fin type pattern 120 decreases in the semiconductor device described with reference to FIGS. 21, 22, and 24.

Figure 29:
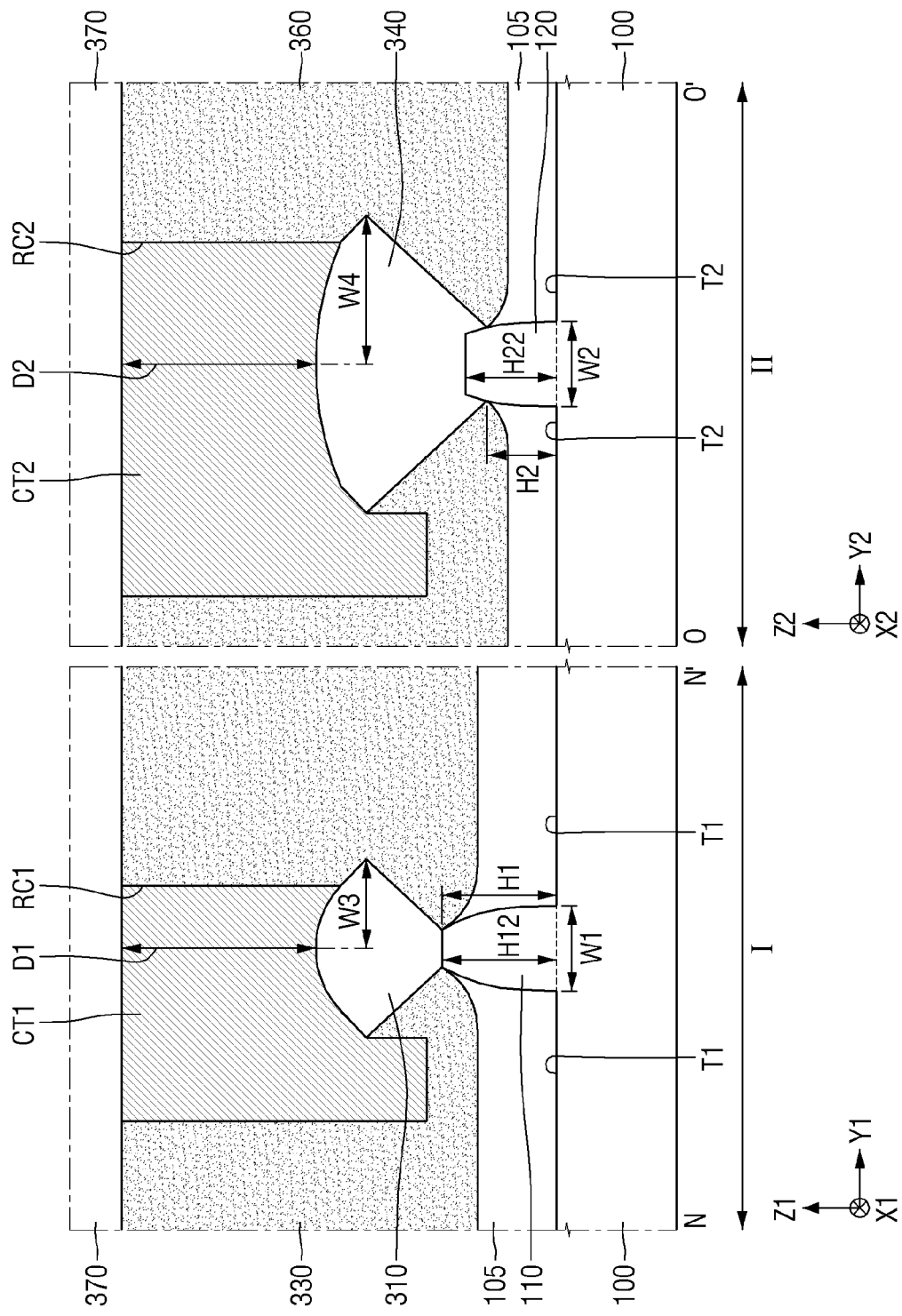

The semiconductor device according to some embodiments will be described with reference to FIGS. 21, 22 and 29. According to some embodiments, each of the first contact CT1 and the second contact CT2 is formed to cover a part of the sidewalls of the first epitaxial pattern 310 and the second epitaxial pattern 340. The semiconductor device according to some embodiments may be a semiconductor device in which the fourth height H22 of the second fin type pattern 120 decreases in the semiconductor device described with reference to FIGS. 21, 22, and 25.

Figure 30:
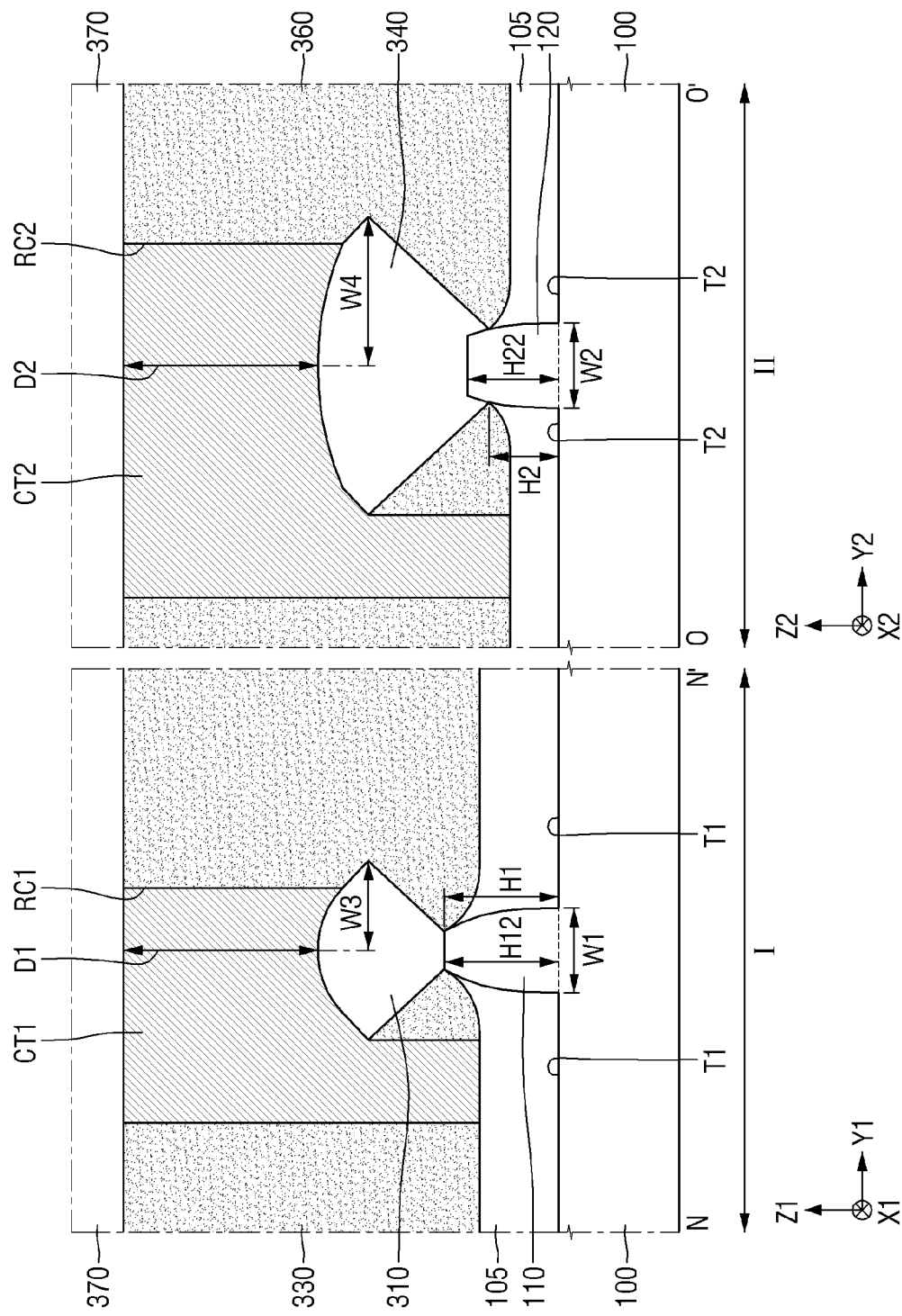

The semiconductor device according to some embodiments will be described with reference to FIGS. 21, 22 and 30. According to some embodiments, each of the first contact CT1 and the second contact CT2 extends to the field insulating film 105 and may come into contact with the field insulating film 105. The semiconductor device according to some embodiments may be a semiconductor device in which the fourth height H22 of the second fin type pattern 120 decreases in the semiconductor device described with reference to FIGS. 21, 22, and 26.

Figure 31:
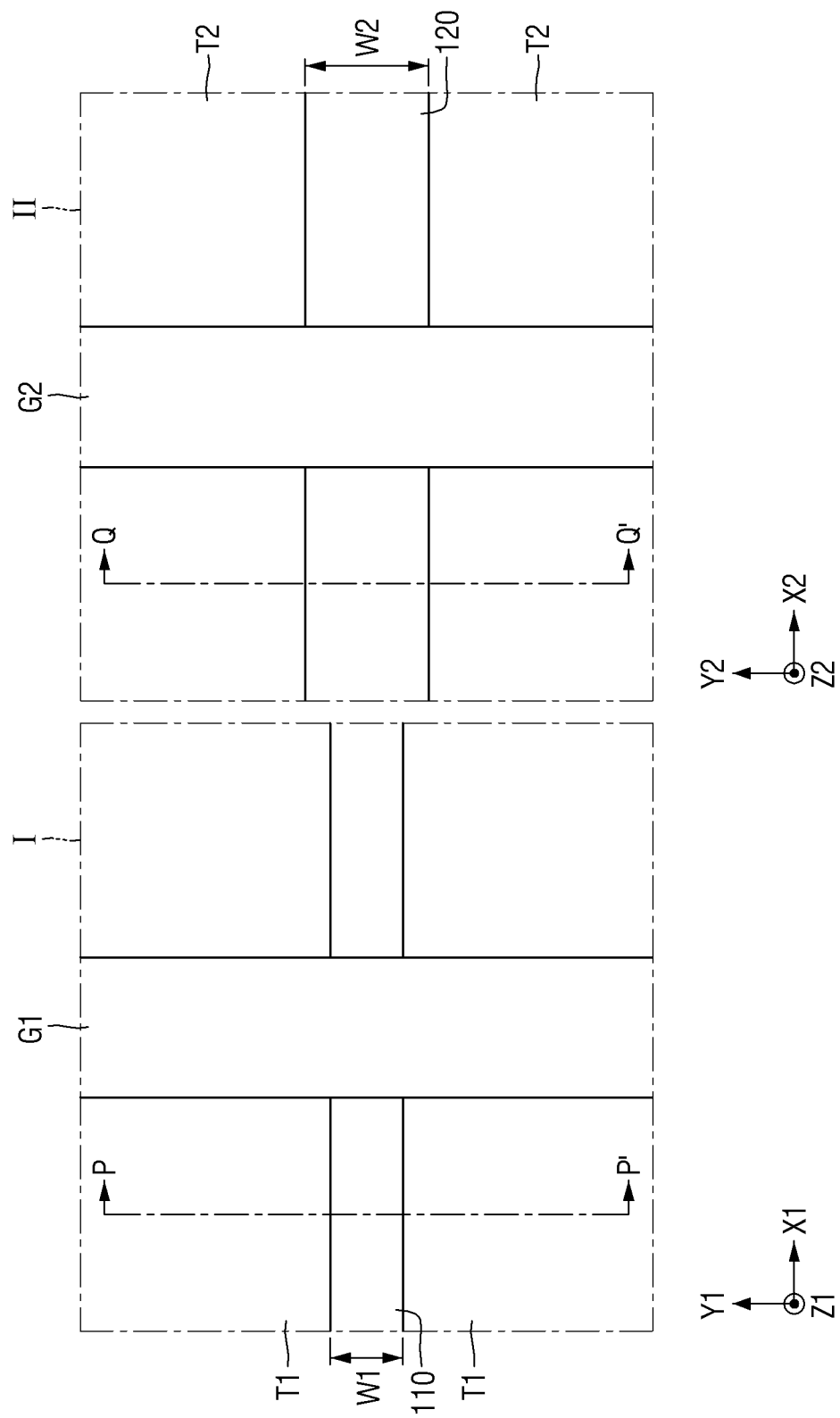
FIG. 31 is an exemplary layout diagram for explaining a semiconductor device according to some embodiments.
Figure 32:
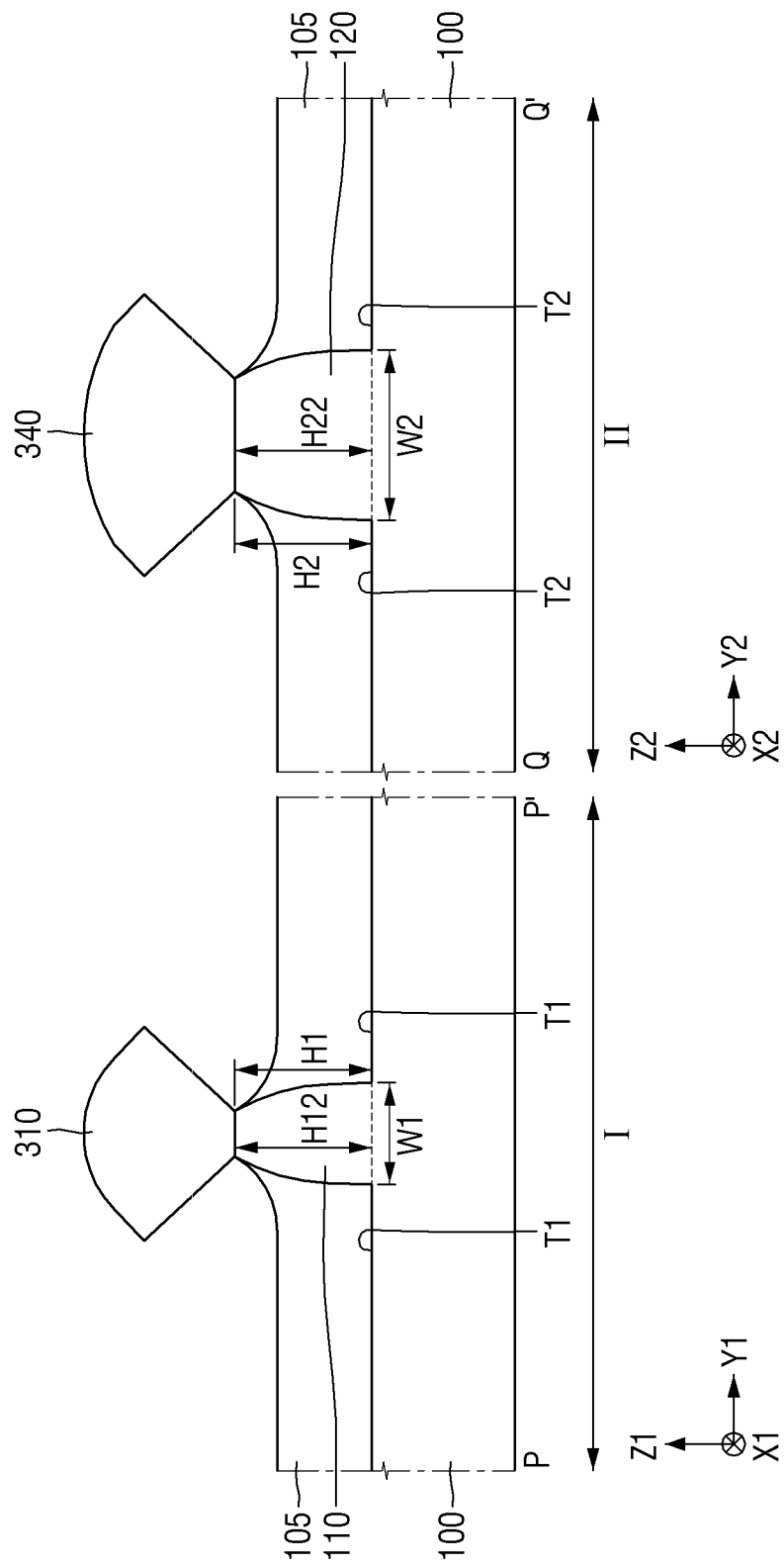
FIGS. 32 to 34 are cross-sectional views taken along lines P-P' and Q-Q' of FIG.
Figure 33:
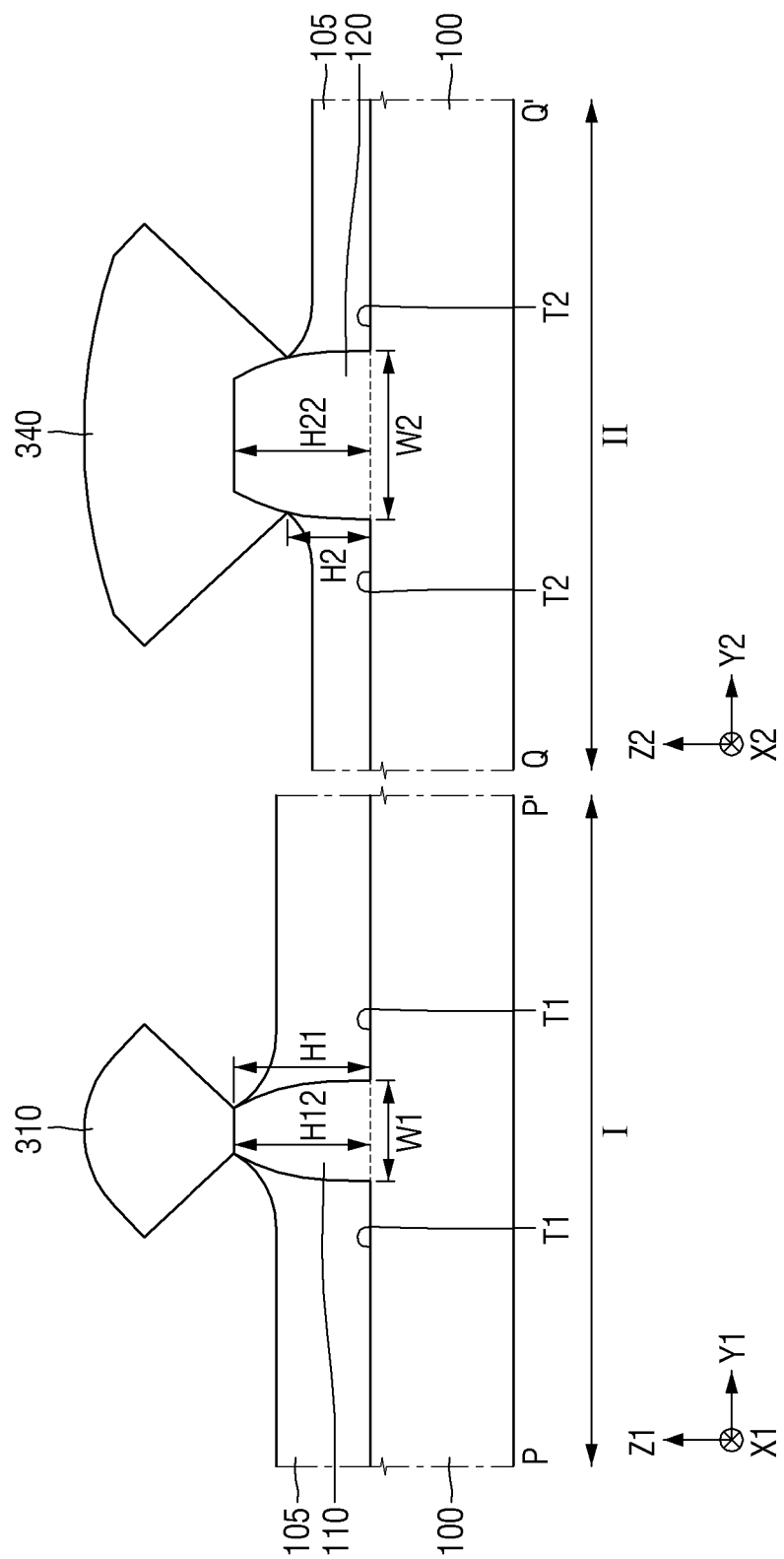
Figure 34:
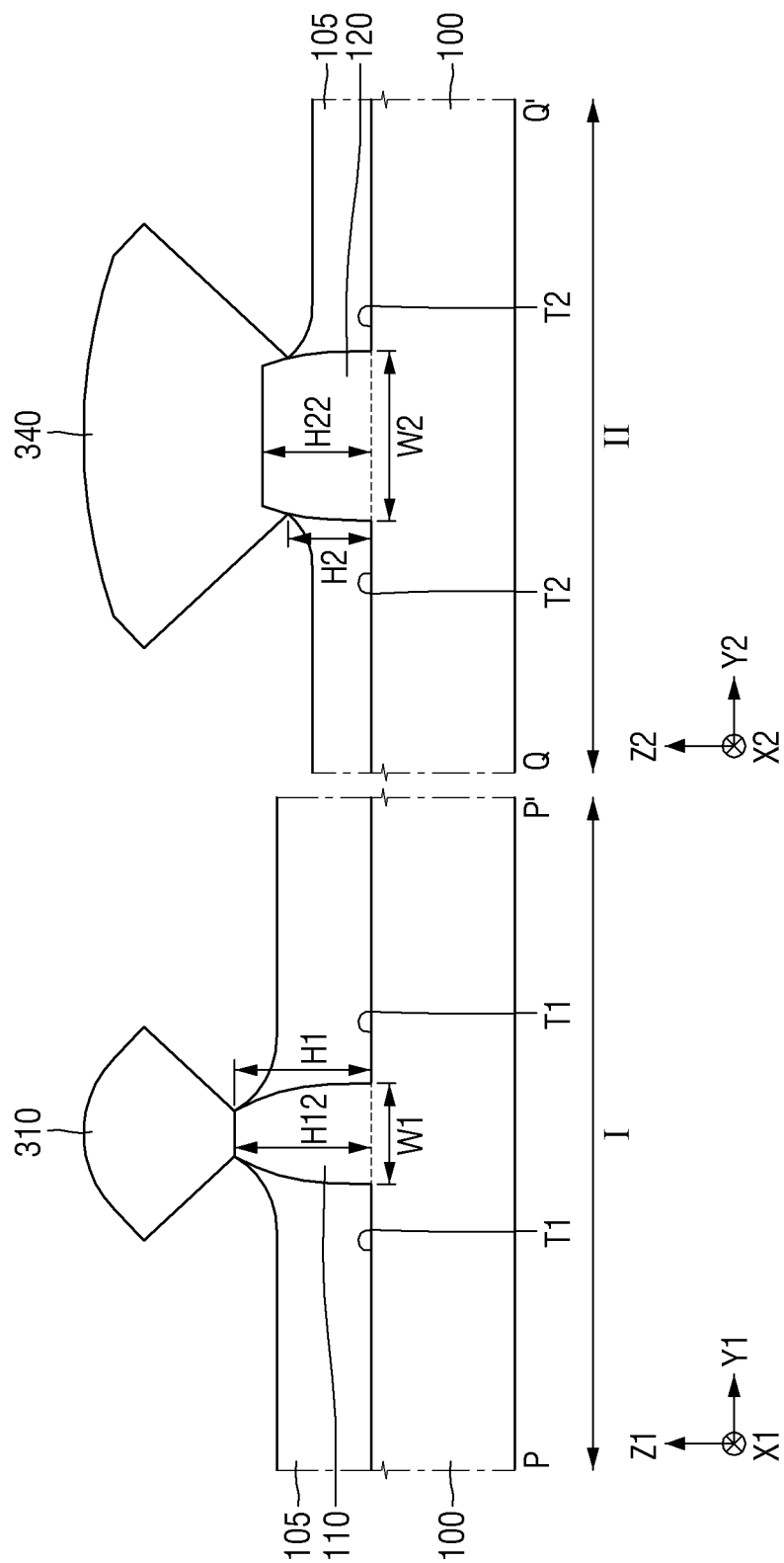

FIG. 31 is an exemplary layout diagram for explaining a semiconductor device according to some embodiments. FIGS. 32 to 34 are cross-sectional views taken along lines P-P' and Q-Q of FIG. 31. For convenience of explanation, the first contact CT1, the second contact CT2, and the first interlayer insulating film 330 to the third interlayer insulating film 370 are omitted. Also, for the sake of convenience of explanation, overlapping or similar contents will be omitted or briefly explained.

Referring to FIG. 31, the first fin type pattern 110 having a first width W1 on the lower surface may extend in the first direction X1, and the second fin type pattern 120 having a second width W2 on the lower surface may extend in the third direction X2. The second width W2 may be greater than the first width W1. The first fin type pattern 110 may be defined by the first trench T1, and the second fin type pattern 120 may be defined by the second trench T2. The first fin type pattern 110 and the second fin type pattern 120 may include only one fin. The first gate structure G1 may intersect the first fin type pattern 110 and extend in the second direction Y1. The second gate structure G2 may intersect the second fin type pattern 120 and extend in the fourth direction Y2.

The semiconductor device according to FIG. 32 may be similar to the semiconductor device according to FIG. 18, except that the first fin type pattern 110 includes a single fin. The semiconductor device according to FIG. 33 may be similar to the semiconductor device according to FIG. 19, except that the first fin type pattern 110 includes a single fin. The semiconductor device according to FIG. 34 may be similar to the semiconductor device according to FIG. 20, except that the first fin type pattern 110 includes a single fin. Therefore, the detailed description of FIGS. 32 to 34 will be omitted.

Figure 35:
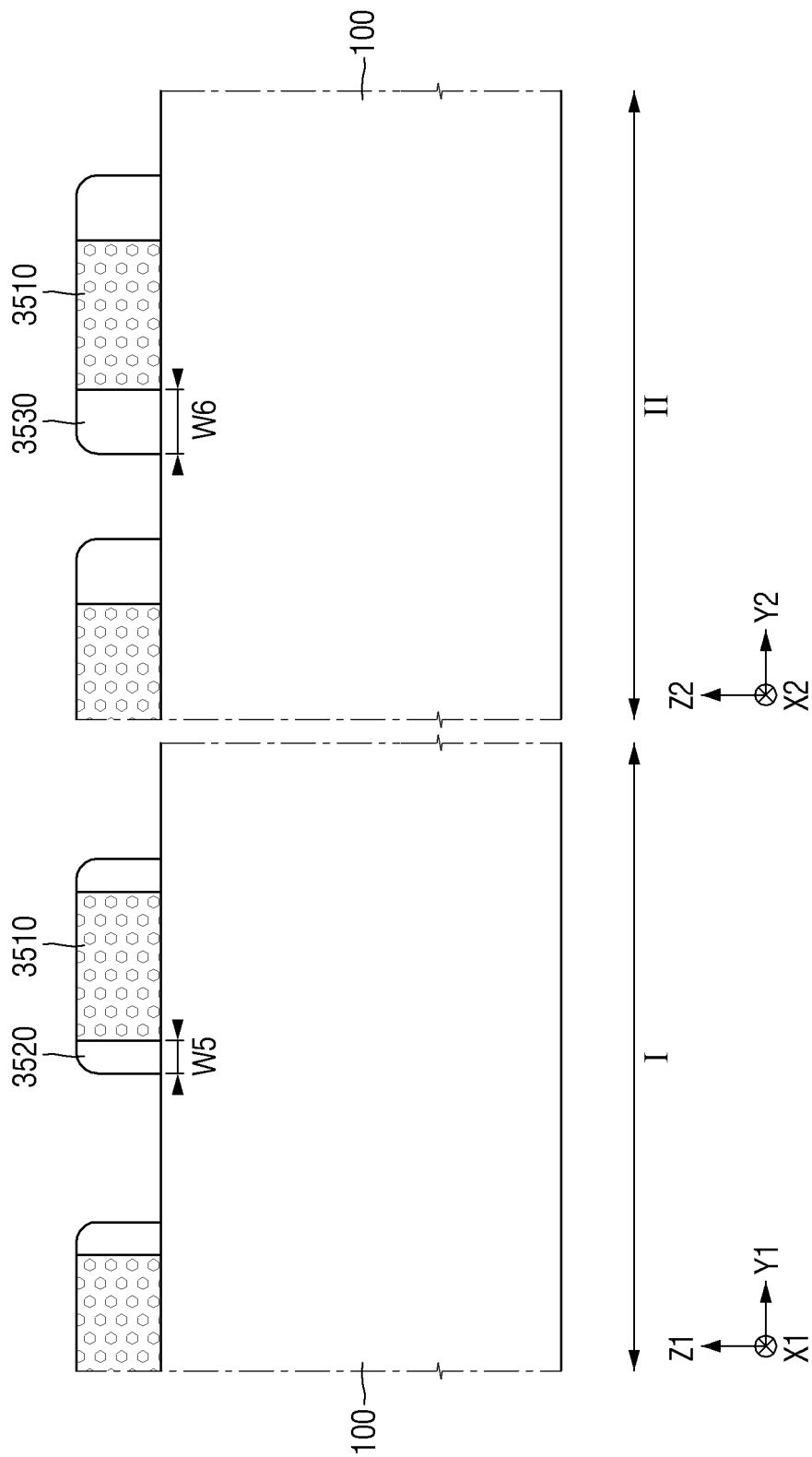
FIGS. 35 to 37 are exemplary diagrams for explaining a method for differentiating the first width of the lower surface of the first fin type pattern and the second width of the lower surface of the second fin type pattern according to some embodiments.
Figure 36:
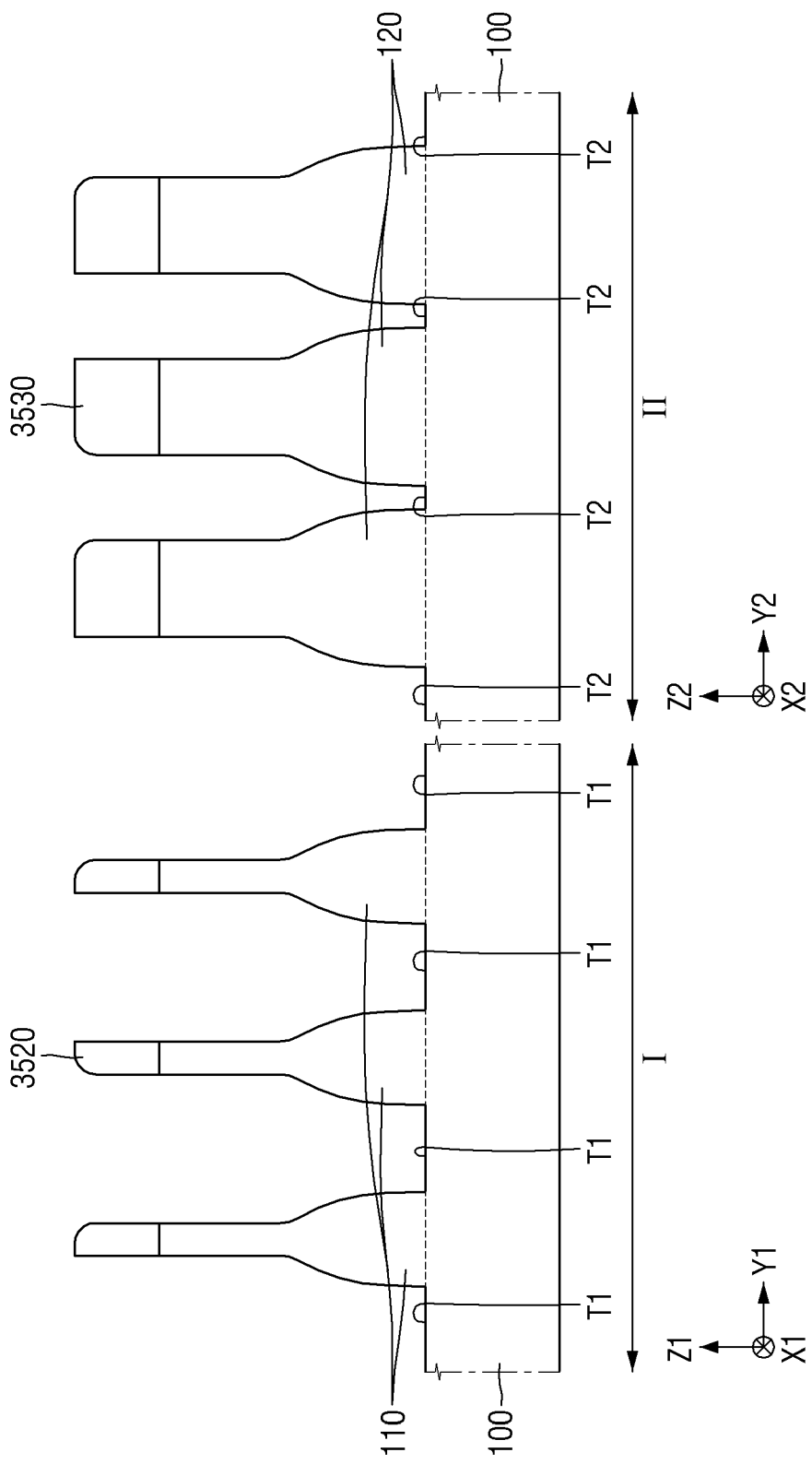
Figure 37:
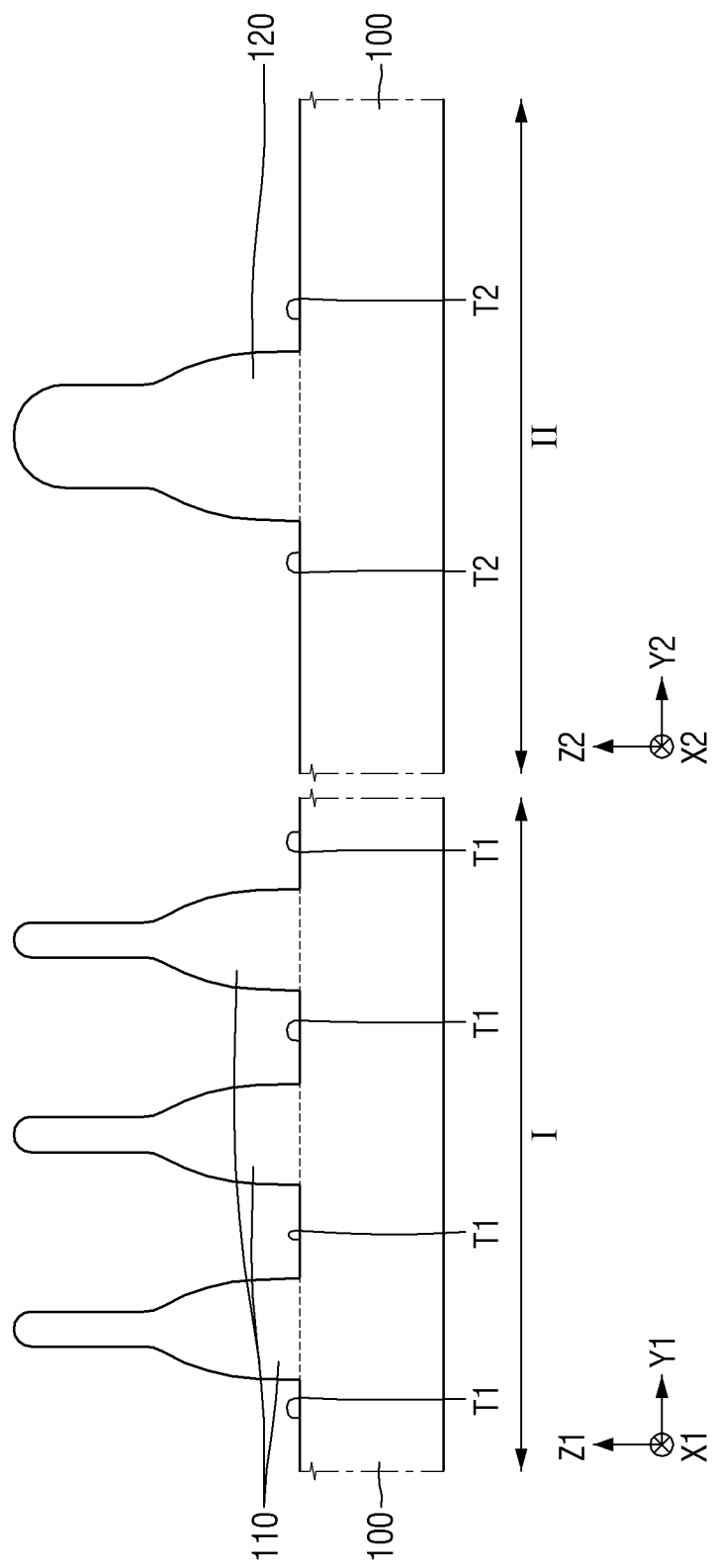

FIGS. 35 to 37 are exemplary diagrams for explaining a method for differentiating the first width of the lower surface of the first fin type pattern and the second width of the lower surface of the second fin type pattern according to some embodiments. Referring to FIG. 35, the semiconductor pattern 3510 each extending in the first direction X1 and the third direction X3 is formed in the first region I and the second region II of the substrate 100. In the first region I, a first mask pattern 3520 having a fifth width W5 is formed on both sidewalls of the semiconductor pattern 3510. In the second region II, a second mask pattern 3530 having a sixth width W6 is formed on both sidewalls of the semiconductor pattern 3510. According to some embodiments, the fifth width W5 and the sixth width W6 may be different from each other. For example, the fifth width W5 may be smaller than the sixth width W6. For example, the first mask pattern 3520 of the fifth width W5 is formed in the first region I and the second region II of the substrate 100, and the first region I of the substrate 100 may be covered with a hard mask. Subsequently, an additional vapor deposition (or epitaxial) process may be performed on the first mask pattern 3520 formed in the second region II of the substrate 100, thereby forming the second mask pattern 3530 of a sixth width W6 greater than the fifth width W5. In another example, the second mask pattern 3530 of the sixth width W6 is formed in the first region I and the second region II of the substrate 100, and the second region II of the substrate 100 may be covered with a hard mask. Subsequently, an additional etching process may be performed on the second mask pattern 3530 formed in the first region I of the substrate, thereby forming the first mask pattern 3520 of the fifth width W5. However, the embodiments are not limited thereto, and a person having ordinary knowledge in the technical field of the present inventive concepts may appropriately form the first mask pattern 3520 of the fifth width W5 and the second mask pattern 3530 of the sixth width W6.

Referring to FIG. 36, the semiconductor patterns 3510 formed on the first region I and the second region II of the substrate 100 are removed. In the first region I, a first trench T1 is formed, using the first mask pattern 3520. In the second region II, a second trench T2 is formed, using the second mask pattern 3530. The first trench T1 and the second trench T2 may be formed in the same process, but the embodiments are not limited thereto.

Referring to FIG. 37, the first fin type pattern 110 may be formed, by removing the first mask pattern 3520. The second fin type pattern 120 may be formed, by removing the second mask pattern 3530, and by removing a part of the fins formed in the second region II of the substrate 100.

Figure 38:
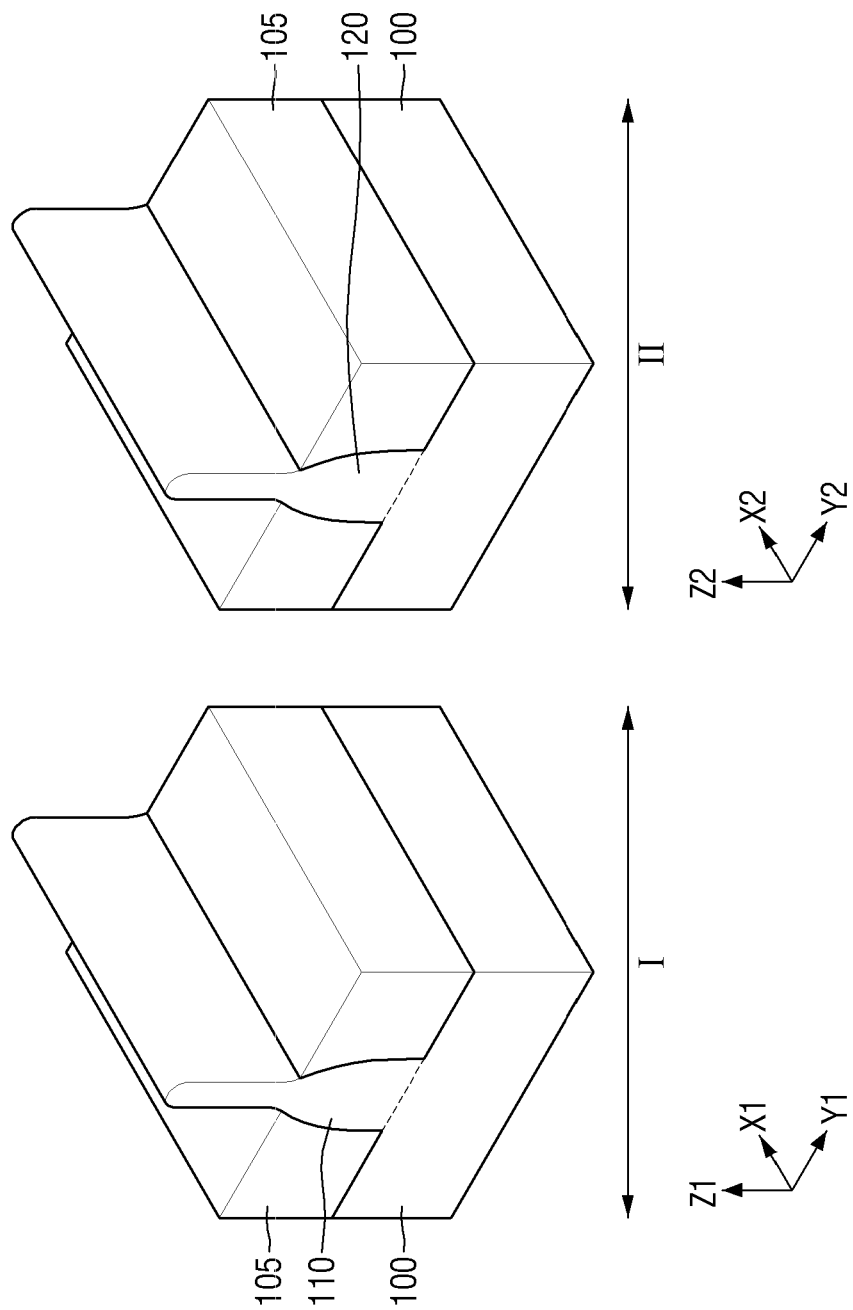

FIGS. 38 to 42 are exemplary diagrams for explaining a method for fabricating the semiconductor device according to some embodiments. Referring to FIG. 38, the first fin type pattern 110 is formed in the first region I of the substrate 100, and the second fin type pattern 120 is formed in the second region II of the substrate 100. Subsequently, the field insulating film 105 is formed to surround a part of the first fin type pattern 110 and the second fin type pattern 120. For example, by filling at least a part of the first trench T1 and the second trench T2, the field insulating film 105 may be formed.

Figure 39:
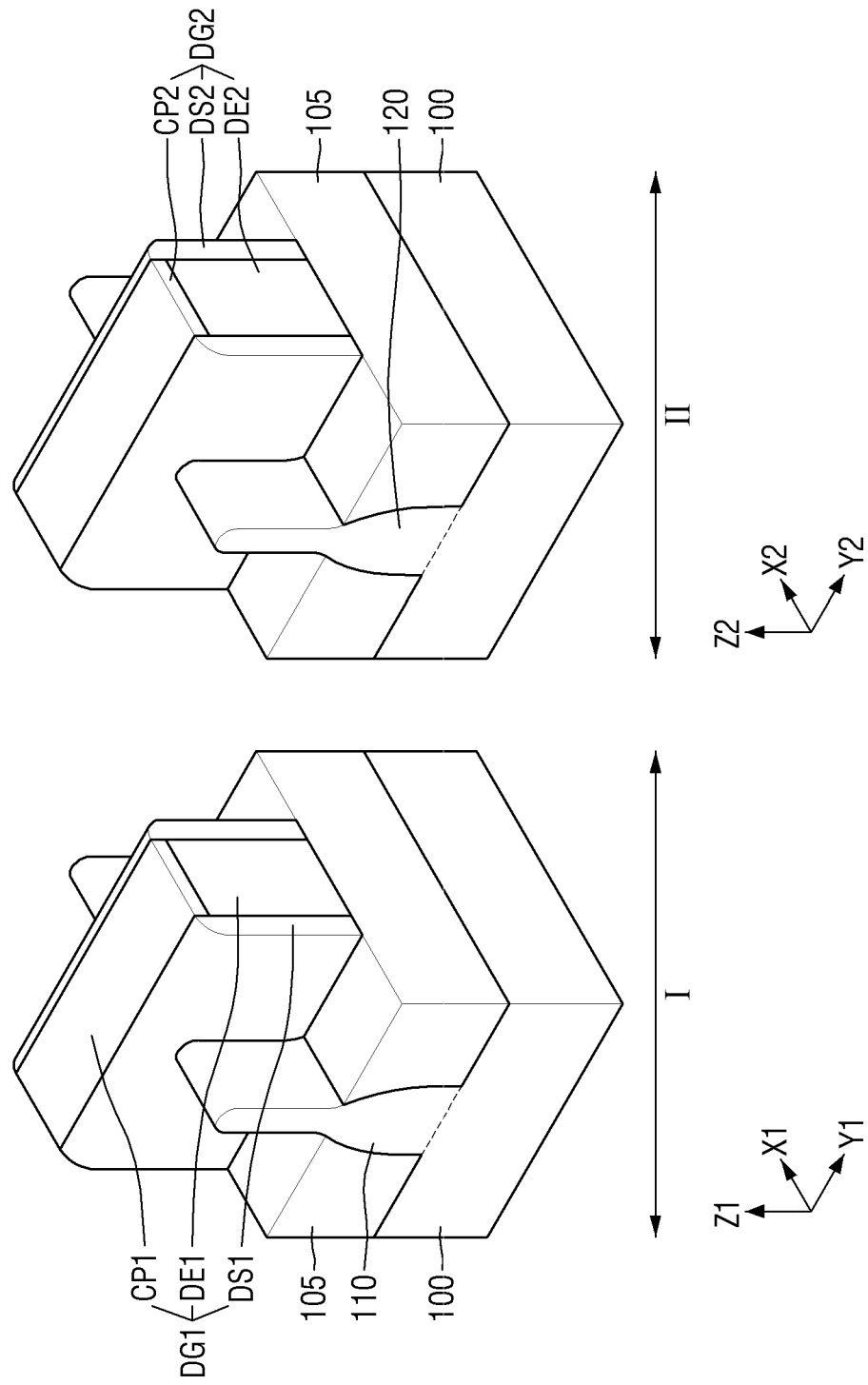

Referring to FIG. 39, the first dummy gate structure DG1 intersecting the first fin type pattern 110, and the second dummy gate structure DG2 intersecting the second fin type pattern 120 are formed. The first dummy gate structure DG1 may include a first dummy gate spacer DS1, a first dummy gate electrode DE1, and a first capping film CP1. The second dummy gate structure DG2 may include a second dummy gate spacer DS2, a second dummy gate electrode DE2, and a second capping film CP2.

Figure 40:
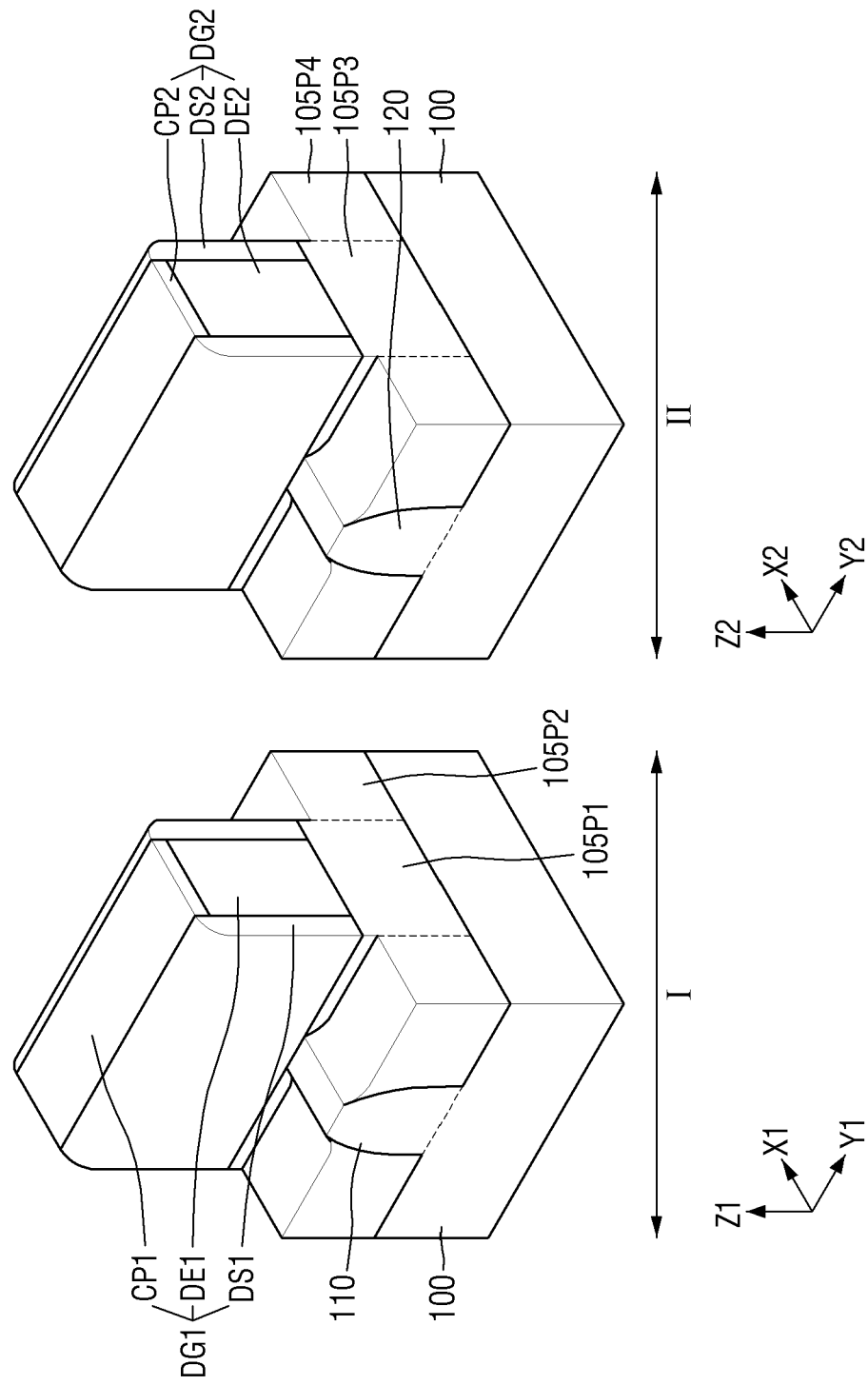

Referring to FIG. 40, a first epitaxial region is formed in the first region I and the second region II, using the first dummy gate structure DG1 and the second dummy gate structure DG2.

Referring to FIG. 41, the first hard mask 4110 covering the first region I of the substrate 100 is formed, and an additional etching process is performed, using the second dummy gate structure DG2. For example, the first epitaxial region of the second region II is etched to form a second epitaxial region. The first epitaxial region of the first region I may be a region in which the first epitaxial pattern 310 is formed, and the second epitaxial region of the second region II may be a region in which the second epitaxial pattern 340 is formed. When the second epitaxial region is formed, the field insulating film 105 of the second region II is etched, and the sixth height H2 of the second upper surface 105u2 of the field insulating film decreases. Although it is illustrated that the second fin type pattern 120 is not etched when forming the second epitaxial region in the drawings, the embodiments are not limited thereto. For example, in some embodiments, when forming the second epitaxial region, the second fin type pattern 120 is also etched, and the fourth height H22 of the second fin type pattern 120 may decrease.

Figure 42:
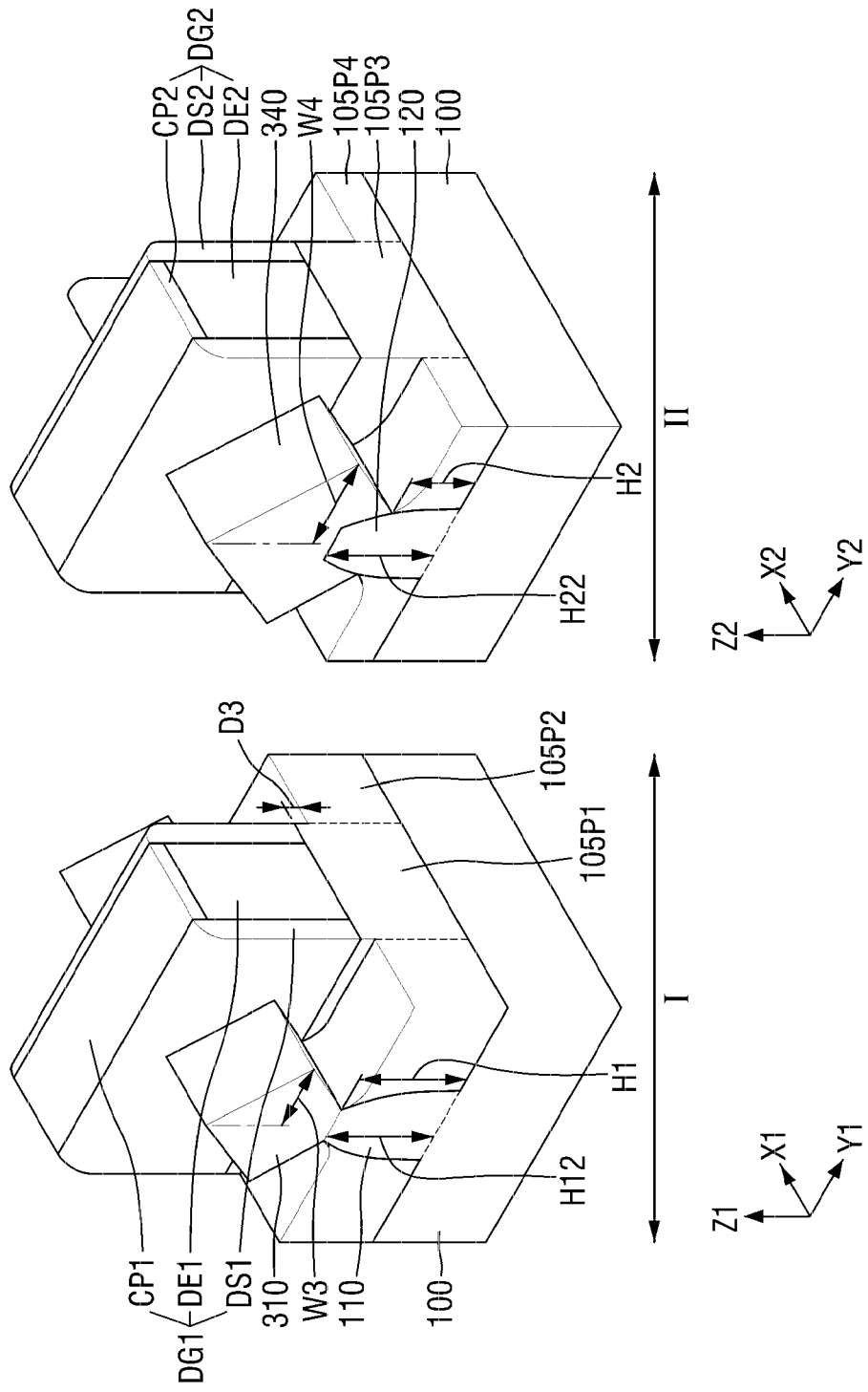

Referring to FIG. 42, the first hard mask 4110 of the first region I is removed, and the first epitaxial pattern 310 and the second epitaxial pattern 340 are formed. At this time, the first volume of the first epitaxial pattern 310 may be smaller than the second volume of the second epitaxial pattern 340, and the third width W3 of the first epitaxial pattern 310 may be smaller than the fourth width W4 of the second epitaxial pattern 340. A first step difference D3 between the first portion 105P1 and the second portion 105P2 of the field insulating film 105 may be smaller than a second step difference D4 between the third portion 105P3 and the fourth portion 105P4 of the field insulating film 105.

In concluding the detailed description, those skilled in the art will appreciate that many variations and modifications may be made to the preferred embodiments without substantially departing from the principles of the present inventive concepts. Therefore, the disclosed preferred embodiments of the invention are used in a generic and descriptive sense only and not for purposes of limitation.

What is claimed is:

1. A semiconductor device comprising:
   a first fin type pattern in a first region of a substrate, said first fin type pattern comprising a plurality of fins extending in a first direction and defined by a first trench in the substrate;
   a first gate structure intersecting the first fin type pattern and extending in a second direction;
   a second fin type pattern in a second region of the substrate, said second fin type pattern comprising a fin extending in a third direction and having a sidewall defined by a second trench in the substrate;
   a second gate structure intersecting the second fin type pattern and extending in a fourth direction perpendicular to the third direction;
   a field insulating film filling at least a part of the first trench and at least a part of the second trench,
   wherein the field insulating film entirely covers at least one sidewall of the first fin type pattern and partially covers at least a portion of the sidewall of the second fin type pattern to expose an upper portion of the sidewall of the second fin type pattern, and
   wherein said field insulating film has a first upper surface spaced from a bottom of the first trench by a first height, and a second upper surface spaced from a bottom of the second trench by a second height different from the first height;
   first epitaxial patterns extending on respective ones of the plurality of fins, and at least partially merged together into a unitary epitaxial pattern; and
   a second epitaxial pattern formed on the second fin type pattern,
   wherein the upper portion of the sidewall of the second fin type pattern is covered by the second epitaxial pattern, and
   wherein a bottommost surface of the second epitaxial pattern is disposed in a position lower than respective bottommost surfaces of the first epitaxial patterns.

2. The device of claim 1, wherein a first volume, which is equivalent to a total volume of the unitary epitaxial pattern divided by a number of the first epitaxial patterns, is unequal to a second volume of the second epitaxial pattern.

3. The device of claim 2, wherein the first height is greater than the second height, and the first volume is less than the second volume.

4. A semiconductor device comprising:
   a first fin type pattern including a plurality of fins each extending in a first direction and defined by a first trench, in a first region of a substrate;
   a first gate structure intersecting the first fin type pattern and extending in a second direction;
   a second fin type pattern including a single fin extending in a third direction and having a sidewall defined by a second trench, in a second region of the substrate;
   a second gate structure intersecting the second fin type pattern and extending in a fourth direction perpendicular to the third direction;
   a field insulating film filling at least a part of the first trench and at least a part of the second trench, on the substrate;
   wherein the field insulating film entirely covers at least one sidewall of the first fin type pattern and partially covers the sidewall of the second fin type pattern to thereby expose an upper portion of the sidewall of the second fin type pattern;
   first epitaxial patterns spaced apart from each other in the first direction on the first fin type pattern, the first epitaxial patterns having a shape in which they are merged together;
   a second epitaxial pattern formed on the second fin type pattern,
   wherein the upper portion of the sidewall of the second fin type pattern is covered by the second epitaxial pattern; and
   wherein a first height from a bottom of the first trench to thea first upper surface of the field insulating film is different from a second height from a bottom of the second trench to a second upper surface of the field insulating film;
   wherein a bottommost surface of the second epitaxial pattern is disposed in a position lower than respective bottommost surfaces of the first epitaxial patterns.

5. The semiconductor device of claim 4,
   wherein a first volume obtained by dividing a total volume of the first epitaxial patterns by a number of the plurality of epitaxial patterns is different from a second volume which is a total volume of the second epitaxial pattern.

6. The semiconductor device of claim 5, wherein the first height is greater than the second height, and the first volume is smaller than the second volume.

7. The semiconductor device of claim 4,
wherein an epitaxial pattern disposed at an outermost side among the plurality of epitaxial patterns of the first epitaxial patterns has a first width in the second direction, and the second epitaxial pattern has a second width in the fourth direction, and
wherein the first width and the second width are different from each other.

8. The semiconductor device of claim 7, wherein the first height is greater than the second height, and the first width is smaller than the second width.

9. The semiconductor device of claim 4, further comprising:
a first contact being in contact with the first epitaxial patterns; and
a second contact being in contact with the second epitaxial patterns,
wherein a first area obtained by dividing a whole area in which the first epitaxial pattern and the first contact are in contact with each other by a number of the plurality of epitaxial patterns is different from a second area which is a whole area in which the second epitaxial patterns and the second contact are in contact with each other.

10. The semiconductor device of claim 9, wherein the first height is greater than the second height, and the first area is smaller than the second area.

11. The semiconductor device of claim 4,
an interlayer insulating film on the first and second epitaxial patterns;
a first recess extending into the first epitaxial patterns inside the interlayer insulating film; and
a second recess extending into the second epitaxial pattern inside the interlayer insulating film,
wherein a first depth of the first recess is different from a second depth of the second recess.

12. The semiconductor device of claim 11, wherein the first height is greater than the second height, and the first depth is greater than the second depth.

13. The semiconductor device of claim 4, wherein a third width of a lower surface of the first fin type pattern in the second direction is smaller than a fourth width of a lower surface of the second fin type pattern in the fourth direction.

\* \* \* \* \*